(12) United States Patent
Iwamoto et al.

(10) Patent No.: US 9,425,203 B2
(45) Date of Patent: Aug. 23, 2016

(54) NON-VOLATILE MEMORY CELL IN SEMICONDUCTOR DEVICE

(71) Applicant: ROHM CO., LTD., Kyoto (JP)

(72) Inventors: Kunihiko Iwamoto, Kyoto (JP); Bungo Tanaka, Kyoto (JP); Michihiko Mifuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/735,179

(22) Filed: Jun. 10, 2015

(65) Prior Publication Data

US 2015/0279848 A1    Oct. 1, 2015

Related U.S. Application Data

(62) Division of application No. 14/290,138, filed on May 29, 2014, now Pat. No. 9,082,654.

(30) Foreign Application Priority Data

| May 30, 2013 | (JP) | ................................ | 2013-114536 |
| May 30, 2013 | (JP) | ................................ | 2013-114546 |

(51) Int. Cl.

| *H01L 27/115* | (2006.01) |
| *H01L 29/66* | (2006.01) |
| *H01L 27/092* | (2006.01) |
| *H01L 29/423* | (2006.01) |
| *H01L 29/49* | (2006.01) |

(52) U.S. Cl.
CPC ...... *H01L 27/11519* (2013.01); *H01L 27/0922* (2013.01); *H01L 27/11524* (2013.01); *H01L 27/11546* (2013.01); *H01L 27/11556* (2013.01); *H01L 29/42324* (2013.01); *H01L 29/4916* (2013.01); *H01L 29/66825* (2013.01); *H01L 27/11521* (2013.01)

(58) Field of Classification Search
CPC ................... H01L 27/11543; H01L 27/11521; H01L 29/66825
See application file for complete search history.

(56) References Cited

U.S. PATENT DOCUMENTS

| 6,140,182 | A | 10/2000 | Chen |
| 2002/0096704 | A1 | 7/2002 | Fukumoto et al. |
| 2004/0013001 | A1 | 1/2004 | Park et al. |
| 2007/0053223 | A1 | 3/2007 | Choi |
| 2007/0090445 | A1 | 4/2007 | Lee et al. |

(Continued)

FOREIGN PATENT DOCUMENTS

| JP | H11-103033 A | 4/1999 |
| JP | 2000-200841 A | 7/2000 |
| JP | 2004-056134 A | 2/2004 |

(Continued)

*Primary Examiner* — Thanh V Pham
(74) *Attorney, Agent, or Firm* — Rabin & Berdo, P.C.

(57) ABSTRACT

A semiconductor device of the present invention includes a semiconductor substrate, stripe-shaped trenches for separating the semiconductor substrate into a plurality of active regions, a buried film having a projecting portion that projects from the semiconductor substrate, buried into the trenches, a source region and drain region of a second conductivity type, which are a pair of regions formed in the active region, for providing a channel region of a first conductivity type for a region therebetween, and a floating gate consisting of a single layer striding across the source region and the drain region, projecting beyond the projecting portion in a manner not overlapping the projecting portion, in which an aspect ratio of the buried film is 2.3 to 3.67.

12 Claims, 112 Drawing Sheets

(56) References Cited

U.S. PATENT DOCUMENTS

| | | |
|---|---|---|
| 2007/0111441 A1 | 5/2007 | Koh et al. |
| 2007/0132004 A1 | 6/2007 | Yasuda et al. |
| 2008/0277713 A1 | 11/2008 | Maekawa |
| 2012/0175695 A1 | 7/2012 | Sato et al. |

FOREIGN PATENT DOCUMENTS

| | | |
|---|---|---|
| JP | 2007-134681 A | 5/2007 |
| JP | 2008-294434 A | 12/2008 |
| JP | 2009-252820 A | 10/2009 |
| JP | 2010-103228 A | 5/2010 |
| JP | 2012-146750 A | 8/2012 |
| JP | 2013-008840 A | 1/2013 |

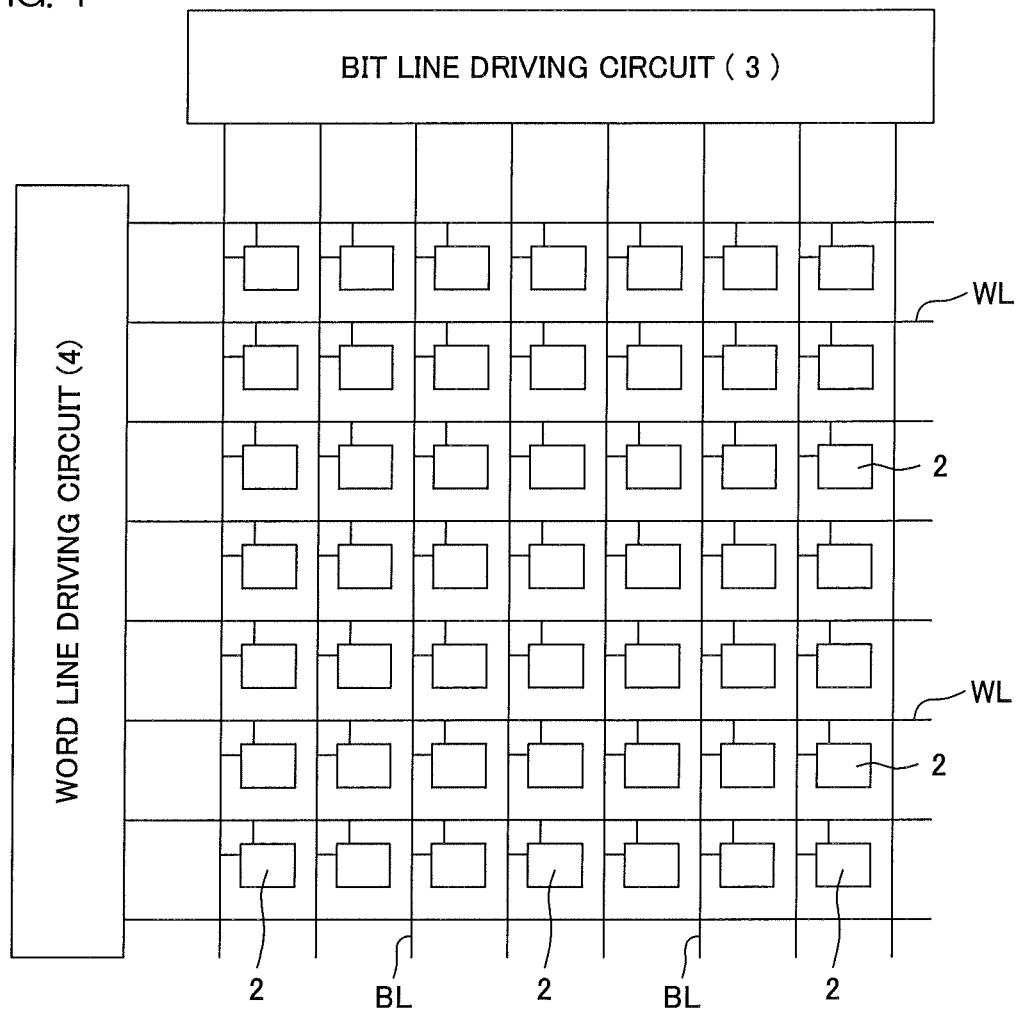

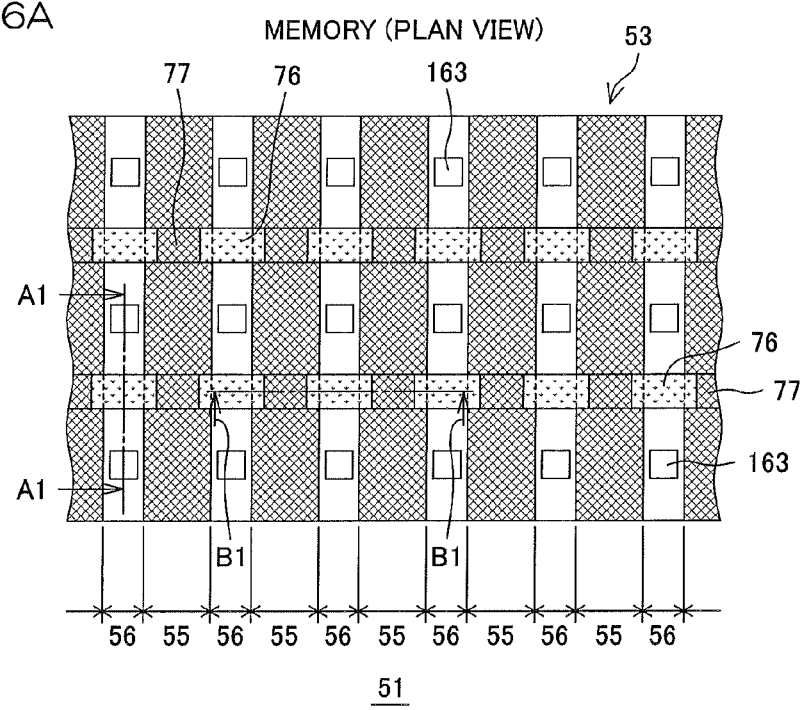
FIG. 26A  MEMORY (PLAN VIEW)
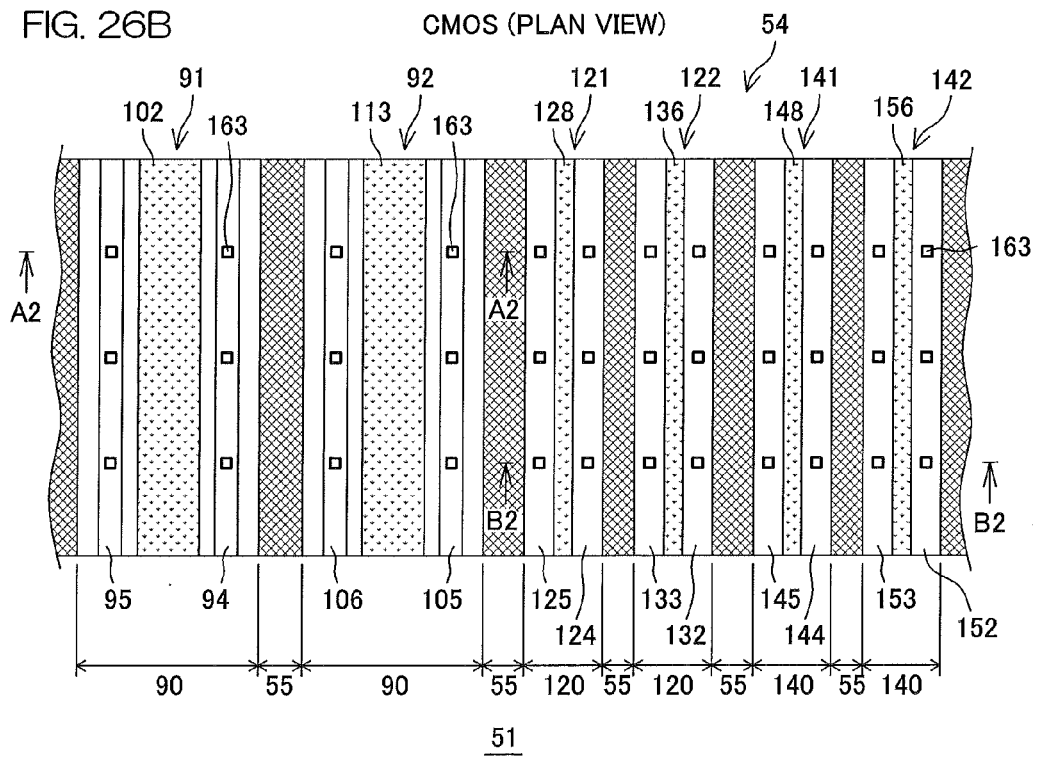
FIG. 26B  CMOS (PLAN VIEW)

A1-A1

B1-B1

A1-A1

B1-B1

A2-A2

B2-B2

A1-A1

B1-B1

A2-A2

B2-B2

A1-A1

B1-B1

A2-A2

B2-B2

A1-A1

B1-B1

A2-A2

B2-B2

A1-A1

B1-B1

A2-A2

B2-B2

A1-A1

B1-B1

A2-A2

B2-B2

A1-A1

B1-B1

A2-A2

B2-B2

A1-A1

B1-B1

A2-A2

B2-B2

A2-A2

B2-B2

A1-A1

B1-B1

A1-A1

B1-B1

A2-A2

B2-B2

A1-A1

B1-B1

A1-A1

B1-B1

A1-A1

B1-B1

A1-A1

B1-B1

A1-A1

B1-B1

A2-A2

B2-B2

A1-A1

B1-B1

A1-A1

B1-B1

A2-A2

B2-B2

A1-A1

B1-B1

A2-A2

B2-B2

A1-A1

B1-B1

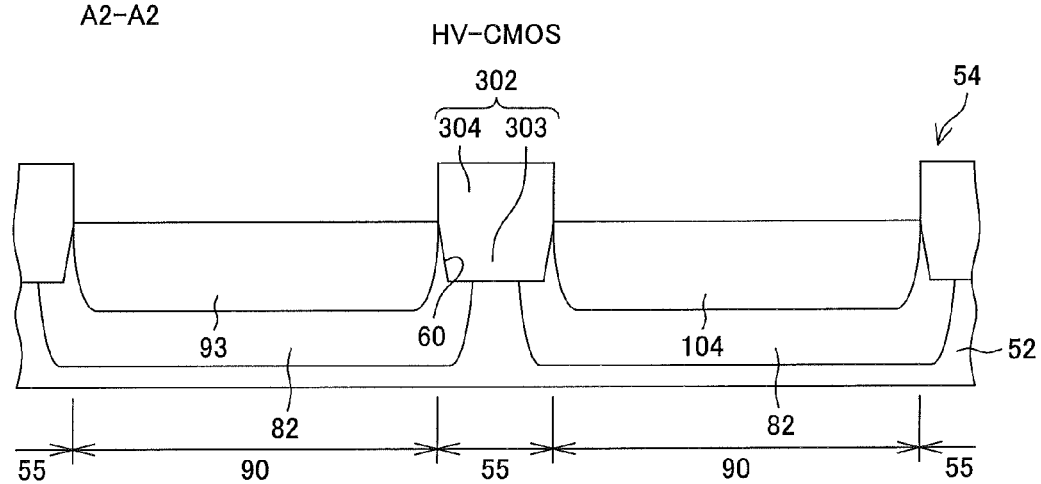
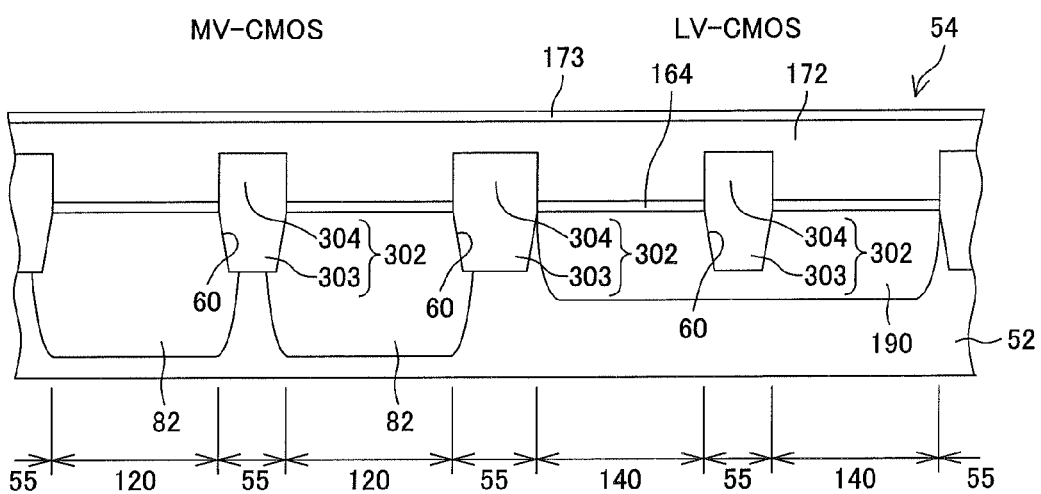

A1-A1

B1-B1

A1-A1

B1-B1

A1-A1

B1-B1

A1-A1

B1-B1

A2-A2

B2-B2

A1-A1

B1-B1

A2-A2

B2-B2

A1-A1

B1-B1

A2-A2

B2-B2

A1-A1

B1-B1

A2-A2

B2-B2

A1-A1

B1-B1

A2-A2

B2-B2

A1-A1

B1-B1

A2-A2

B2-B2

A1-A1

B1-B1

A1-A1

B1-B1

A2-A2

B2-B2

NON-VOLATILE MEMORY CELL IN SEMICONDUCTOR DEVICE

CROSS-REFERENCE TO RELATED APPLICATIONS

This is a divisional application of U.S. application Ser. No. 14/290,138, filed May 29, 2014 and allowed on Mar. 31, 2015, which claimed priority to Japanese Application No. 2013-114546, filed May 30, 2013 and Japanese Patent Application No. 2013-114536 filed on May 30, 2013. The disclosures of these U.S. and Japanese applications are incorporated herein by reference.

FIELD OF THE INVENTION

The present invention relates to a semiconductor device including a nonvolatile memory cell and a method for manufacturing the same.

BACKGROUND ART

Patent Document 1 (Japanese Patent Application Publication No. 2004-56134) discloses a flash memory cell including a semiconductor substrate, a first tunneling oxide film formed in a predetermined region of the semiconductor substrate, a first floating gate formed at an upper portion of the first tunneling oxide film, a second tunneling oxide film formed along an upper portion of the semiconductor substrate and one sidewall of the first floating gate, a second floating gate formed in contact with the second tunneling oxide film and isolated from the first floating gate, a dielectric film formed on the first floating gate and the second floating gate, a control gate formed on the dielectric film, a first junction region formed in the semiconductor substrate under one side portion of the second tunneling oxide film, and a second junction region formed in the semiconductor substrate under one side portion of the first tunneling oxide film (FIG. 14 of Patent Document 1). The structure of said flash memory cell is a 2-bit cell structure (4-level states), in which the first floating gate and the second floating gate are separated by the second tunneling oxide film (high-temperature oxide film) to store electric charge in the respective floating gates.

BRIEF SUMMARY OF THE INVENTION

In the flash memory cell of Patent Document 1, the arrangement for separating the first floating gate and the second floating gate by the second tunneling oxide film is essential. Therefore, in the manufacturing process disclosed in Patent Document 1, after depositing a polysilicon film used as the first floating gate, the second tunneling oxide film, and a silicon nitride film used as the second floating gate in order, these films are shaped by polishing with a CMP method.

However, for polishing three mutually different material films by a CMP method as in Patent Document 1, devices set with polishing conditions suitable for the material films must be used for each material film to be polished. Therefore, transfer between the polishing devices becomes necessary, and the polishing conditions must be set for each device, so that the manufacturing process is complicated. Further, in the case of polishing of the heterogeneous films and wafer transfer between the polishing devices, there is also a possibility of adhesion of particles to the wafer surface.

Also, in another aspect, in the flash memory cell of Patent Document 1, for which it is necessary to form two floating gates of the first and second floating gates between the first junction region and the second junction region, there is therefore also a problem that the cell size is increased.

It is an object of the present invention to provide a semiconductor device for which a small cell size can be realized by a simple process and a method for manufacturing the same.

It is another object of the present invention to provide a semiconductor device that can reduce threshold variation due to the effect of coupling between floating gates and a method for manufacturing the same.

BRIEF DESCRIPTION OF THE DRAWINGS

FIG. 1 is a layout diagram of memory cells of a semiconductor device according to a first preferred embodiment of the present invention.

FIGS. 2A and 2B are bird's eye views for explaining an internal structure of a memory cell, in which FIG. 2A shows a view in a direction along bit lines, and FIG. 2B shows a view in a direction along word lines.

FIGS. 3A and 3B to FIGS. 13A and 13B are views for explaining a part of a method for manufacturing the semiconductor device according to the first preferred embodiment of the present invention.

FIGS. 14A and 14B are bird's eye views for explaining an internal structure of a memory cell of a semiconductor device according to a first reference example of the present invention, in which FIG. 14A shows a view in a direction along bit lines, and FIG. 14B shows a view in a direction along word lines.

FIGS. 15A and 15B to FIGS. 25A and 25B are views for explaining a part of a method for manufacturing the semiconductor device according to the first reference example of the present invention.

FIGS. 26A and 26B are plan views of a semiconductor device according to a second reference example of the present invention.

FIGS. 29A and 29B to FIGS. 72A and 72B are views for explaining a part of a method for manufacturing the semiconductor device according to the second reference example of the present invention.

FIGS. 75A and 75B to FIGS. 112A and 112B are views for explaining a part of a method for manufacturing the semiconductor device according to the second preferred embodiment of the present invention.

DETAILED DESCRIPTION OF THE INVENTION

Figure 2A:
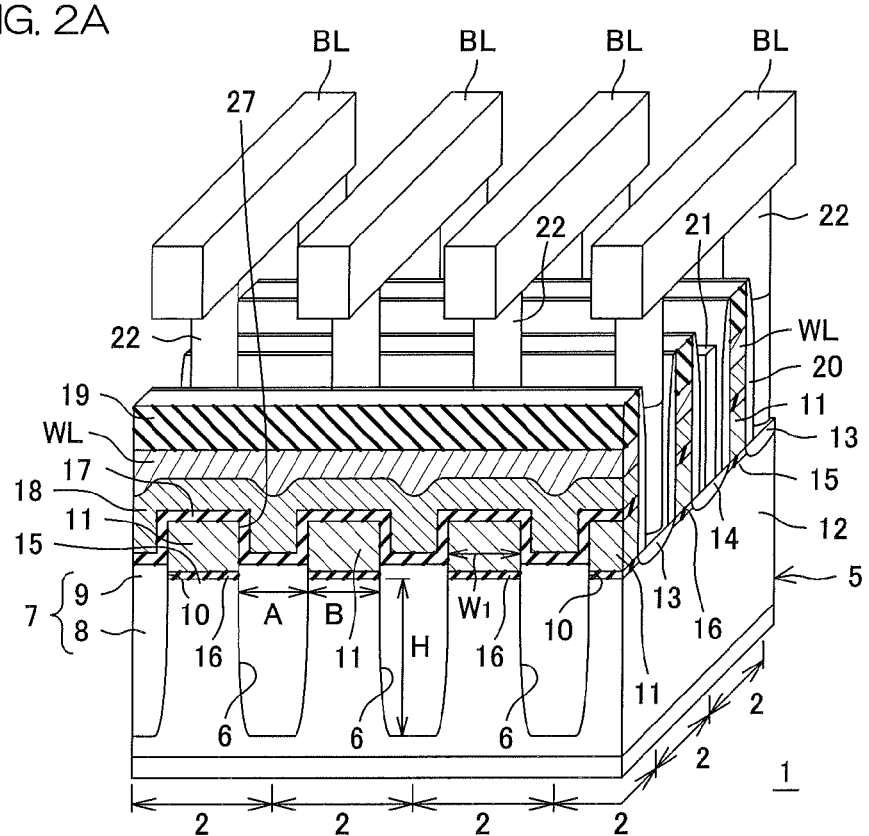

A semiconductor device of the present invention includes a semiconductor substrate, stripe-shaped trenches for separating the semiconductor substrate into a plurality of active regions, a buried film having a projecting portion that projects from the semiconductor substrate, buried into the trench, a source region and drain region of a second conductivity type, which are a pair of regions formed at an interval from each other along a longitudinal direction of the trench in the active region, for providing a channel region of a first conductivity type for a region therebetween, and a floating gate consisting of a single layer striding across the source region and the drain region, projecting beyond the projecting portion in a manner not overlapping the projecting portion, in which an aspect ratio of the buried film is 2.3 to 3.67.

This semiconductor device can be manufactured by, for example, the following method. The method includes a step of forming, on a semiconductor substrate, an etching mask selectively having a plurality of stripe-shaped openings without an electrode material interposed between the same and the semiconductor substrate, a step of forming trenches for separating the semiconductor substrate into a plurality of active regions, by etching the semiconductor substrate via the openings in the etching mask, a step of burying into the trench a buried film having a projecting portion that projects by a thickness of the etching mask from the semiconductor substrate, by supplying a film material in a filling-back manner from a bottom portion of the trench to an upper face of the etching mask, a step of exposing the active region surrounded by the projecting portions by removing the etching mask, burying an electrode material into the active region, and depositing an electrode material to cover the remaining buried film, a step of forming a floating gate made of the electrode material in the active region, by polishing the electrode material, from a state in which the electrode material is exposed, until an uppermost face of the electrode material reaches the same height as that of a top face of the projecting portion of the buried film, a step of forming a recess between the adjacent floating gates, by selectively removing the projecting portion of the buried film, a step of exposing a pair of a first region and a second region made of a part of the semiconductor substrate at an interval from each other, by selectively removing the floating gate along a longitudinal direction of the trench, and forming a channel region of a first conductivity type in a region between the first and second regions, and a step of forming a source region in the first region and forming a drain region in the second region, by supplying a second conductivity-type impurity into the first region and the second region.

According to this method, because floating gates each consisting of a single layer are formed by polishing from a state in which the electrode material is exposed, it is not necessary to perform a polishing step for formation of the floating gates a plurality of times. Therefore, transfer between polishing devices becomes no longer necessary, and also, a one-time setting of polishing conditions suffices in forming floating gates, so that the manufacturing process can be simplified. Further, because transfer between polishing devices becomes no longer necessary, adhesion of particles to the surface of the semiconductor substrate (wafer) can also be reduced.

When forming the trenches for the buried film, because no electrode material is interposed between the etching mask and the semiconductor substrate, the aspect ratio of the trenches (depth H of the trench/width A of the trench) including the openings in said etching mask can be made smaller than that when an electrode material is interposed. Further, it is not necessary to overlap the floating gate with the projecting portions of the buried film, which therefore, when designing the width of the trenches, eliminates setting the trench width wide in anticipation of the width of overlapping parts of the floating gates. Therefore, the trenches can be micro-fabricated, and further, the buried film can also be increased in burying ability. As a result, a buried film having an aspect ratio of 2.3 to 3.67 can be formed. Also, because no step is formed between the floating gate and the buried film, the occurrence of weak spots or voids can also be effectively prevented when burying the buried film.

Because, after removal of the etching mask, the electrode material buried into the positions (active regions) where that etching mask used to be serves as floating gates, the height of the floating gates can be simply adjusted by only adjusting the thickness of the etching mask.

In the semiconductor device manufactured by the method mentioned above, because the floating gate consists of a single layer striding across the source region and the drain region, a small cell size can be realized.

Because the floating gate does not overlap the projecting portions of the buried film, the distance between the floating gates adjacent across the buried film can be wide. Accordingly, parasitic capacitance between the adjacent floating gates can be reduced, so that threshold variation due to the effect of coupling between the floating gates can be reduced.

The semiconductor device may include an n-type well region formed in a surface portion of the semiconductor substrate, in which the source region and the drain region may be respectively a p-type source region and a p-type drain region formed in the n-type well region, and the channel region may be an n-type channel region made of a part of the n-type well region.

According to this arrangement, writing/erasing of data into/from a memory cell is performed using a p-type MOSFET.

Writing of data into the memory cell composed of a p-type MOSFET is achieved by injecting electrons (hot electrons) generated by a band-to-band tunneling phenomenon near the p-type drain region into the floating gate. That is, the p-type source region is provided at ground potential (0V). Then, voltages are applied to the p-type drain region, the control gate, and the n-type well region. Accordingly, hot electrons are generated near the p-type drain region, and the hot electrons are injected into the floating gate. On the other hand, for erasing data, voltages are applied to the n-type well region and the control gate. Due to the application of voltages, an electric field is generated between the floating gate and the n-type well region, and by an FN tunneling phenomenon using the electric field, electrons are drawn into the n-type well region from the floating gate. This series of writing/erasing operations can be performed with a current smaller than that for writing/erasing operations of a memory cell composed of an n-type MOSFET. Thus, even with a simple structure such that the floating gate consists of a single layer as in the present invention, excellent writing/erasing operations can be performed. That is, providing the memory cells as p-type MOSFETs allows using the present invention more effectively.

From the viewpoint of cell size miniaturization, the first width $W_1$ of the floating gate along a width direction of the trench and the second width $W_2$ of the floating gate along a longitudinal direction of the trench are preferably both 100 nm or less.

The floating gate is preferably made of polysilicon.

The projection amount of the projecting portion may be 0.09 μm to 0.17 μm.

The buried film may be a buried insulating film.

The semiconductor device may further include an insulating film formed at an inner face of the trench, in which the buried film may include a first material layer buried up to a halfway portion in a depth direction of the trench and a second material layer different from the first material layer, buried into a part on the first material layer of the trench.

The depth of the trench may be 0.13 μm to 0.16 μm.

The aspect ratio of the trench may be 1.30 to 1.77.

The trench may be formed in a tapered shape to have a narrower width in its depth direction.

The semiconductor device may further include a semiconductor element formed in the active region, in which the semiconductor element may include a CMOS transistor.

In the method for manufacturing the semiconductor device, in the step of forming the etching mask, a thickness of the etching mask may be set such that an aspect ratio of a space of the trench combined with the opening when forming the buried film becomes 2.3 to 3.67.

According to this method, because the aspect ratio of a space of the trench combined with the opening in the etching mask is 2.3 to 3.67, an excellent burying ability of the buried film can be realized.

In the step of forming the recess, a removal amount of the projecting portion is preferably set such that an aspect ratio of the buried film becomes 2.3 to 3.67.

The method for manufacturing the semiconductor device may include a step of forming an n-type well region in the active region, by a supply of an n-type impurity, before deposition of the electrode material, in which the channel region may be an n-type channel region made of a part of the n-type well region, and the step of forming the source region and the drain region may include a step of forming a p-type source region and a p-type drain region by a supply of a p-type impurity.

The step of forming the trenches may include a step of setting a pitch of the trenches such that a first width $W_1$ of the adjacent trenches becomes 100 nm or less, and the step of selectively removing the floating gate may include a step of setting a pitch of the floating gates such that a second width $W_2$ along a longitudinal direction of the trench of the floating gate remaining between the first region and the second region becomes 100 nm or less.

The step of forming the floating gate preferably includes a step of polishing the electrode material by a CMP method.

The step of forming the buried film preferably includes a step of supplying an insulating material by a high-density plasma (HDP) CVD method.

The etching mask is preferably made of a silicon nitride (SiN) film. Hereinafter, preferred embodiments and reference examples of the present invention will be described in detail with reference to the accompanying drawings.

First Preferred Embodiment

FIG. 1 is a layout diagram of memory cells 2 of a semiconductor device 1 according to a first preferred embodiment of the present invention.

In the semiconductor device 1, stripe-shaped bit lines BL that run longitudinally (in the Y-direction) and stripe-shaped word lines WL that run transversally (in the X-direction) intersect in a grid pattern in a plan view, and memory cells 2 are formed in mesh parts of the grid. As a result of the memory cell 2 being disposed in each mesh part, the memory cells 2 as a whole are arrayed in a matrix shape of X rows x Y columns (X and Y are positive integers). The bit lines BL are electrically connected to $p^+$-type drain regions 14 to be described later, and the word lines WL are electrically connected to control gates 18 to be described later. Selecting an intersection of the bit line BL and the word line WL by control of a bit line driving circuit 3 and a word line driving circuit 4 allows writing/erasing data into/from the memory cell 2 located at said intersection.

Figure 2B:
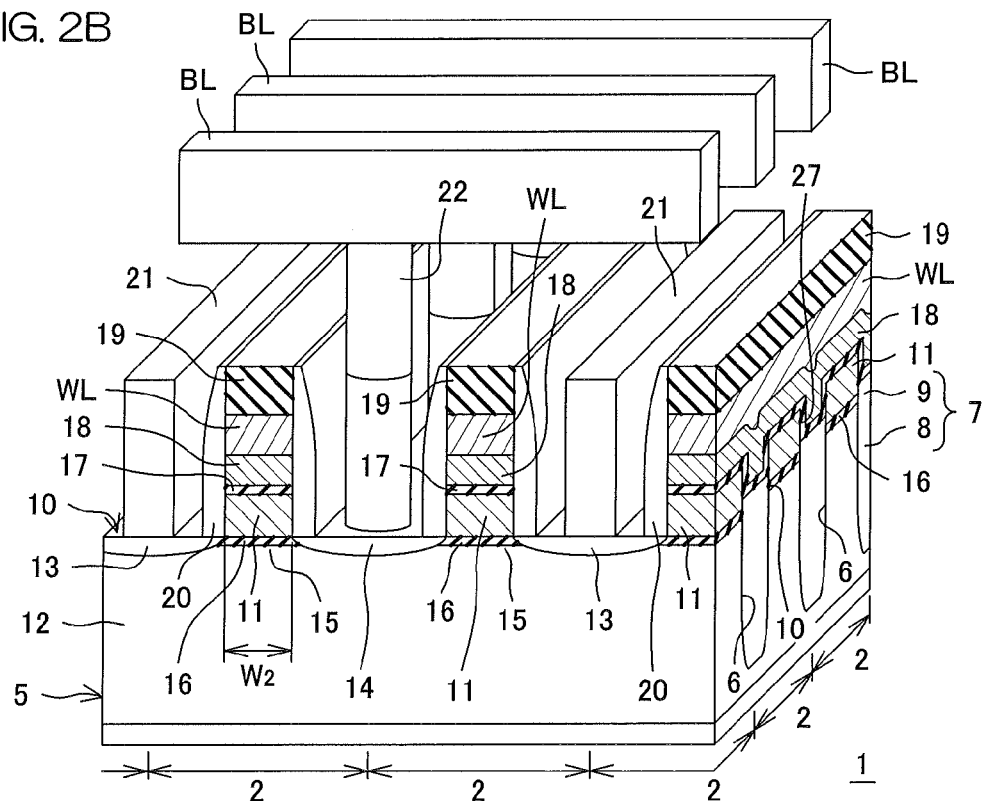

Next, an internal structure of the memory cell 2 will be described with reference to FIGS. 2A and 2B. FIGS. 2A and 2B are bird's eye views for explaining an internal structure of the memory cell 2, in which FIG. 2A shows a view in the direction along the bit lines BL, and FIG. 2B shows a view in the direction along the word lines WL.

The semiconductor device 1 includes a semiconductor substrate 5. The semiconductor substrate 5 is made of, for example, a p-type silicon substrate, and its impurity concentration is, for example, $1 \times 10^{15}$ cm$^{-3}$ to $5 \times 10^{15}$ cm$^{-3}$. In a surface portion of the semiconductor substrate 5, an n-type well 12 is formed. The impurity concentration of the n-type well 12 is, for example, $1 \times 10^{17}$ cm$^{-3}$ to $5 \times 10^{17}$ cm$^{-3}$.

In the semiconductor substrate 5, stripe-shaped trenches 6 that separate a surface region of the semiconductor substrate 5 into a plurality of active regions 10 and a buried insulating film 7 buried into the trenches 6 are formed. Accordingly, in the semiconductor substrate 5, an STI (Shallow Trench Isolation) structure consisting of the trenches 6 and the buried insulating film 7 is formed.

The trenches 6 are formed within the region of the n-type well 12 from the surface of the semiconductor substrate 5, and are arrayed in a stripe shape such that linear line trenches become parallel to each other. The width of the trench 6 and the width B between the adjacent trenches 6 are, as shown in FIG. 2A, both 90 nm or less in the present preferred embodiment. That is, in the semiconductor device 1, there are lines and spaces of 90 nm or less. Each trench 6 is, as shown in FIG. 2A, in a sectional view cut in its width direction orthogonal to the longitudinal direction, formed in a tapered shape to have a narrower width A in a depth direction from an opening end toward a bottom portion. The depth H of each trench 6 is 0.13 μm to 0.16 μm in the present preferred embodiment, and accordingly, the aspect ratio of each trench 6 (depth H of the trench 6/width A of the trench 6) is 1.30 to 1.77. In addition, the width A of the trench 6 is, in the present preferred embodiment, demarcated as a width at the opening end of the trench 6.

The buried insulating film 7 is made of silicon oxide (SiO$_2$), and integrally includes a buried portion 8 stored within the trench 6 and a projecting portion 9 formed outside the trench 6 and projecting upward further than the surface of the semiconductor substrate 5. The projecting portion 9 is, in a sectional view, formed in a quadrangular shape that projects vertically with respect to the surface of the semiconductor substrate 5, and has a top face (flat surface) parallel with respect to the surface of the semiconductor substrate 5 and side faces vertical with respect to the same. Also, the projection amount of the projecting portion 9 is, for example, 0.09 μm to 0.17 μm with reference to the surface of the semiconductor substrate 5. The aspect ratio (total height of the buried portion 8 and the projecting portion 9/width A of the trench 6) of the buried insulating film 7 including such projecting portions 9 is 2.3 to 3.67.

Thus, the active regions 10 demarcated by the trenches 6 are sandwiched by the adjacent projecting portions 9, and provided as recesses having a depth equivalent to a height difference between the top face of the projecting portion 9 and the surface of the semiconductor substrate 5. In each recess (active region 10), a floating gate 11 is formed. The floating gate 11 is buried into the active region 10 formed of the recess in a manner such that its side faces are closely fitted to the side faces of the projecting portions 9, and also projects upward further than the projecting portions 9. The projecting part of the floating gate 11 is finished such that, in order not to overlap the projecting portions 9 of the buried insulating film 7, the entire area of its side faces becomes flush with the side faces of the projecting portions 9. The floating gate 11 is, in the present preferred embodiment, made of p-type polysilicon doped with a p-type impurity (for example, boron) at high concentration. The impurity concentration of the floating gate 11 is, for example, $1\times10^{20}$ cm$^{-3}$ to $5\times10^{20}$ cm$^{-3}$.

Also, as shown in FIG. 2B, a plurality of floating gates 11 are provided at intervals along the longitudinal direction of the trench 6 in each active region 10. At the surface of the semiconductor substrate 5 (n-type well 12) thus exposed to the each active region 10, a p$^+$-type source region 13 and a p$^+$-type drain region 14 are formed. Also, a surface portion of the n-type well 6 sandwiched by these p$^+$-type source and drain regions provides an n-type channel region 15. That is, each memory cell 2 is composed of a p-type MOSFET.

The p$^+$-type source regions 13 and p$^+$-type drain regions 14 are provided alternatingly along the longitudinal direction of the trench 6. Thus, each floating gate 11 is provided as a single layer striding across the p$^+$-type source region 13 and the p$^+$-type drain region 14. Here, the "floating gate 11 is provided as a single layer" means that when, for example, the active region 10 is scanned along the longitudinal direction of the trench 6, no plurality of floating gates 11 are provided between an adjacent pair of the p$^+$-type source region 13 and the p$^+$-type drain region 14, and means, of course, a boundary therebetween and an insulating separation film or the like that is disposed at said boundary also do not exist. Also, a first width $W_1$ (FIG. 2A) of a part along the width direction of the trench 6 of each floating gate 11 and a second width $W_2$ (FIG. 2B) of a part striding across the p$^+$-type source region 13 and the p$^+$-type drain region 14 along the longitudinal direction of the trench 6 are both provided as 90 nm or less. The first width $W_1$ is coincident with the width B between the adjacent trenches 6. Although, in the present preferred embodiment, the first width $W_1$ and the second width $W_2$ are both provided as 90 nm or less as an example, the first width $W_1$ and the second width $W_2$ may be 100 nm or less according to the circumstances.

At the surface of the semiconductor substrate 5 in the n-type channel region 15, a tunneling oxide film 16 is provided so as to be opposed to the floating gate 11. The thickness of the tunneling oxide film 16 is, for example, on the order of 80 Å. The tunneling oxide film 16 passes electrons by FN (Fowler-Nordheim) tunneling between the n-type channel region 15 and the floating gate 11.

Over the floating gate 11, a control gate 18 is formed so as to be opposed to the floating gate 11 via an ONO film 17.

The ONO film 17 is made of an ONO stacked insulating film for which a film made of silicon nitride (SiN) is sandwiched from the top and bottom with films each made of silicon oxide (SiO$_2$).

The control gate 18 is formed in a linear shape extending across the trenches 6. That is, the control gate 18 strides across a plurality of active regions 10 via recesses 27 on the buried insulating layer 7 formed between the adjacent floating gates 11. Accordingly, the control gate 18 collectively covers all floating gates 11 disposed on the same straight line along the direction across the trenches 6. The control gate 18 serves as a common gate of a plurality of memory cells 2 disposed on the same straight line.

On the control gate 18, the word line WL and a nitride film 19 are stacked. In the present preferred embodiment, the word line WL is made of tungsten silicide, and the nitride film 19 is made of silicon nitride (SiN). The thickness of the word line WL is on the order of 0.07 µm, and the thickness of the nitride film 19 is on the order of 0.15 µm. Moreover, sidewalls 20 are formed so as to collectively cover side surfaces of the floating gate 11, the ONO film 17, the control gate 18, the word line WL, and the nitride film 19. The sidewalls 20 are made of, for example, a stacked structure of silicon nitride (SiN)/silicon oxide (SiO$_2$).

To the p$^+$-type source region 13, a source wiring 21 is electrically connected. The source wiring 21 is formed in a linear shape extending across the trenches 6. That is, the source wiring 21 strides across a plurality of active regions 10, and is connected collectively to all p$^+$-type source regions 13 disposed on the same straight line along the direction across the trenches 6. Accordingly, the source wiring 21 serves as a common source of a plurality of memory cells 2 disposed on the same straight line. As the material for the source wirings 21, for example, tungsten can be used. Using tungsten allows forming source wirings 21 with excellent processing accuracy even in the semiconductor device 1 having a line-and-space of 90 nm or less.

The bit line BL is electrically connected to the p$^+$-type drain region 14 via a bit contact 22 (bit plug). The bit contacts 22 are connected one each to the respective p$^+$-type drain regions 14 separated from each other. As the material for the bit lines BL and the bit contacts 22, for example, tungsten can be used. Using tungsten allows forming bit lines BL and bit contacts 22 with excellent processing accuracy even in the semiconductor device 1 having a line-and-space of 90 nm or less.

Writing of data into the memory cell 2 in the present semiconductor device 1 is achieved by injecting electrons (hot electrons) generated by a band-to-band tunneling phenomenon near the p$^+$-type drain region 14 into the floating gate 11. That is, the source wiring 21 connected to the p$^+$-type source region 13 is provided at ground potential (0V). Then, voltages (for example, Vg=−1.8V, Vd=10V~12V, and $V_{WELL}$=4.4V) are applied to the bit line BL, the word line WL, and the n-type well 12. Accordingly, hot electrons are generated near the p$^+$-type drain region 14, and the hot electrons are injected into the floating gate 11.

On the other hand, for erasing data, voltages (for example, Vg=−20V, Vd=0V, and $V_{WELL}$=0V) are applied to the bit line BL, the word line WL, and the semiconductor substrate 5. Due to the application of voltages, an electric field is generated between the floating gate 11 and the n-type well 12, and by an FN tunneling phenomenon using the electric field, electrons are drawn into the n-type well 12 from the floating gate 11.

This series of writing/erasing operations can be performed with a current smaller than that for writing/erasing operations of a memory cell composed of an n-type MOSFET. Thus, even with a simple structure such that the floating gate 11 consists of a single layer as in the present preferred embodiment, excellent writing/erasing operations can be performed. That is, providing the memory cells 2 as p-type MOSFETs allows using the semiconductor device 1 more effectively.

FIGS. 3A and 3B to FIGS. 13A and 13B are views for explaining in the order of steps a part of a method for manufacturing the semiconductor device 1 according to the first preferred embodiment of the present invention. Also, in FIGS. 3A and 3B to FIGS. 13A and 13B, the bird's eye views of FIG. 3A to FIG. 13A correspond to the bird's eye view of FIG. 2A, and the bird's eye views of FIG. 3B to FIG. 13B correspond to the bird's eye view of FIG. 2B.

Figure 3A:
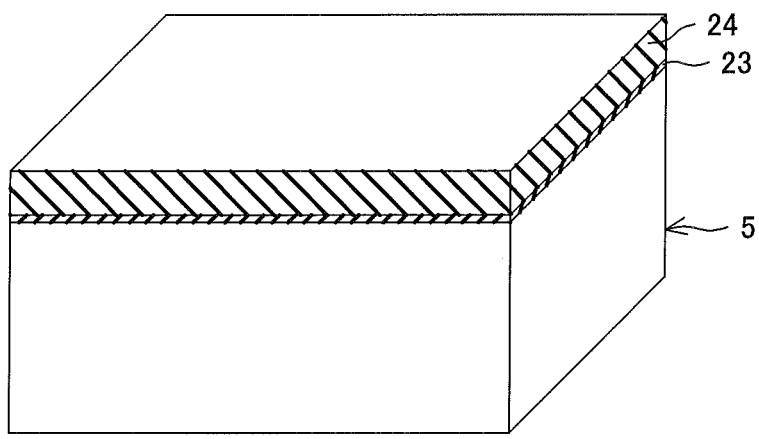
Figure 3B:
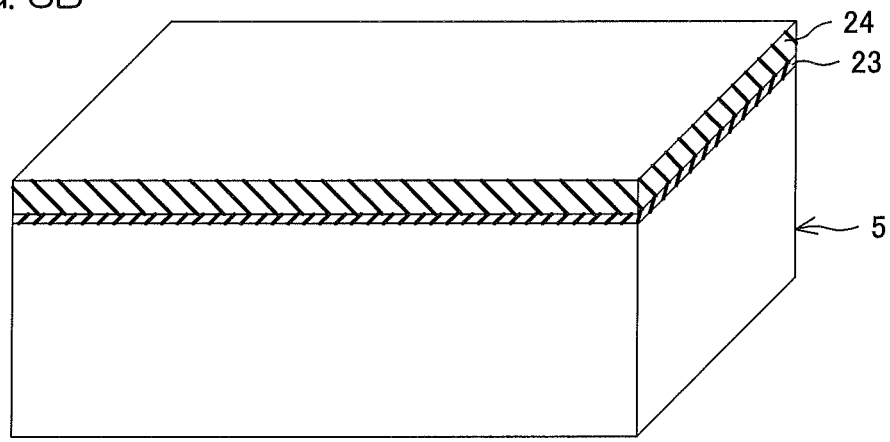

For manufacturing the semiconductor device 1, first, a semiconductor substrate 5 is prepared, and a step of forming trenches 6 and a buried insulating film 7 is performed from a state in which no processing treatment such as ion doping has been applied to the semiconductor substrate 5. Specifically, as shown in FIGS. 3A and 3B, a pad oxide film 23 is formed on the surface of the semiconductor substrate 5 by, for example, a thermal oxidization method, and then, by, for example, a CVD method, a hard mask 24 as an example of an etching mask of the present invention is formed on the pad oxide film 23. The thickness of the pad oxide film 23 is, for example, on the order of 10 nm. Also, the hard mask 24 is formed of a silicon nitride film having a thickness, for example, on the order of 175 nm. In this case, the thickness of the hard mask 24 is set such that the aspect ratio of a space of the trench 6 combined with an opening 25 to be described later becomes 2.3 to 3.67.

Figure 4A:
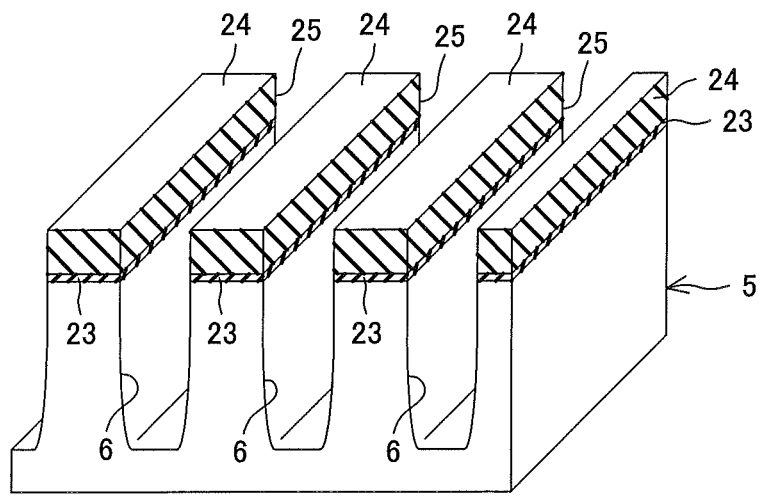
Figure 4B:
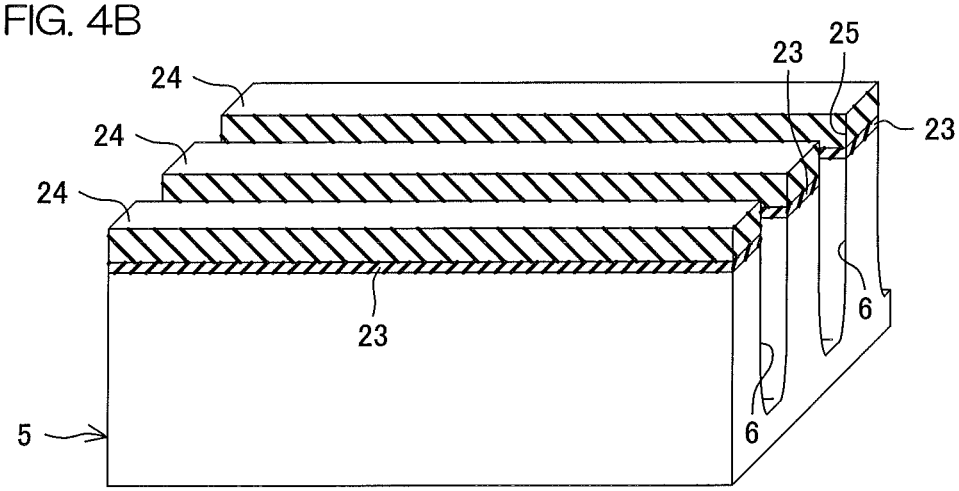

Next, as shown in FIGS. 4A and 4B, the hard mask 24 and the pad oxide film 23 are selectively etched in order to selectively form openings 25 in regions where trenches 6 need to be formed. Then, an etching gas is supplied to the semiconductor substrate 5 via the openings 25. The etching gas proceeds from said openings 25 in a depth direction of the semiconductor substrate 5, so that trenches 6 having tapered shapes in a sectional view are formed in the semiconductor substrate 5.

Figure 5A:
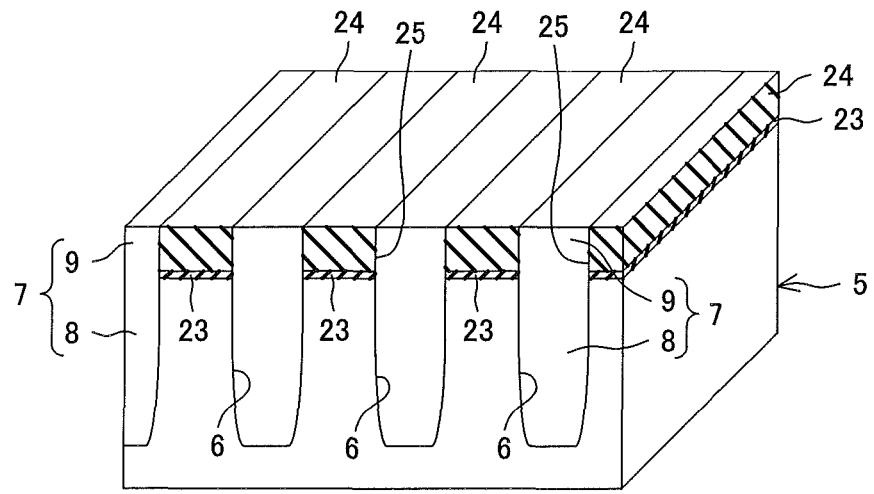
Figure 5B:
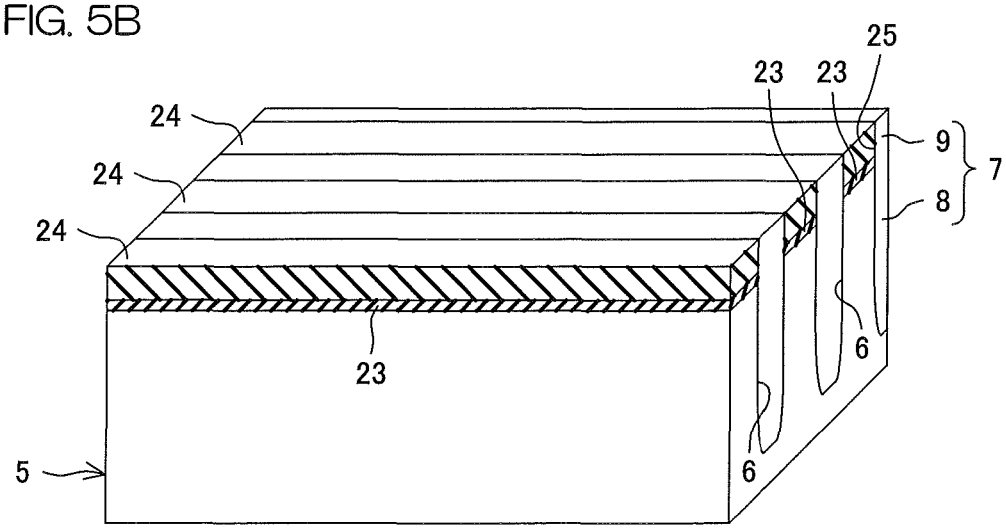

Next, as shown in FIGS. 5A and 5B, said trenches 6 are filled back by deposition of silicon oxide. The deposition of silicon oxide is performed by, for example, a P-CVD (Plasma-Enhanced Chemical Vapor Deposition) method or a HDP-CVD (High-Density Plasma Chemical Vapor Deposition) method. Preferably, the HDP-CVD method is used. The trenches 6 and the openings 25 in the hard mask 24 are filled back with silicon oxide, and further, the hard mask 24 is completely covered with silicon oxide. Subsequently, an unnecessary part of said silicon oxide (part out of the trenches 6 and the openings 25 in the hard mask 24) is removed by polishing with a CMP (Chemical Mechanical Polishing) method. The polishing is continued until the surface of the hard mask 24 and the surface (polished surface) of the buried oxide film become flush with each other. Accordingly, a buried insulating film 7 is buried so as to fill the trenches 6 and the openings 25 in the hard mask 24. In the buried insulating film 7, the parts sandwiched by the laminating structure of the pad oxide film 23 and the hard mask 24 serve as projecting portions 9. In addition, in this step, thin-filming by a RIE (Reactive Ion Etching) method and deposition by the P-CVD method or HDP-CVD method may be alternately repeated to deposit silicon oxide, in order to fill silicon oxide into the trenches 6 evenly and uniformly.

Figure 6A:
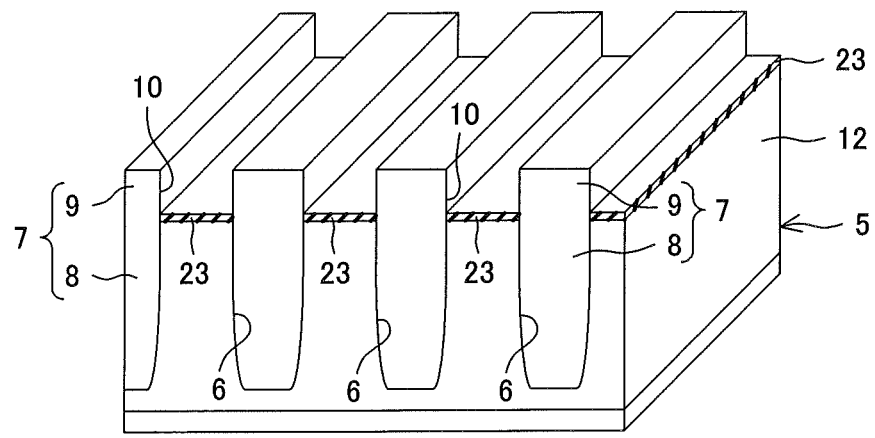
Figure 6B:
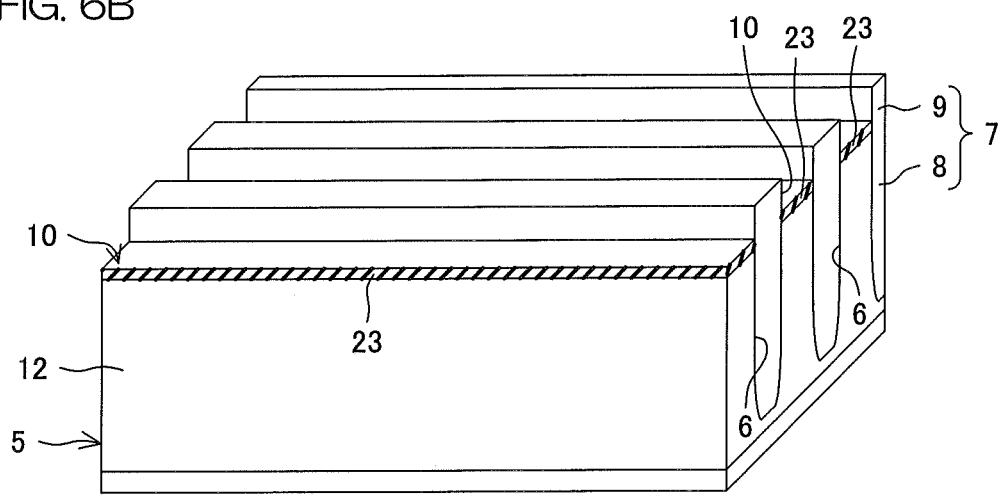

Next, as shown in FIGS. 6A and 6B, as a result of the hard mask 24 being removed, the projecting portions 9 of the buried insulating film 7 are exposed in a projecting state. Accordingly, active regions 10 formed of recesses surrounded by said projecting portions 9 are formed at the positions where the hard mask 24 used to be. Subsequently, as a result of n-type impurity ions being doped into the semiconductor substrate 5, an n-type well 12 is formed. In addition, as the n-type impurity ions, arsenic ($As^+$) ions or phosphorus ($P^+$) ions are used.

Figure 7A:
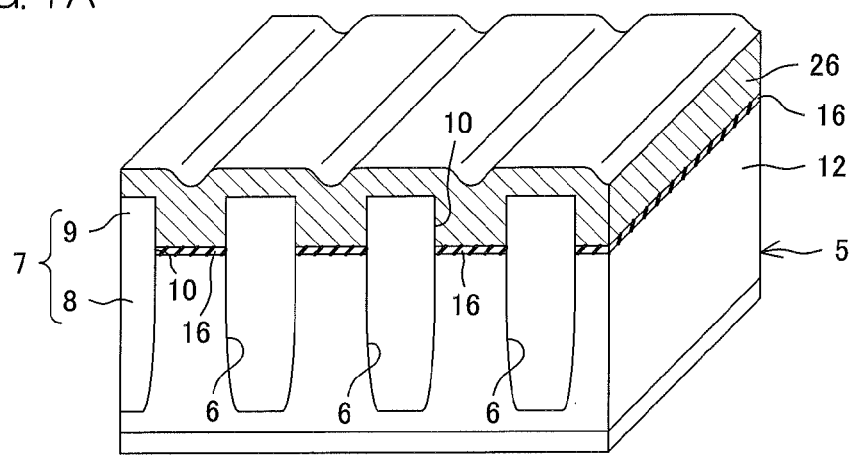
Figure 7B:
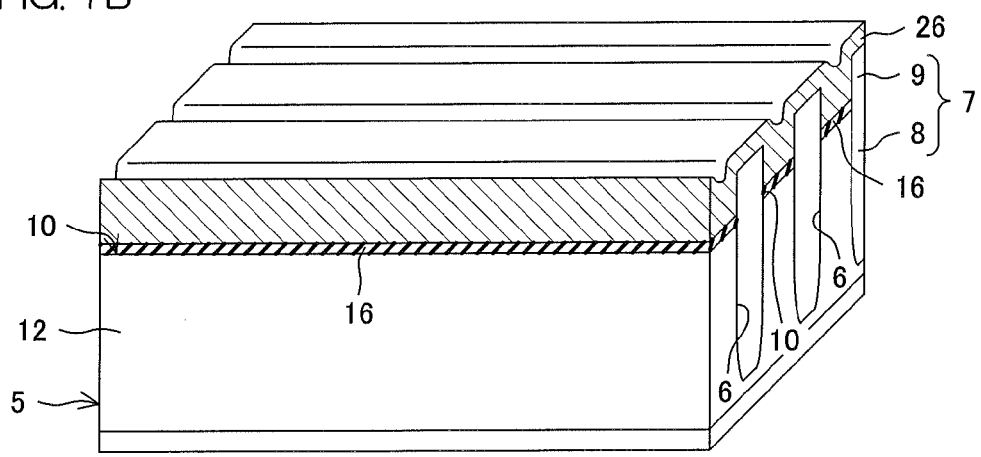

Next, as shown in FIGS. 7A and 7B, after the pad oxide film 23 is removed, by thermally-oxidizing the surface of the semiconductor substrate 5 thereby exposed, a tunneling oxide film 16 is formed. After formation of the tunneling oxide film 16, a polysilicon film 26 added with p-type impurity ions (for example, boron ($B^+$) ions) is deposited by a CVD method. The polysilicon film 26 is formed so as to fill the active regions 10 formed of recesses and cover the buried insulating film 7.

Figure 8A:
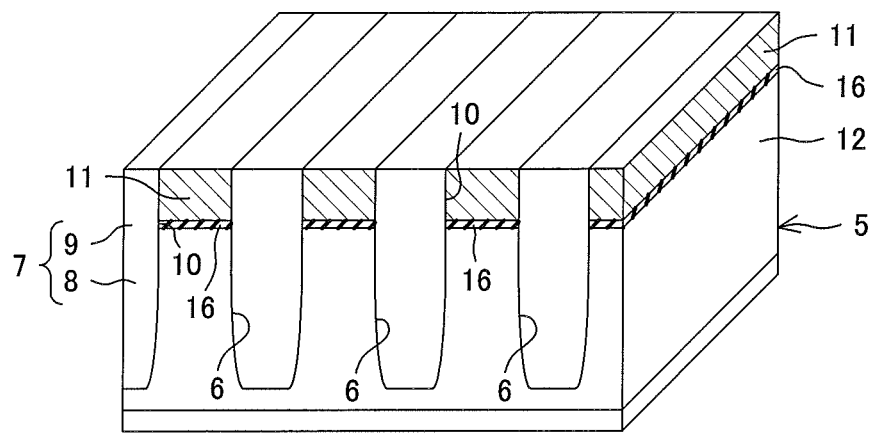
Figure 8B:
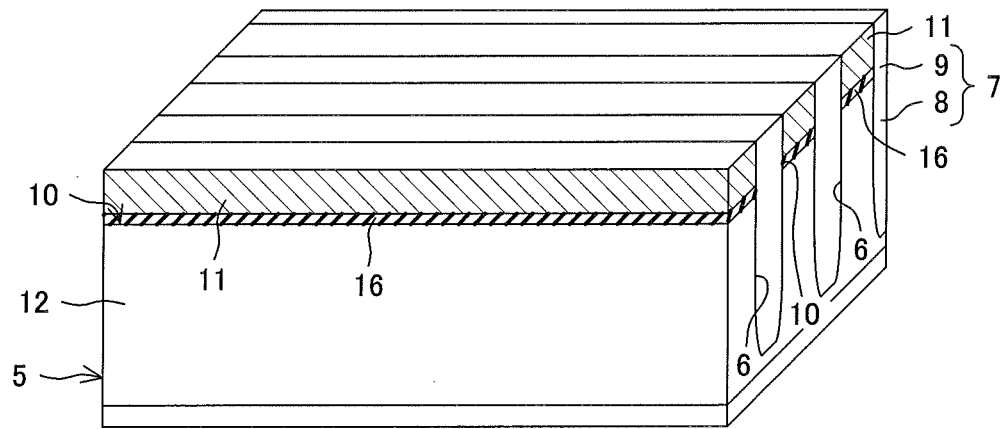

Next, as shown in FIGS. 8A and 8B, an unnecessary part of the polysilicon film 26 (part covering the buried insulating film 7) is removed by polishing with a CMP method from a state in which the surface of the polysilicon film 26 is exposed, that is, a state in which the surface of the polysilicon film 26 is not covered with any film. The polishing is continued until the top face of the projecting portions 9 of the buried insulating film 7 and the surface (polished surface) of the polysilicon film 26 become flush with each other. Accordingly, floating gates 11 are buried into the active regions 10 formed of recesses surrounded by the projecting portions 9.

Figure 9A:
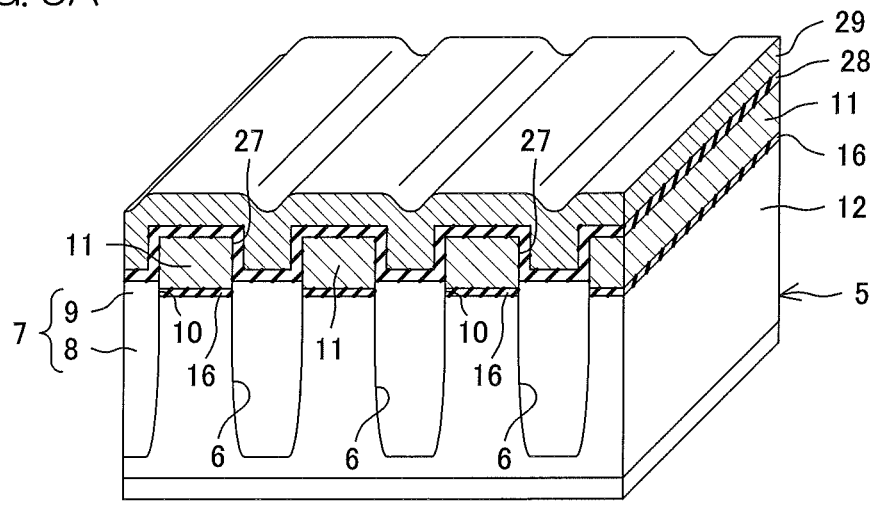
Figure 9B:
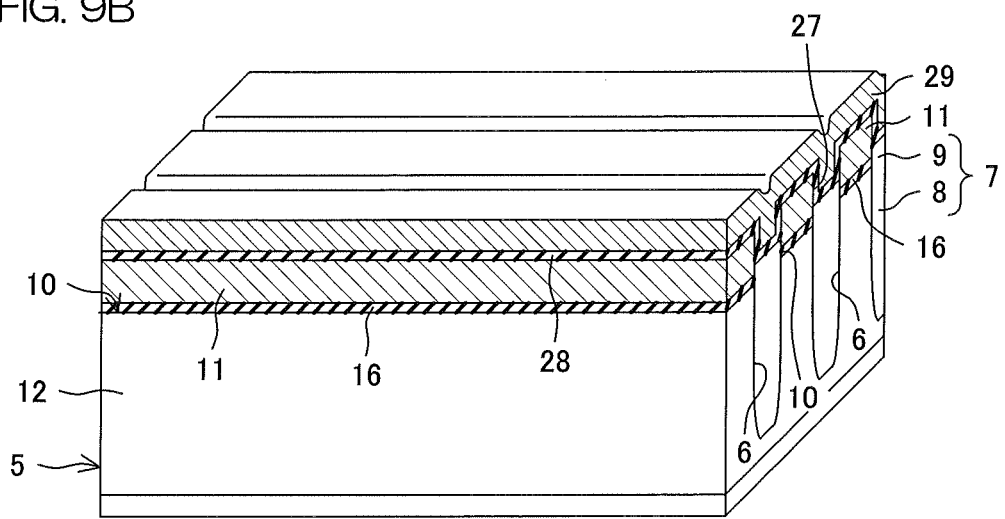

Next, as shown in FIGS. 9A and 9B, as a result of the projecting portions 9 of the buried insulating film 7 being selectively removed at an even thickness from the surface, the projecting portions 9 are adjusted to be thinned. The removal amount of the projecting portions 9 is set such that, for example, the aspect ratio of the buried insulating film 7 that remains after the treatment becomes 2.3 to 3.67. As a result of the projecting portions 9 being thinned, between the adjacent floating gates 11, recesses 27 having a depth equivalent to a height difference between a top face of the floating gate 11 and the top face of the projecting portion 9 are formed. Next, an ONO film 28 is formed, by a CVD method, on the entire surface of the semiconductor substrate 5 so as to collectively cover a plurality of floating gates 11. Next, after formation of the ONO film 28, a polysilicon film 29 added with p-type impurity ions (for example, boron ($B^+$) ions) is deposited by a CVD method.

Figure 10A:
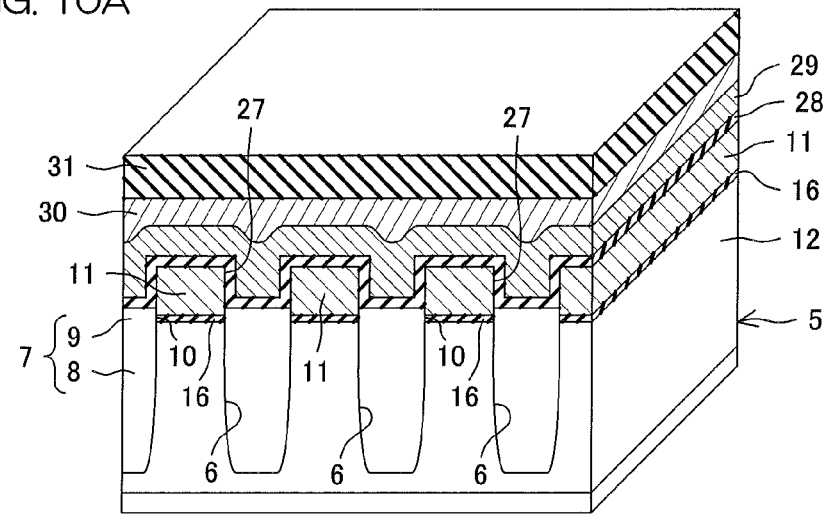
Figure 10B:
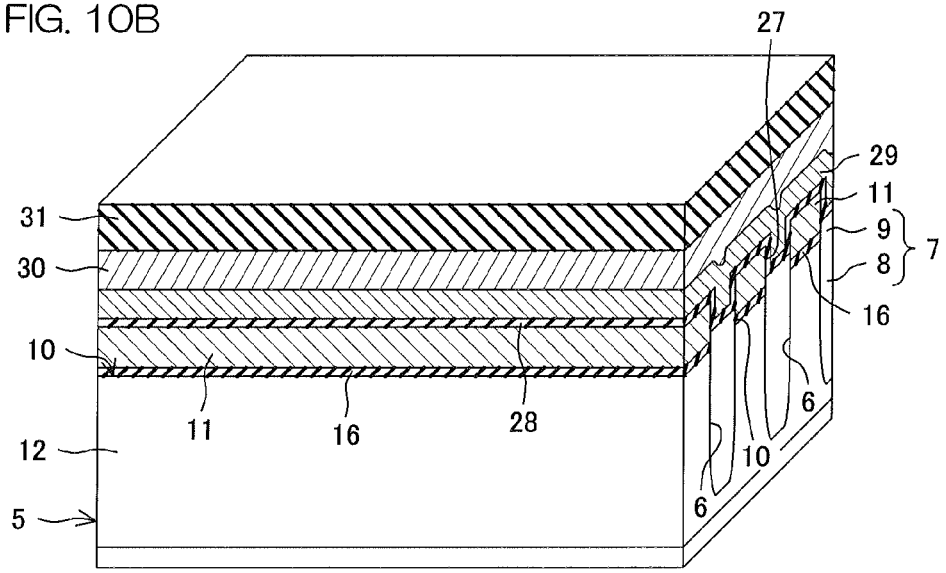

Next, as shown in FIGS. 10A and 10B, a tungsten silicide film 30 and a nitride film 31 are deposited, by a CVD method, on the entire surface of the semiconductor substrate 5.

Figure 11A:
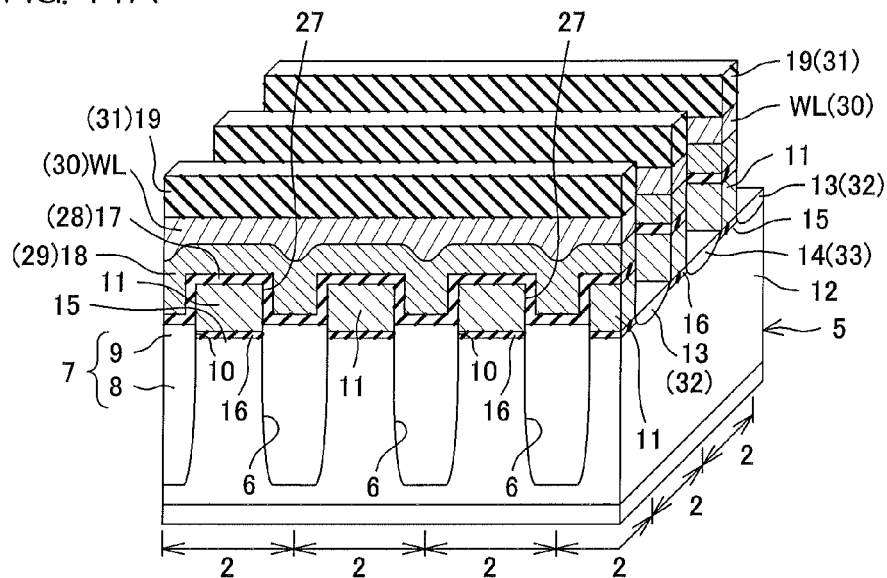
Figure 11B:
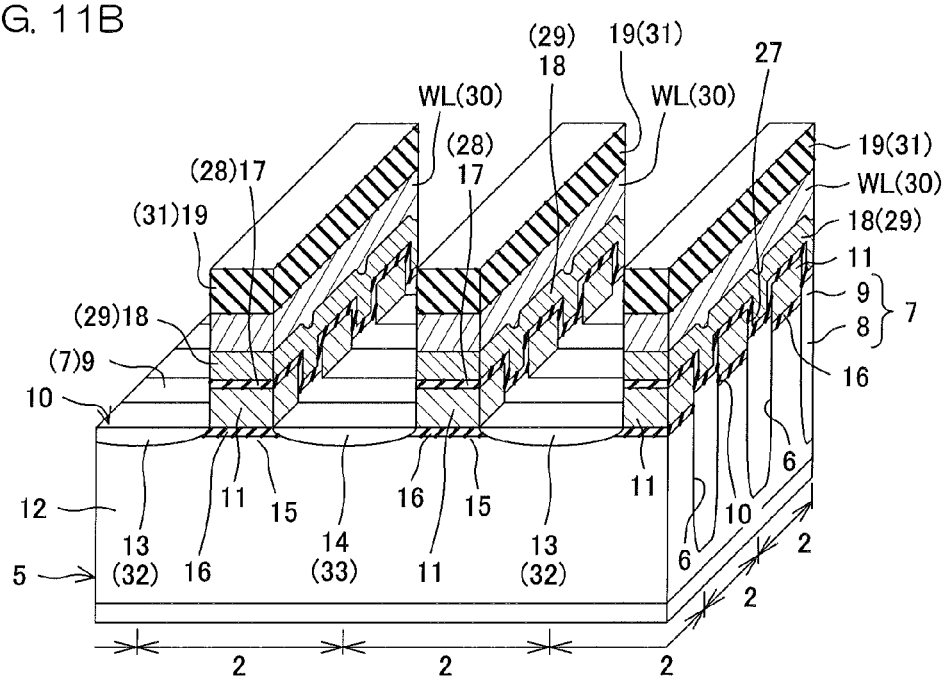

Next, as shown in FIGS. 11A and 11B, the nitride film 31, the tungsten silicide film 30, the polysilicon film 29, the ONO film 28, and the floating gates 11 are selectively removed along the longitudinal direction of the trenches 6. Accordingly, the semiconductor substrate 5 is demarcated into memory cells 2 arrayed in a matrix shape, and source forming regions 32 as examples of a first region of the present invention and drain forming regions 33 as examples of a second region of the present invention are simultaneously formed in a manner sandwiching the floating gates 11. Also, a nitride film 19 made of a part of the nitride film 31, word lines WL made of a part of the tungsten silicide film 30, control gates 18 made of a part of the polysilicon film 29, and an ONO film 17 made of a part of the ONO film 28 are also simultaneously formed. Next, boron ($B^+$) ions serving as a p-type impurity are doped into the source forming regions 32 and the drain forming regions 33, and thereafter thermally diffused by annealing treatment. Accordingly, $p^+$-type source regions 13, $p^+$-type drain regions 14, and n-type channel regions 15 are simultaneously formed.

Figure 12A:
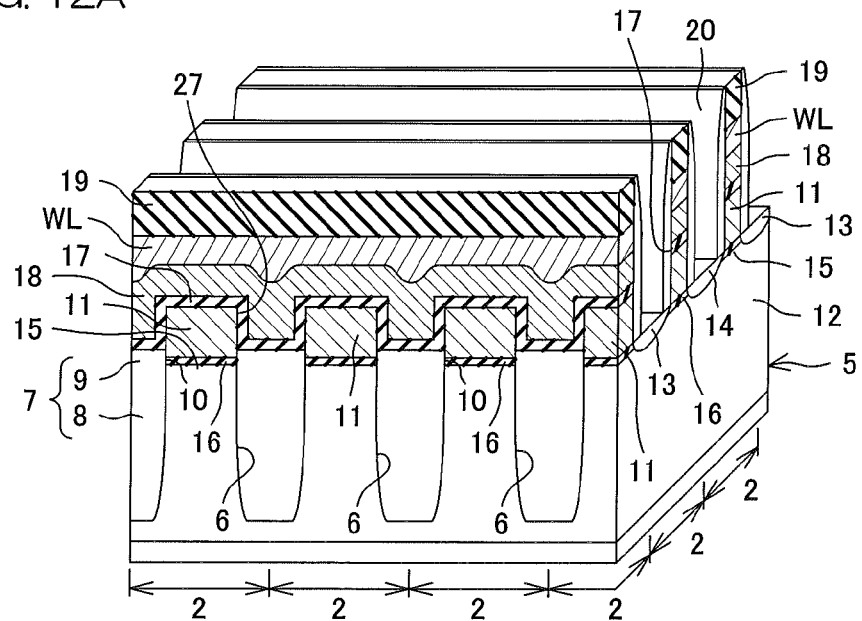
Figure 12B:
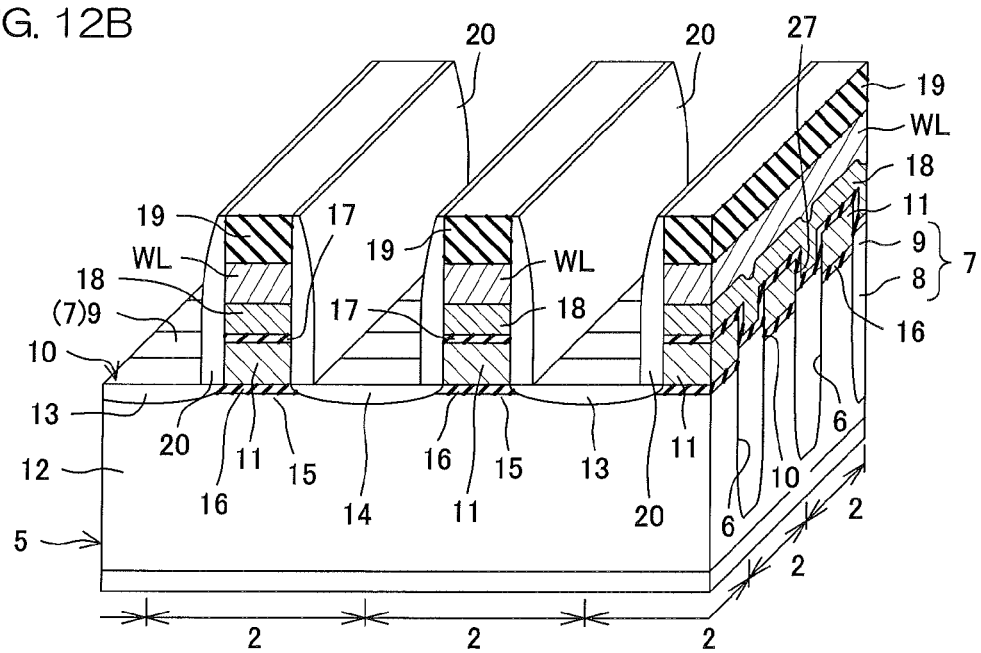

Next, a silicon nitride (SiN) film and a silicon oxide ($SiO_2$) film are deposited on the entire surface of the semiconductor substrate 5 by, for example, a CVD method. Subsequently, by etching back said silicon nitride film/silicon oxide film, as shown in FIGS. 12A and 12B, sidewalls 20 are formed.

Figure 13A:
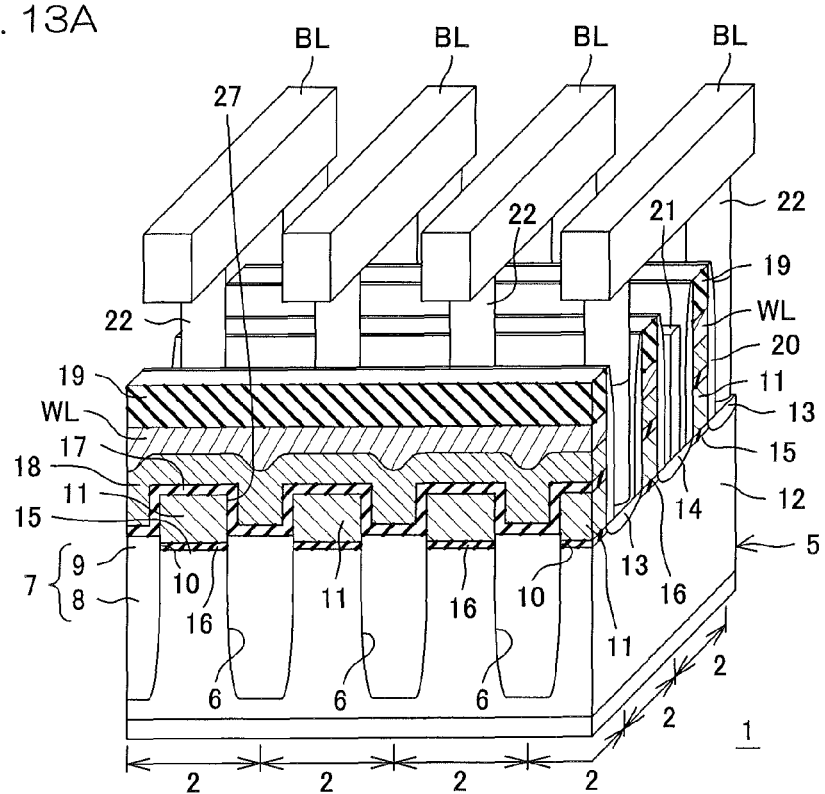
Figure 13B:
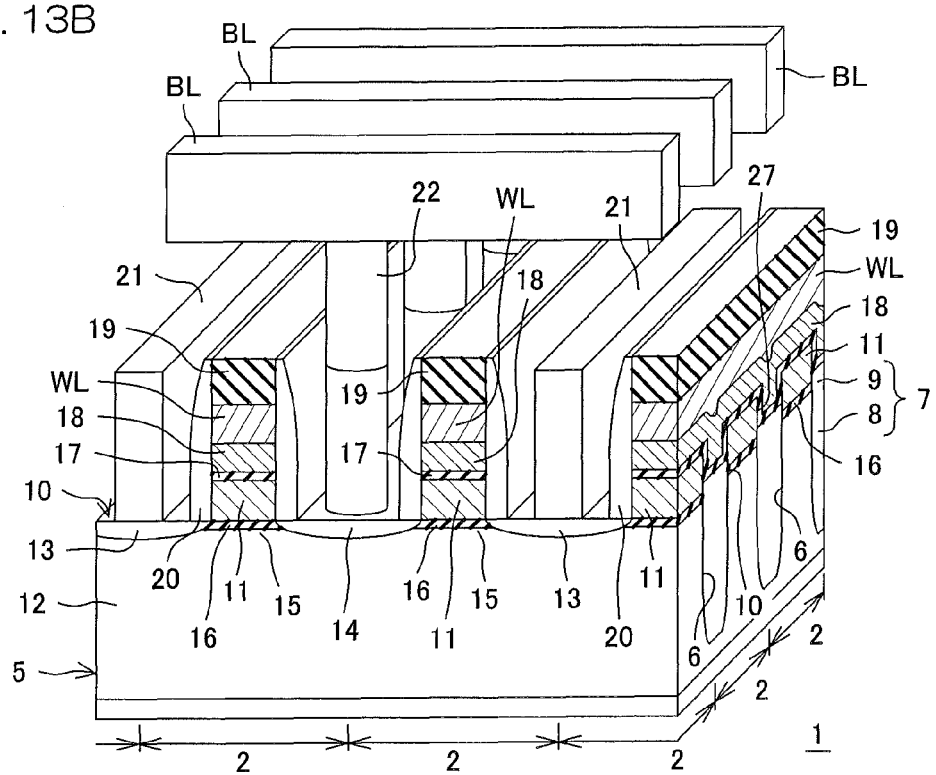

Subsequently, as shown in FIGS. 13A and 13B, as a result of source wirings 21, bit contacts 22, and bit lines BL being formed, the semiconductor device 1 shown in FIGS. 2A and 2B is obtained.

According to the above method, as shown in FIGS. 3A and 3B, a step of forming trenches 6 and a buried insulating film 7 is performed from a state in which no processing treatment such as ion doping has been applied to the semiconductor substrate 5. Therefore, the occurrence of minute defects in the semiconductor substrate 5 can be prevented before formation of an STI structure consisting of the trenches 6 and the buried insulating film 7. Thus, an excellent STI structure can be formed, so that the yield can be improved.

Also, as shown in FIGS. 4A and 4B, when forming the trenches 6 for the buried insulating film 7, because no electrode material is interposed between the hard mask 24 and the semiconductor substrate 5, the aspect ratio of the trenches 6 including the openings 25 in said hard mask 24 can be made smaller than that when an electrode material is interposed.

Further, as shown in FIGS. 2A and 2B, it is not necessary to overlap the floating gate 11 with the projecting portions 9 of the buried insulating film 7, which therefore, when designing the width A of the trenches 6, eliminates setting the trench width A wide in anticipation of the width of overlapping parts of the floating gates 11. Therefore, the trenches 6 can be micro-fabricated, and further, the buried insulating film 7 can also be increased in burying ability. As a result, as in the present preferred embodiment, a buried insulating film 7 having an aspect ratio of 2.3 to 3.67 can be formed.

Also, as a result of not overlapping the floating gate 11 with the projecting portions 9 of the buried insulating film 7, no step is formed between the floating gate 11 and the buried insulating film 7. As a result, the occurrence of weak spots or voids can also be effectively prevented when burying the buried insulating film 7.

Also, as shown in FIGS. 8A and 8B, because the floating gates 11 each consisting of a single layer are formed by polishing from a state in which the surface of the polysilicon film 26 is not covered with any film, it is not necessary to perform a polishing step for formation of the floating gates 11 a plurality of times. Therefore, transfer between polishing devices becomes no longer necessary, and also, a one-time setting of polishing conditions suffices in forming floating gates 11, so that the manufacturing process can be simplified. Further, because transfer between polishing devices becomes no longer necessary, adhesion of particles to the surface of the semiconductor substrate 5 (wafer) can also be reduced.

Also, as shown in FIGS. 7A and 7B and FIGS. 8A and 8B, because, after removal of the hard mask 24, the polysilicon film 26 buried into the active regions 10 formed of recesses where that hard mask 24 used to be serves as floating gates 11, the height of the floating gates 11 can be simply adjusted by only adjusting the thickness of the hard mask 24 in the step of FIGS. 3A and 3B.

Also, because the step of depositing a polysilicon film 26 by a CVD method suffices with one step, it is not necessary, in forming floating gates 11, to load and unload the semiconductor substrate 5 in and from a CVD device multiple times. Therefore, unnecessary oxidation of the polysilicon film 26 does not need to be considered, and it becomes no longer necessary to make a special preparation such as inserting the semiconductor substrate 5 at low temperature into a CVD device. As a result, burden on the CVD device can be reduced.

Moreover, in the semiconductor device 1 manufactured by the method mentioned above, as shown in FIGS. 2A and 2B, because the floating gate 11 consists of a single layer striding across the p$^+$-type source region 13 and the p$^+$-type drain region 14, a small cell size can be realized.

Also, as shown in FIGS. 2A and 2B, because the floating gate 11 does not overlap the projecting portions 9 of the buried insulating film 7, the distance between the floating gates 11 adjacent across the buried insulating film 7 can be wide. Accordingly, parasitic capacitance between the adjacent floating gates 11 can be reduced, so that threshold variation due to the effect of coupling between the floating gates 11 can be reduced. That is, conversely, if a floating gate 11 overlaps the projecting portions 9, said floating gate 11 approximates adjacent floating gates 11, which thus makes the distance between the floating gates 11 inevitably close. Therefore, the above-mentioned parasitic capacitance tends to be increased.

The first preferred embodiment of the present invention has been described above, however, the present invention can also be carried out in other modes.

For example, in the above-described preferred embodiment, an arrangement for which the respective semiconductor parts of the semiconductor device 1 are inverted in conductivity type may be adopted. For example, in the semiconductor device 1, the p-type parts may be n-type, and the n-type parts may be p-type. Thus, the MOSFET that composes the memory cell 2 may be a p-type MOSFET as described above, or may be an n-type MOSFET.

Also, around the memory cells 2, a peripheral circuit region formed with various elements such as a charge pump, a Zener diode, and a MIS transistor may be set.

Various other design modifications can be made within the scope of the matters described in the claims.

First Reference Example

Figure 14A:
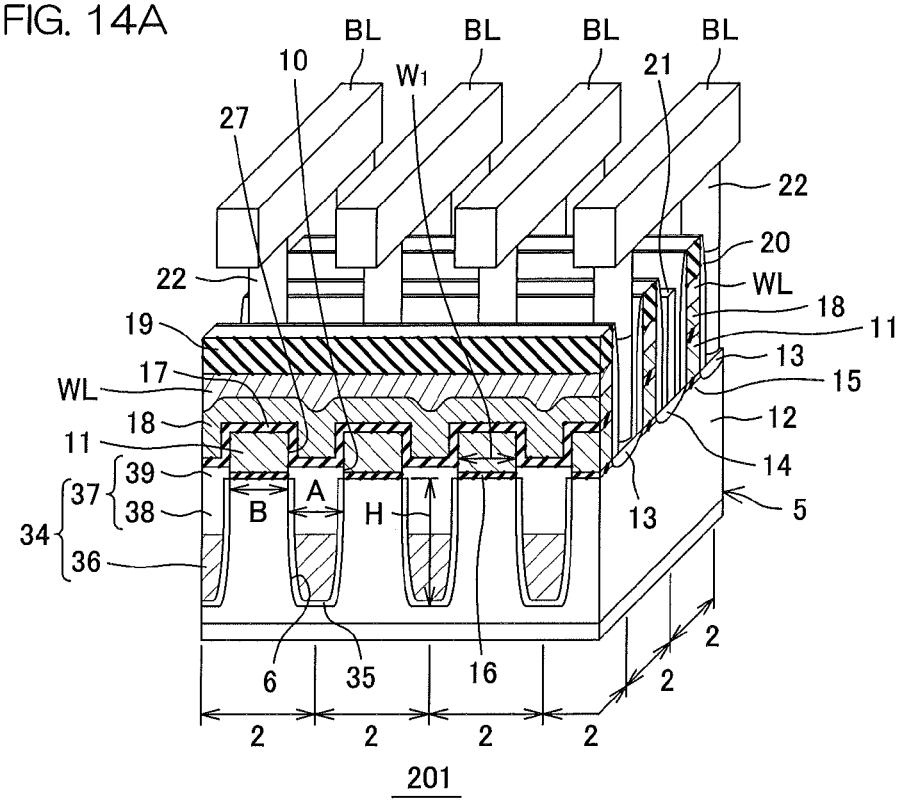
Figure 14B:
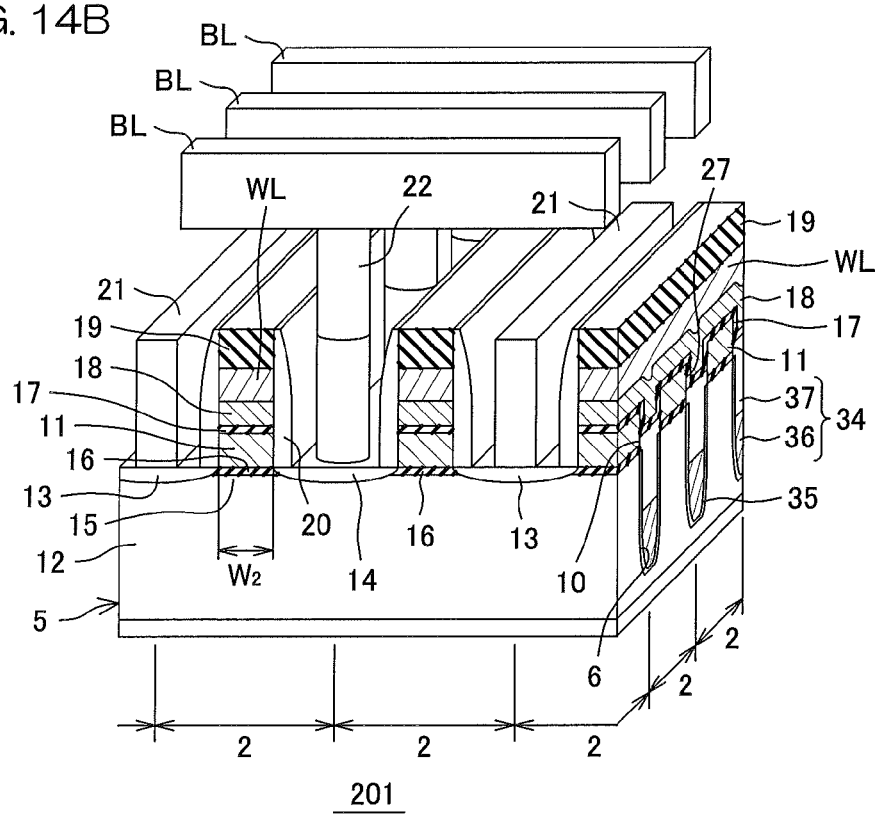

FIGS. 14A and 14B are bird's eye views for explaining an internal structure of a memory cell 2 of a semiconductor device 201 according to a first reference example of the present invention. FIG. 14A shows a view in the direction along the bit lines BL, and FIG. 14B shows a view in the direction along the word lines WL. In FIGS. 14A and 14B, elements corresponding to each other with those in FIGS. 2A and 2B described above are denoted by the same reference signs.

In the semiconductor device 201, a liner oxide film 35 is formed at an inner face of the trenches 6, and a buried film 34 is formed in the trenches 6 via the liner oxide film 35. Accordingly, in the semiconductor substrate 5, an STI structure consisting of the trenches 6 and the buried film 34 is formed.

The depth H of each trench 6 is 50 nm to 500 nm in the present first reference example, and the aspect ratio of each trench 6 (depth H of the trench 6/width A of the trench 6) is 4 or more (preferably, 4 to 8). Also, the trenches 6 have an STI structure, but their depth and aspect ratio can be appropriately changed. For example, the trenches 6 may have a DTI (Deep Trench Isolation) structure having a depth of 0.5 µm or more, and preferably, 1 µm to 40 µm, and having an aspect ratio of 8 to 20.

The liner oxide film 35 is made of, for example, silicon oxide, and formed over the entire area of side faces and bottom faces of the trenches 6. Moreover, the buried film 34 is buried inside the liner oxide film 35 in the trenches 6. The buried film 34 includes a first material layer 36 and a second material layer 37 stacked in this order from the bottom portion of the trench 6 to the opening side.

The first material layer 36 is buried up to a halfway portion in the depth direction of the trench 6 such that an interface with the second material layer 37 is located at a fixed height position with reference to the bottom portion of the trench 6. That is, in the present first reference example, a region from the bottom portion of the trench 6 to a fixed height is filled with the first material layer 36 such that the interface between the first material layer 36 and the second material layer 37 becomes parallel with the surface of the semiconductor substrate 5, and a remaining region above the first material layer 36 is filled with the second material layer 37.

Also, the aspect ratio of the region above the first material layer 36 (that is, the part demarcated by an upper face of the first material layer 36 and the side faces of the trench 6 above said upper face) is preferably 4 or less. The second material layer 37 buried into this region integrally includes a buried portion 38 stored within the trench 6 and a projecting portion 39 formed outside the trench 6 and projecting upward further than the surface of the semiconductor substrate 5. The projecting portion 39 is, in a sectional view, formed in a quadrangular shape that projects vertically with respect to the surface of the semiconductor substrate 5, and has a top face (flat surface) parallel with respect to the surface of the semiconductor substrate 5 and side faces vertical with respect to the same. The projection amount of the projecting portion 39 is, for example, 0.09 μm to 0.17 μm with reference to the surface of the semiconductor substrate 5.

The first material layer 36 is made of, for example, polysilicon, and the second material layer 37 is made of silicon oxide ($SiO_2$). In addition, as other materials for the first material layer 36, TEOS and silicon nitride (SiN) can be exemplified.

FIGS. 15A and 15B to FIGS. 25A and 25B are views for explaining in the order of steps a part of a method for manufacturing the semiconductor device 201 according to the first reference example of the present invention. Also, in FIGS. 15A and 15B to FIGS. 25A and 25B, the bird's eye views of FIG. 15A to FIG. 25A correspond to the bird's eye view of FIG. 14A, and the bird's eye views of FIG. 15B to FIG. 25B correspond to the bird's eye view of FIG. 14B.

Figure 15A:
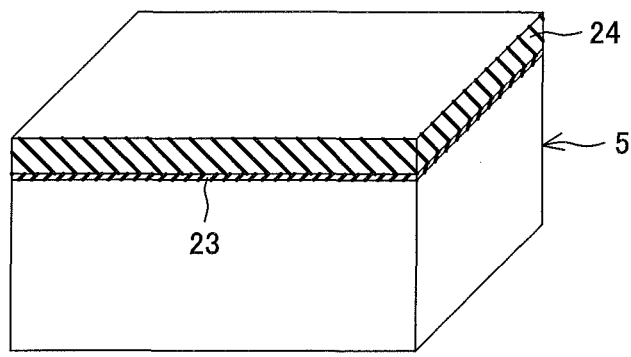
Figure 15B:
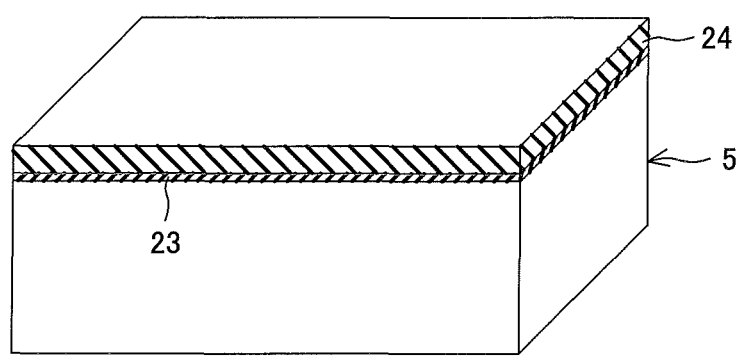

For manufacturing the semiconductor device 201, first, as shown in FIGS. 15A and 15B, a pad oxide film 23 and a hard mask 24 are formed by the same step as that in FIGS. 3A and 3B.

Figure 16A:
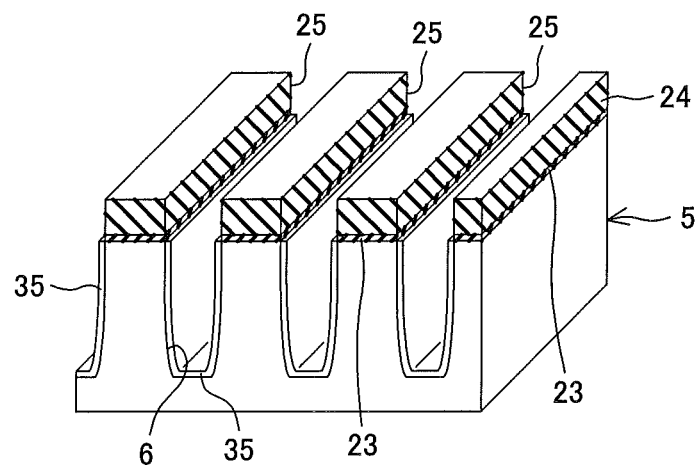
Figure 16B:
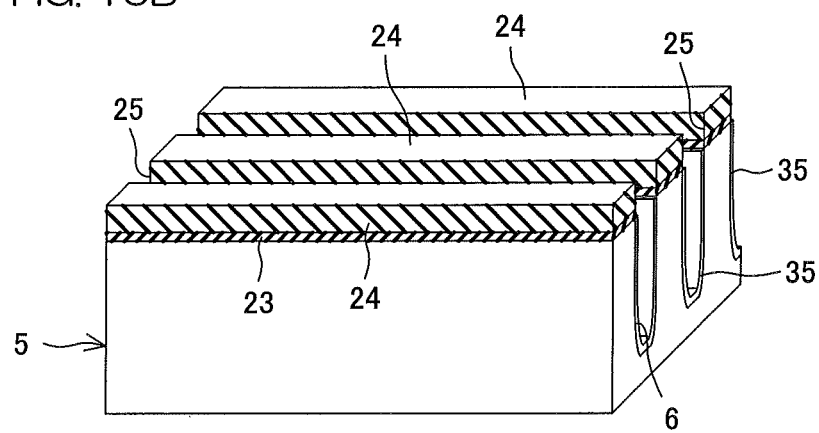

Next, as shown in FIGS. 16A and 16B, trenches 6 having tapered shapes in a sectional view are formed by the same step as that in FIGS. 4A and 4B.

Next, the semiconductor substrate 5 is thermally oxidized with the hard mask 24 remaining. The thermal oxidation is performed, for example, at a temperature of 700° C. to 1200° C. in an atmosphere injected with oxygen gas or the like. By the thermal oxidation, a liner oxide film 35 having an almost uniform thickness is formed entirely over the side faces and bottom faces of the trenches 6 at which the semiconductor substrate 5 is exposed.

Figure 17A:
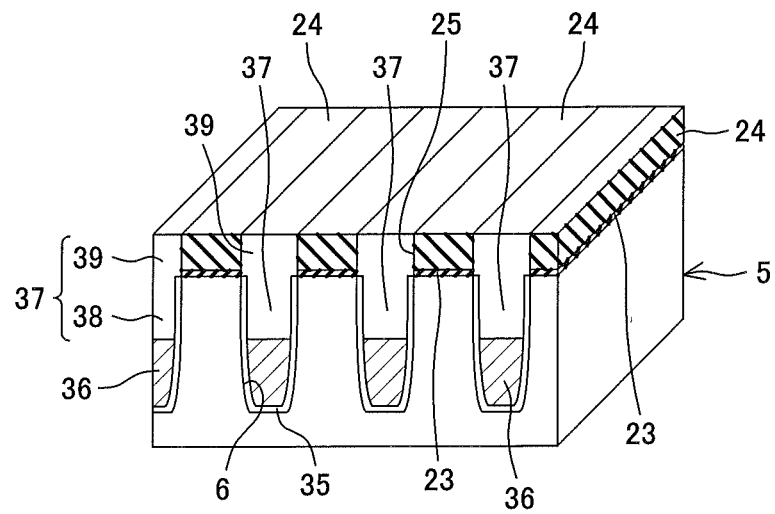
Figure 17B:
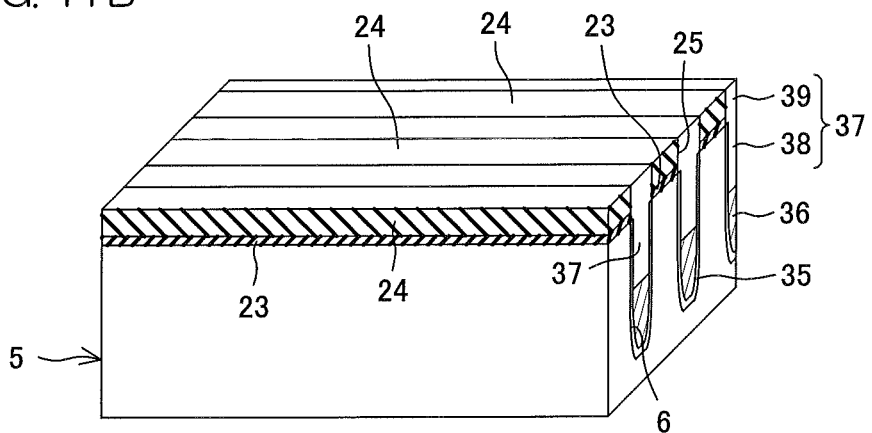

Next, as shown in FIGS. 17A and 17B, a step of filling back the trenches 6 with a material of the first material layer 36 is performed. As the material for the first material layer 36, polysilicon, silicon nitride, or TEOS can be adopted. In the following, description will be given of a case in which polysilicon is deposited.

The deposition of polysilicon is performed by, for example, an LP-CVD method. The LP-CVD method is performed, under a pressure on the order of 10 Pa to 50 Pa (Pascals), at a temperature of 600° C. to 900° C. Accordingly, the trenches 6 and the openings 25 in the hard mask 24 are filled back with polysilicon, and further, the hard mask 24 is completely covered with polysilicon. Accordingly, a first material layer 36 is formed.

Next, an unnecessary part of the first material layer 36 (part out of the trenches 6 and the openings 25 in the hard mask 24) is removed by a CMP method. The CMP is continued until the surface of the hard mask 24 and the surface (polished surface) of the first material layer 36 become flush with each other. Accordingly, the first material layer 36 is buried so as to fill the trenches 6 and the openings 25 in the hard mask 24.

Next, the first material layer 36 is etched until a position (depth) where the upper surface of the first material layer 36 becomes lower than the surface of the semiconductor substrate 5. The etching is performed by, for example, dry etching such as a RIE method.

At this time, it is preferable that the first material layer 36 is formed such that the aspect ratio of the part demarcated by the upper face of the first material layer 36 and the side faces of the trench 6 above said upper face becomes 4 or less. In addition, the same first material layer 36 can also be formed by only the step of etching treatment by a RIE method, by omitting the step of polishing polysilicon by a CMP method described above.

Next, a step of filling back the trenches 6 with a material of the second material layer 37 is performed. Specifically, silicon oxide is deposited until filling back the trenches 6 with the first material layer 36 formed via the liner oxide film 35 and completely covering the hard mask 24. The deposition of silicon oxide is performed by, for example, an HDP-CVD method or a P-CVD method. Preferably, the HDP-CVD method is used. Accordingly, a second material layer 37 is formed.

Next, an unnecessary part of the second material layer 37 (part out of the trenches 6 and the openings 25 in the hard mask 24) is removed by a CMP method. The CMP is continued until the surface of the hard mask 24 and the surface (polished surface) of the second material layer 37 become flush with each other. Accordingly, the second material layer 37 is buried so as to fill the trenches 6 and the openings 25 in the hard mask 24. In this manner, a buried film 34 including the first material layer 36 and the second material layer 37 is formed. In addition, in the second material layer 37, the parts stored in the trenches 6 serve as buried portions 38, the parts sandwiched by the pad oxide film 23 and hard mask 24 serve as projecting portions 39.

Figure 18A:
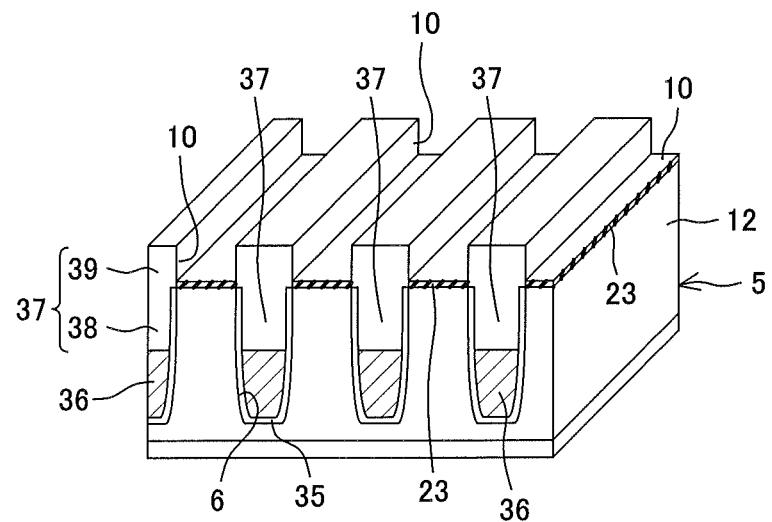
Figure 18B:
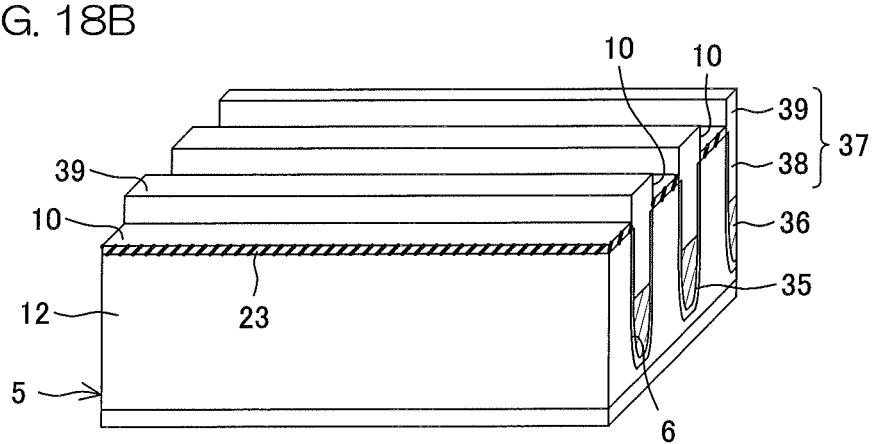
Figure 19A:
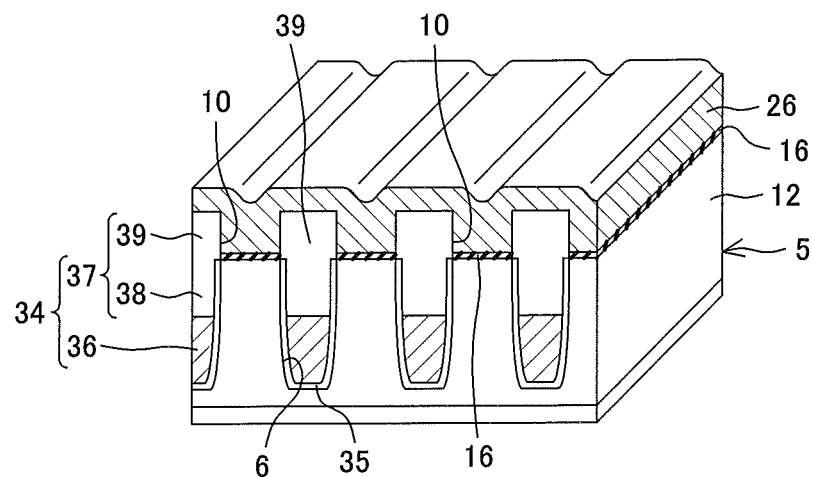
Figure 19B:
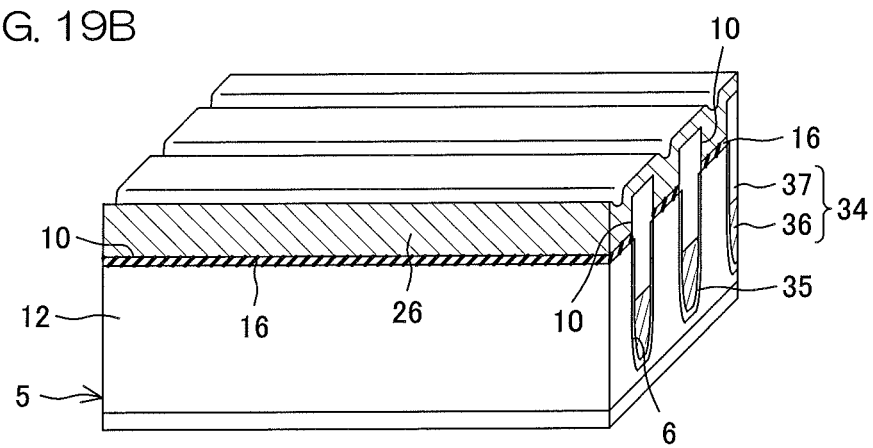
Figure 20A:
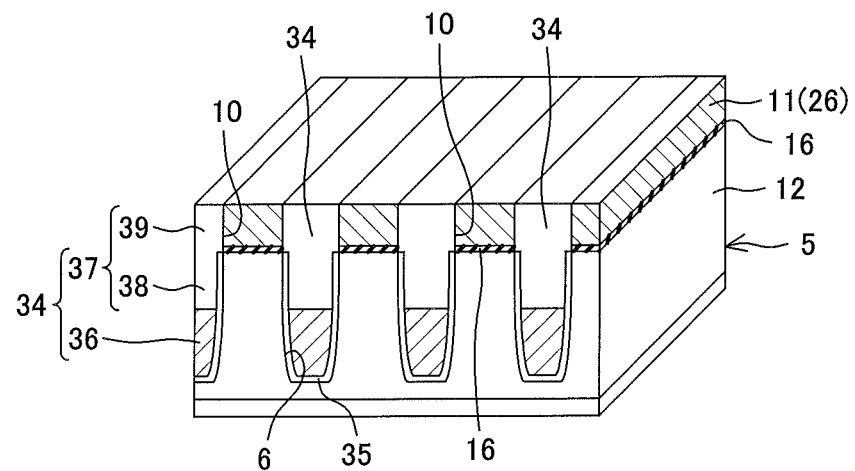
Figure 20B:
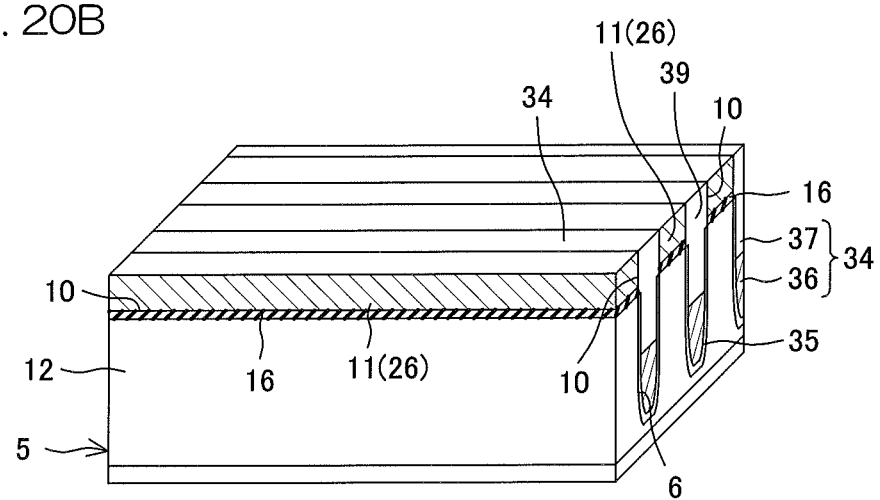
Figure 21A:
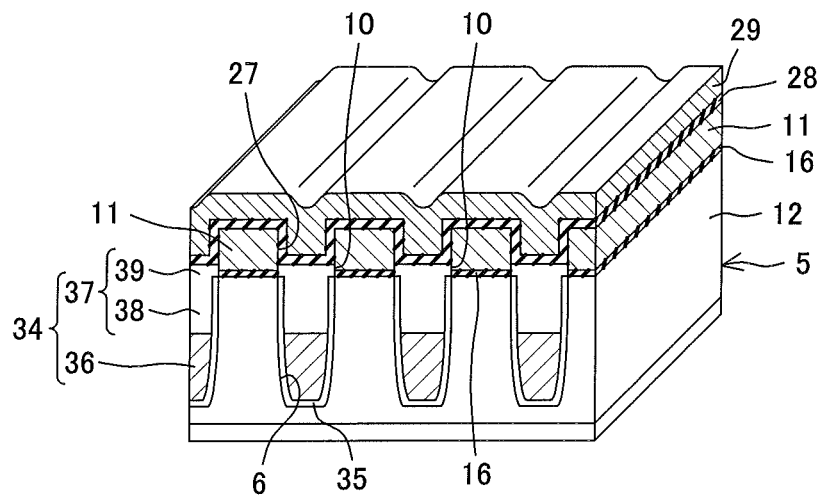
Figure 21B:
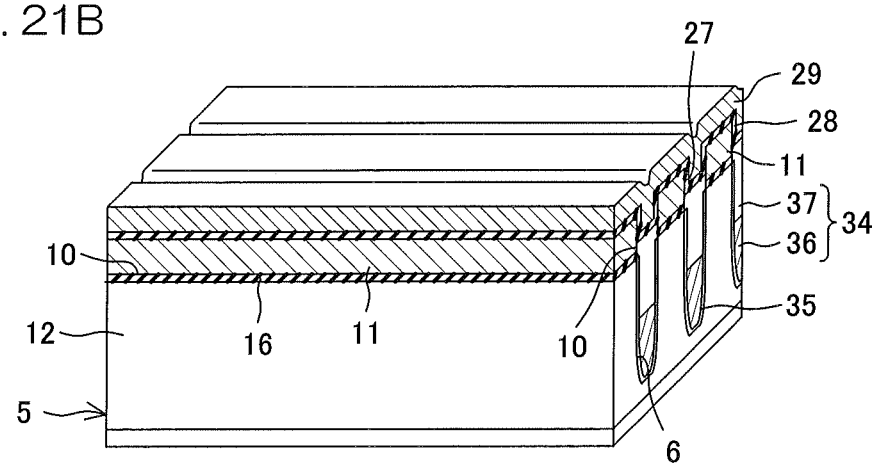
Figure 22A:
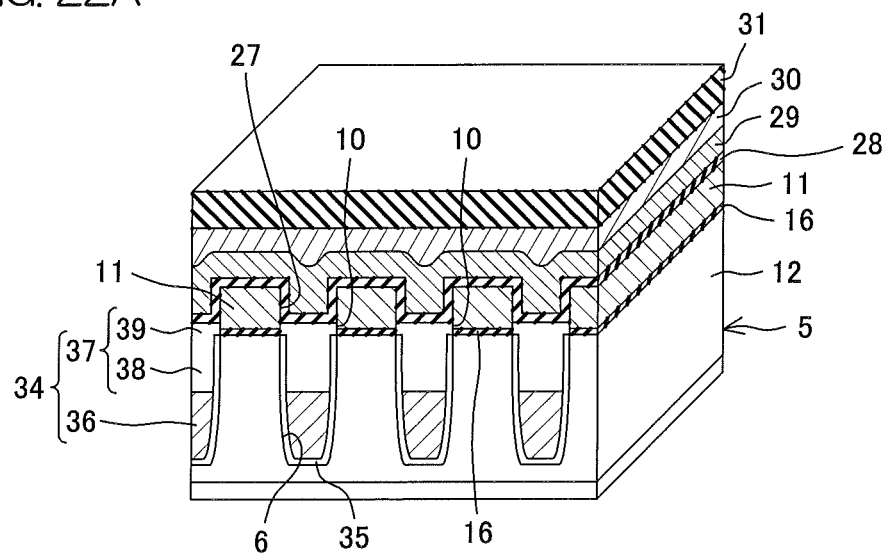
Figure 22B:
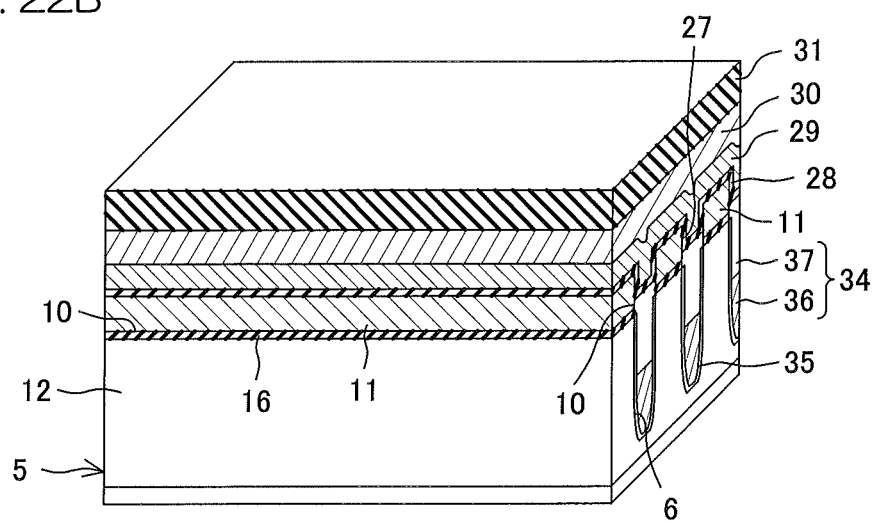
Figure 23A:
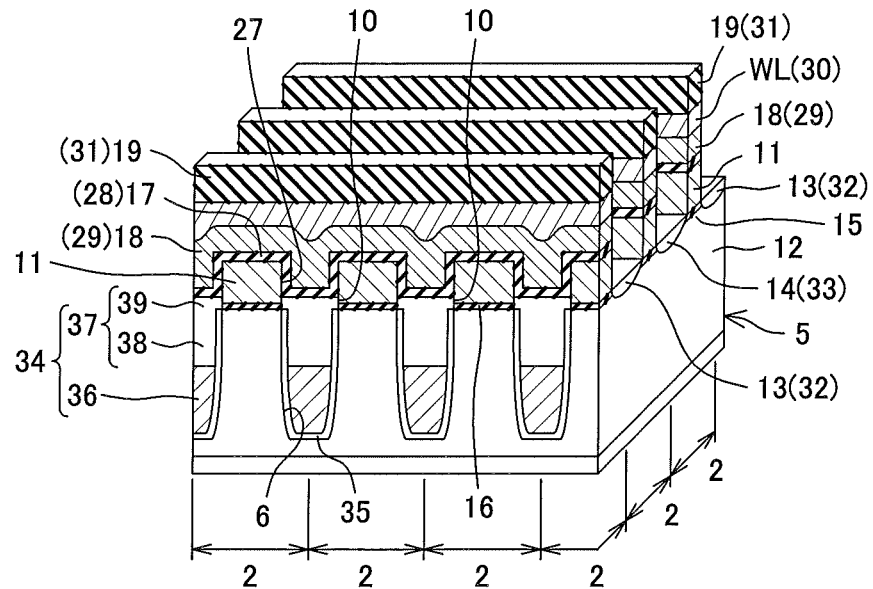
Figure 23B:
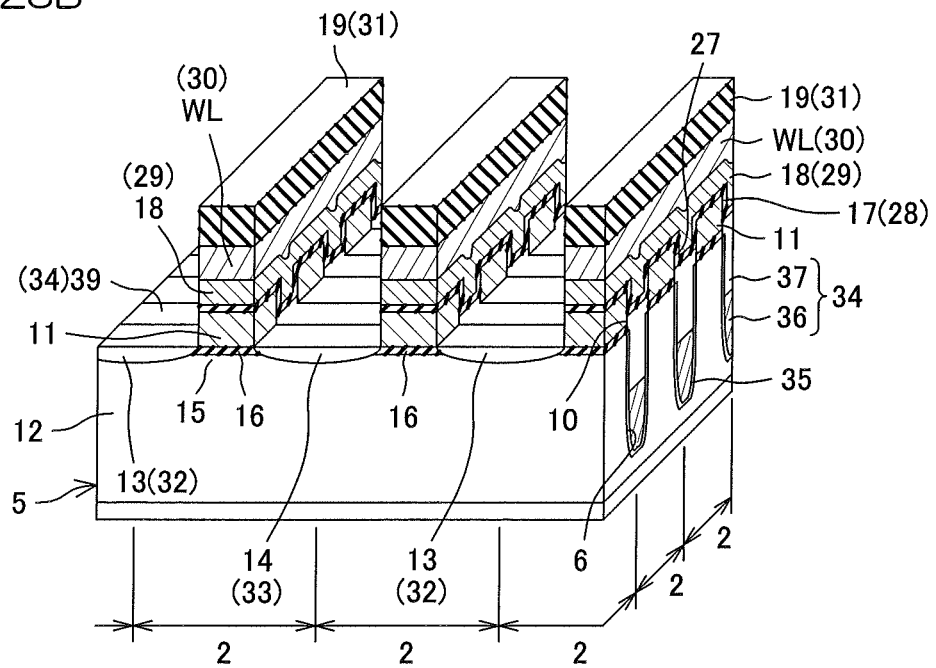
Figure 24A:
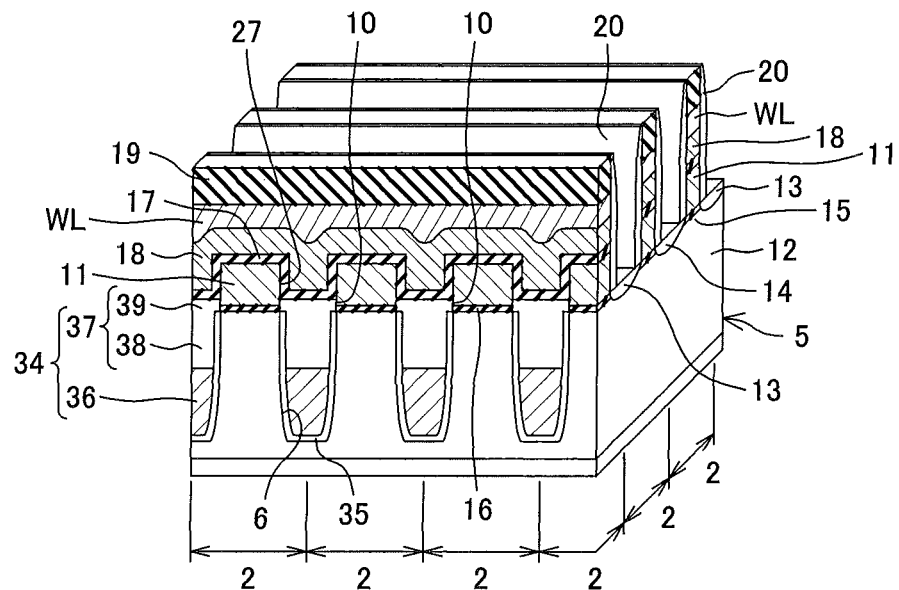
Figure 24B:
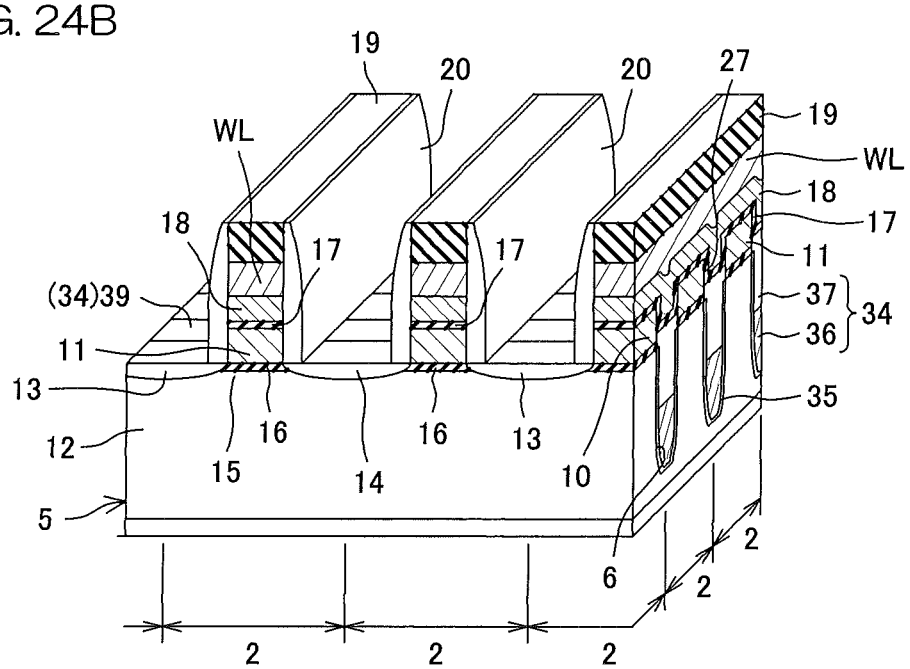
Figure 25A:
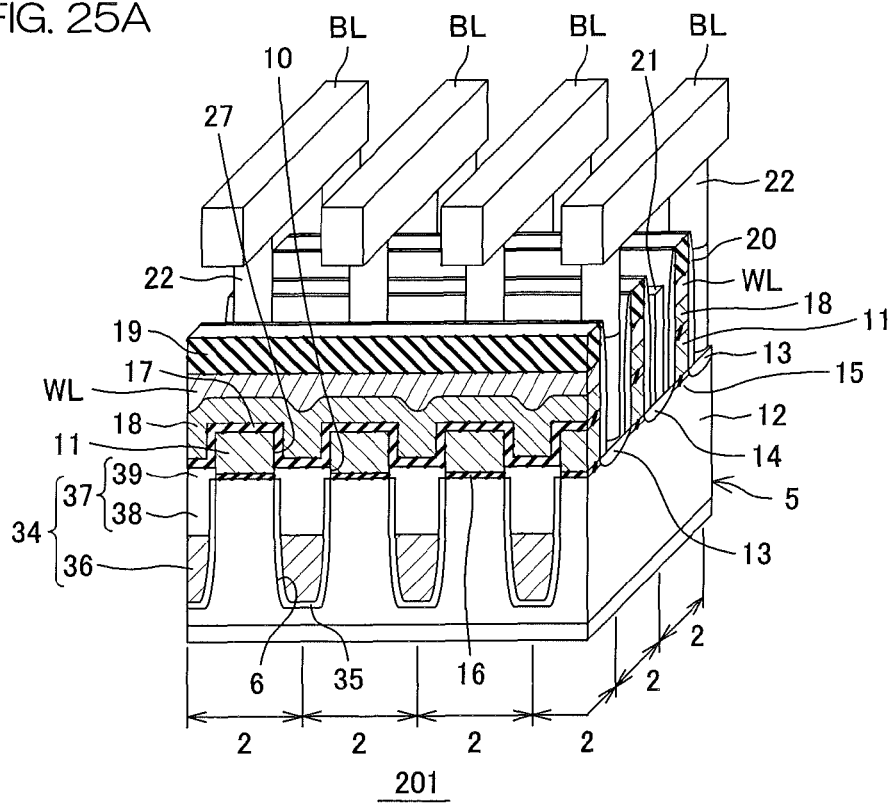
Figure 25B:
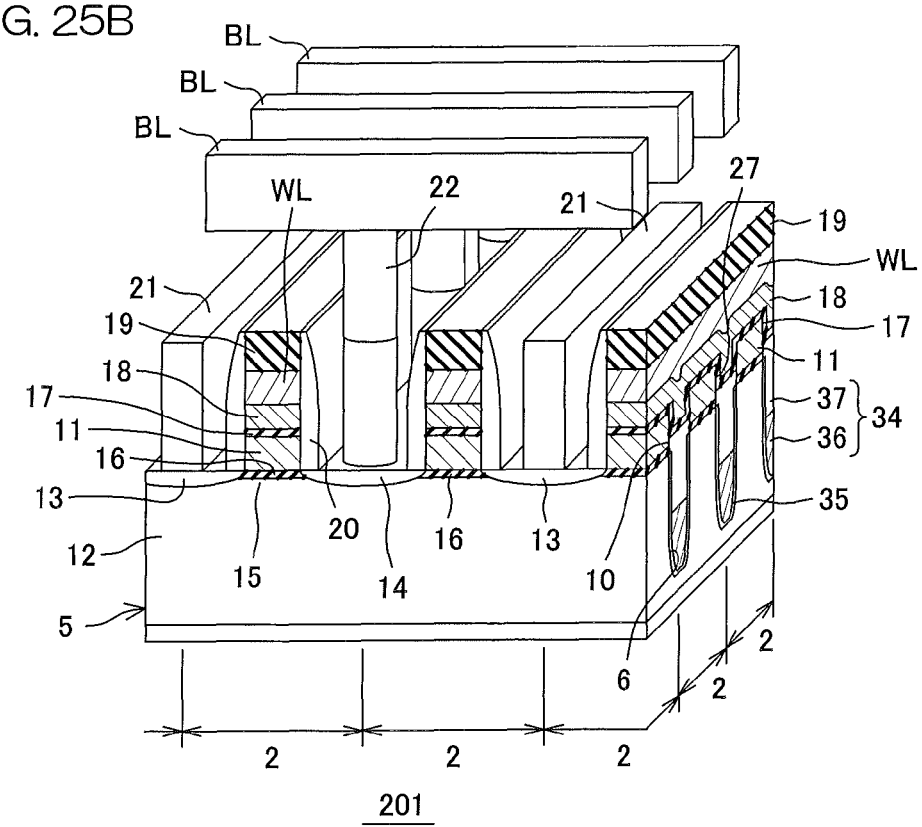

Next, as shown in FIGS. 18A and 18B, as a result of the hard mask 24 being removed, the projecting portions 39 of the second material layer 37 (buried film 34) are exposed in a projecting state. Accordingly, active regions 10 formed of recesses surrounded by said projecting portions 39 are formed at the positions where the hard mask 24 used to be. Subsequently, as a result of n-type impurity ions being doped into the semiconductor substrate 5, an n-type well 12 is formed.

Thereafter, as shown in FIGS. 19A and 19B to FIGS. 25A to 25B, as a result of the same steps as those in FIGS. 7A and 7B to FIGS. 13A to 13B being performed, the semiconductor device 201 shown in FIGS. 14A and 14B is obtained.

In the semiconductor device 201 manufactured by the method mentioned above, for the trenches 6 formed in the semiconductor substrate 5, the first material layer 36 is buried up to the halfway portion in the depth direction thereof. Therefore, the aspect ratio of the trenches 6 into which the second material layer 37 needs to be buried can be made lower than the aspect ratio of the trenches 6 when the first material layer 36 is buried.

That is, even if with any aspect ratio the trenches 6 are formed, the aspect ratio of the trenches 6 when the second material layer 37 is buried can be adjusted by the first material layer 36.

Also, because the aspect ratio of the part demarcated by the upper face of the first material layer 36 and side faces of the trench 6 above said upper face can be adjusted, the second material layer 37 can be buried in a range where the occurrence of voids can be effectively suppressed. As a result, the occurrence of a leak current in the buried film 34 caused by said voids can be effectively suppressed.

Moreover, because the occurrence of a leak current in the buried film 34 can be effectively suppressed, a highly reliable semiconductor element region can be formed in the region for memory cells 2.

Further, concerning the manufacturing process, the effects described in the first preferred embodiment mentioned above can also be realized.

Second Reference Example

Figure 27A:
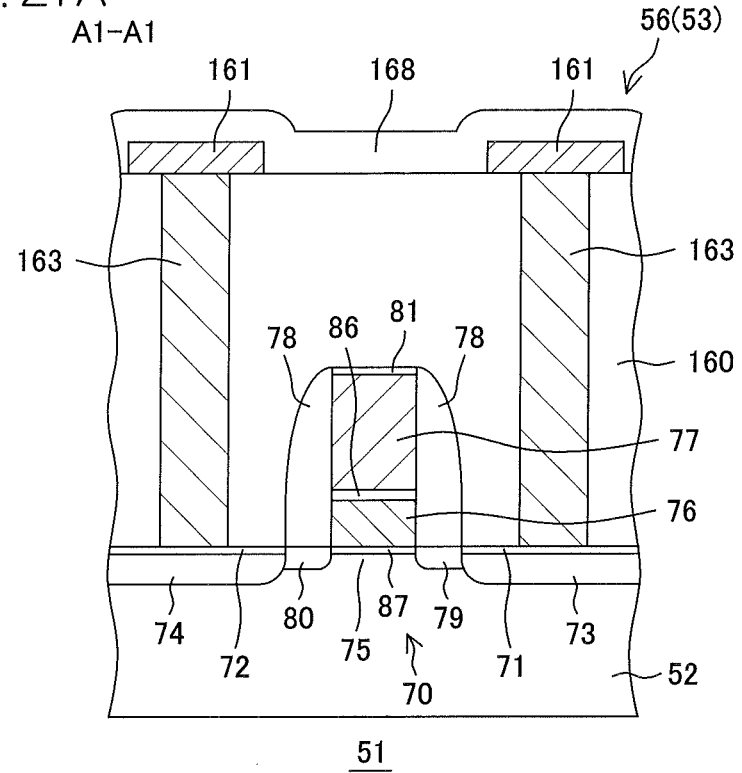
FIGS. 27A and 27B are sectional views taken along respective section lines in FIG. 26A.
Figure 27B:
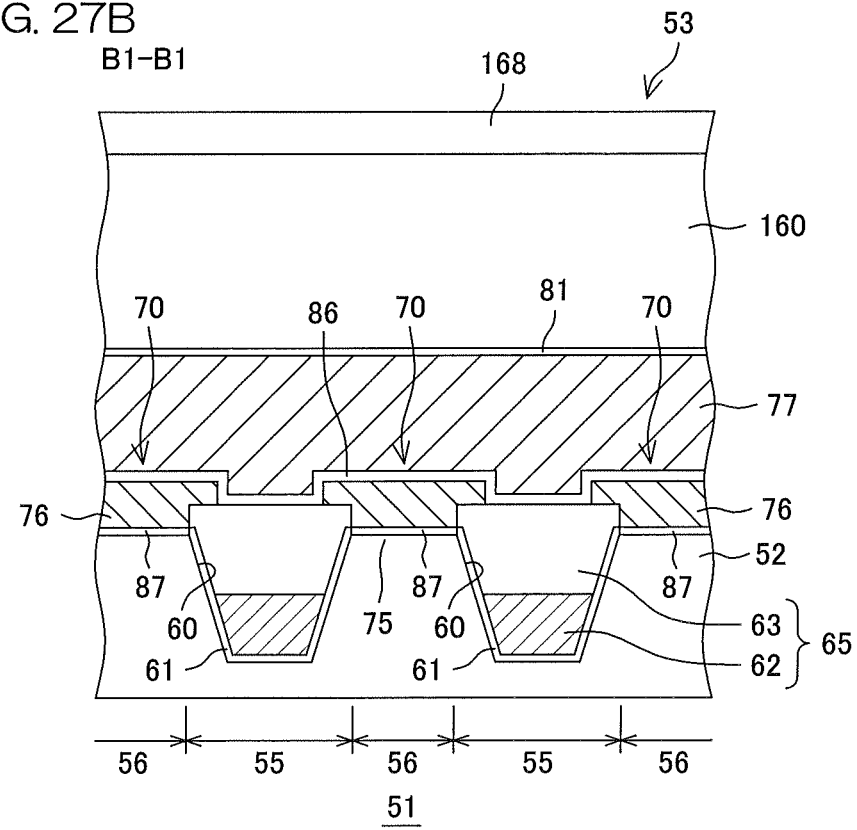
Figure 28A:
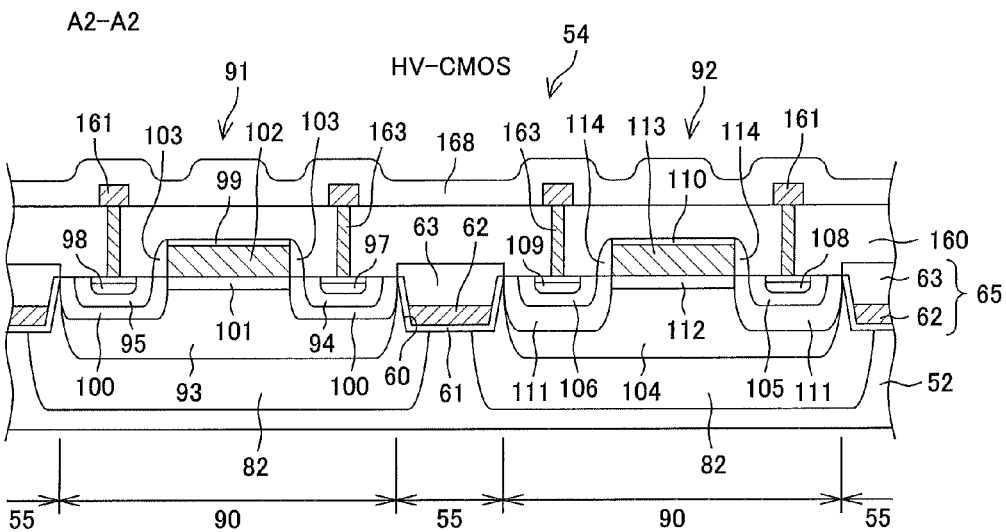
FIGS. 28A and 28B are sectional views taken along respective section lines in FIG. 26B.
Figure 28B:
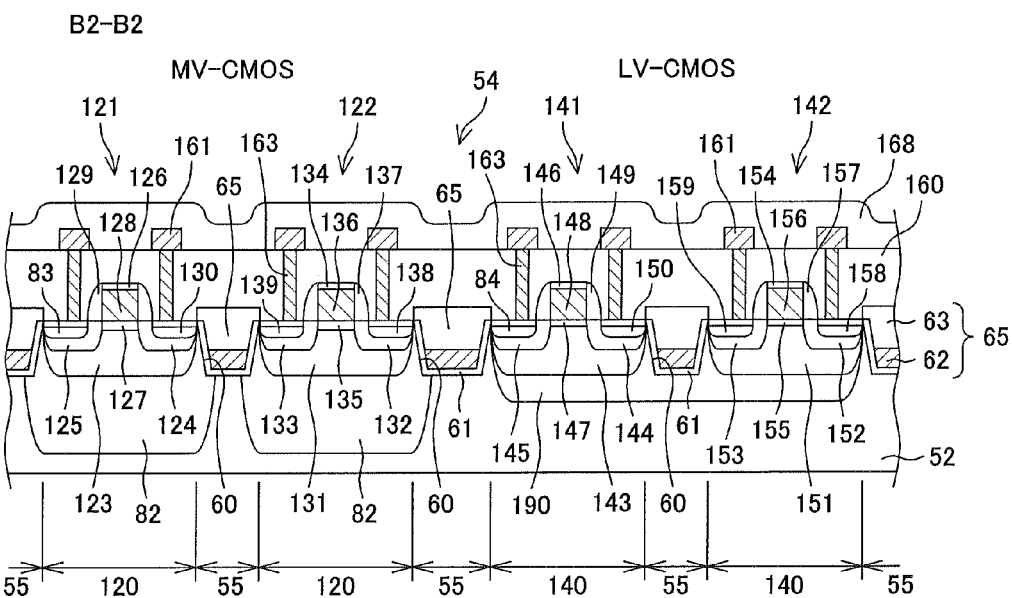
Figure 29A:
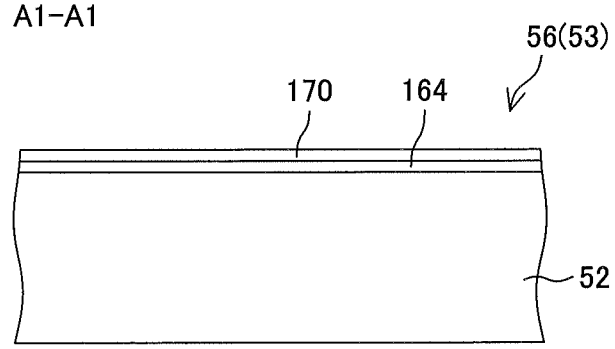
Figure 29B:
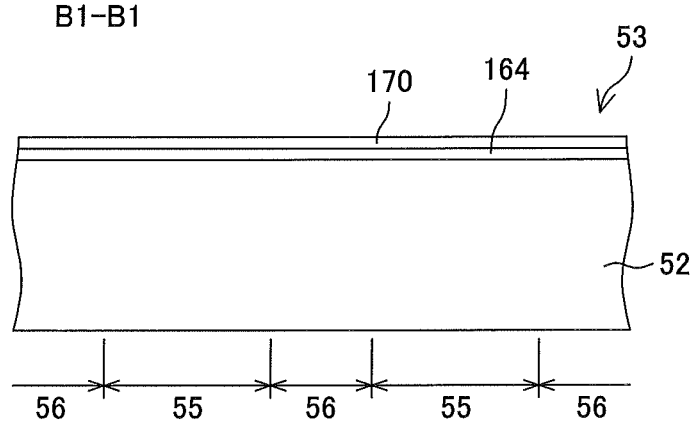
Figure 30A:
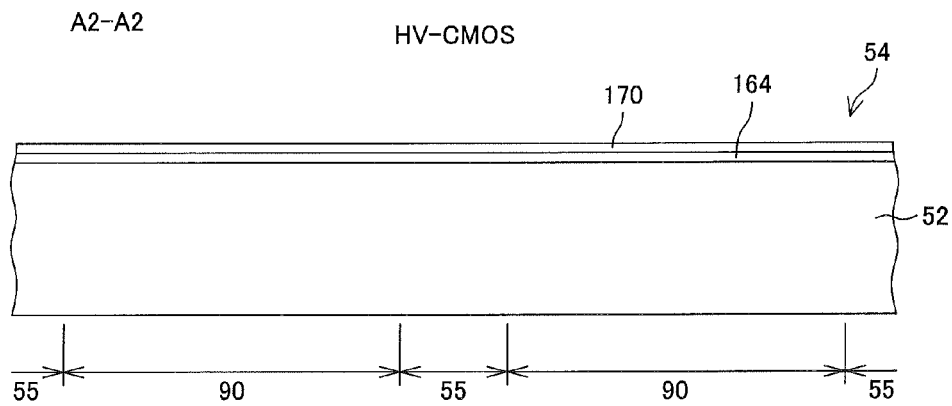
Figure 30B:
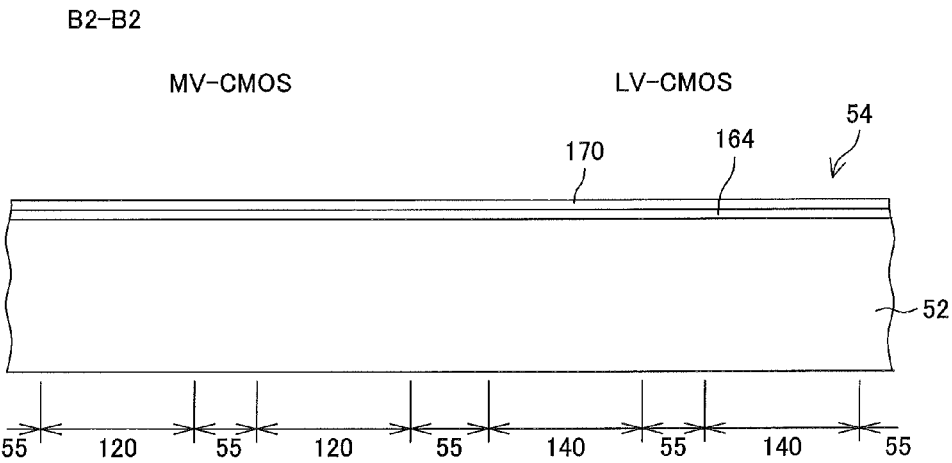
Figure 31A:
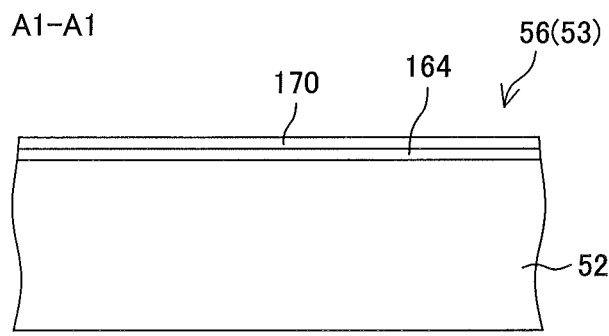
Figure 31B:
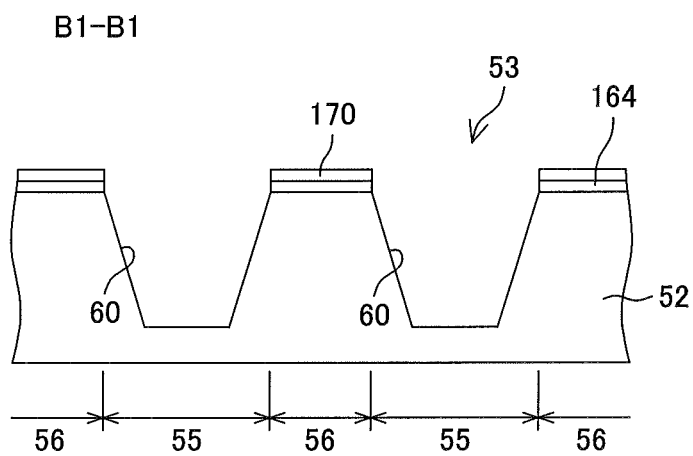
Figure 32A:
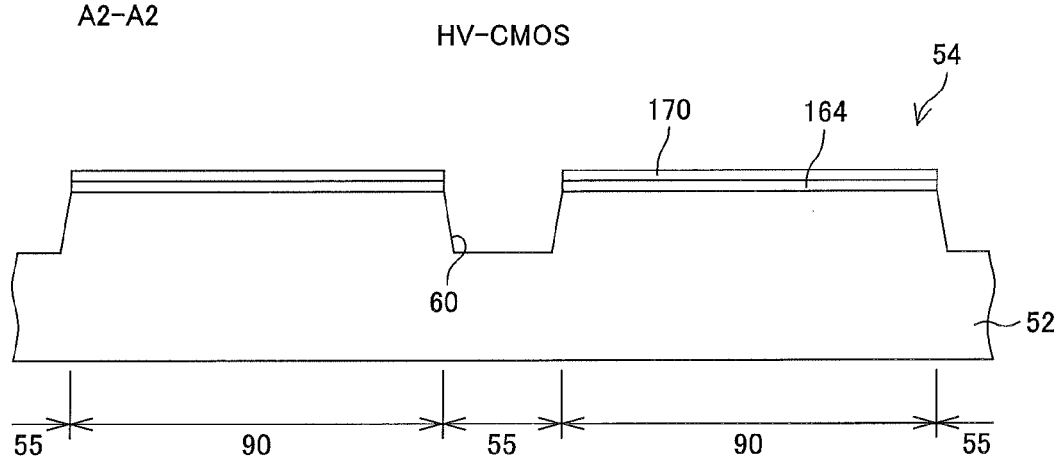
Figure 32B:
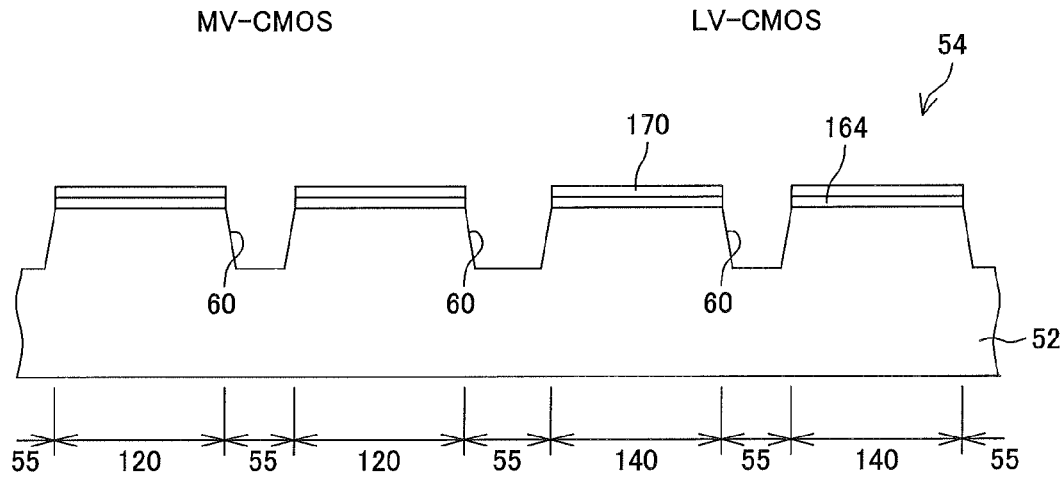
Figure 33A:
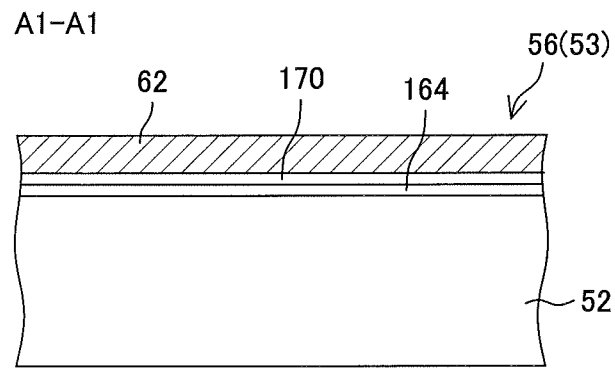
Figure 33B:
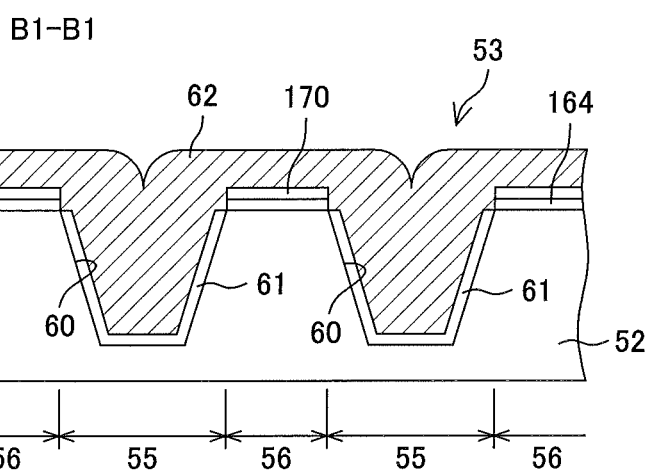
Figure 34A:
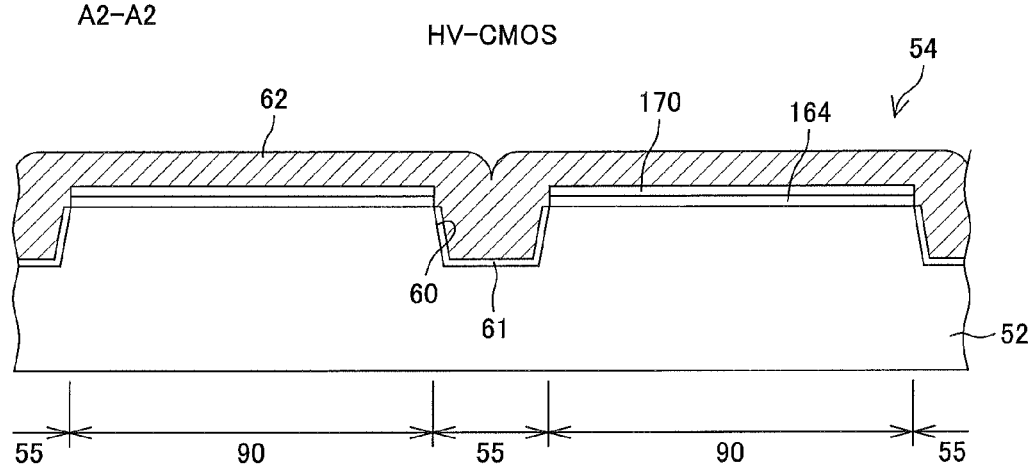
Figure 34B:
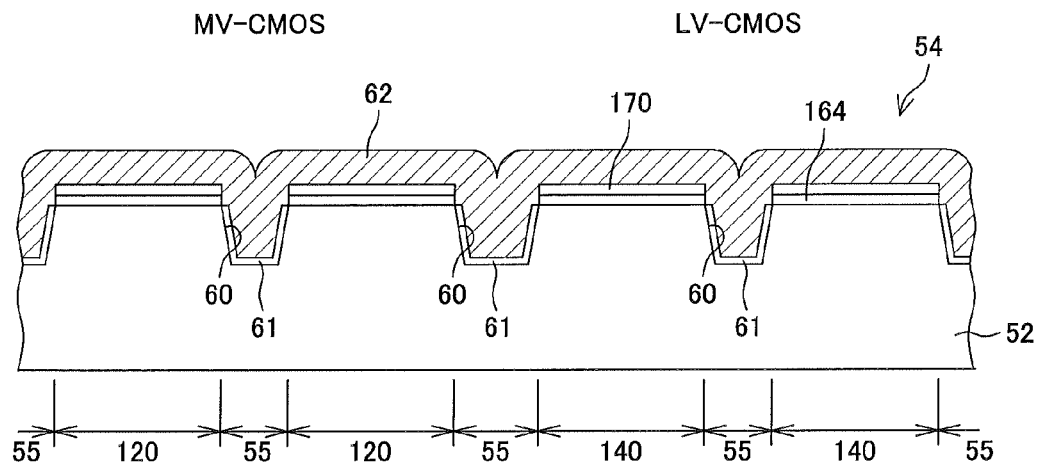
Figure 35A:
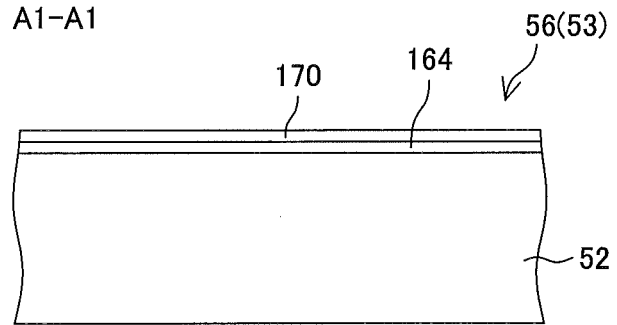
Figure 35B:
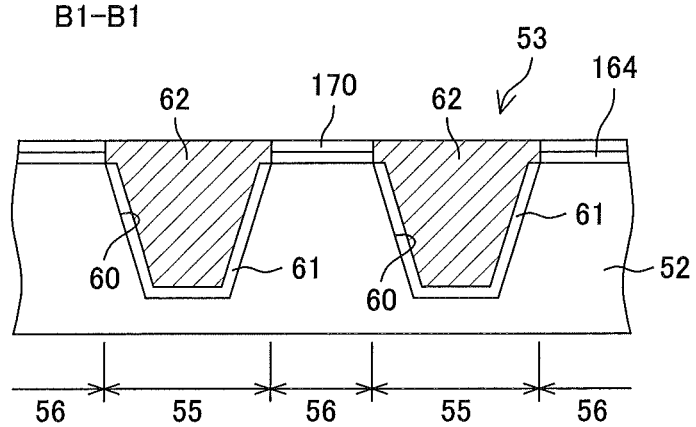
Figure 36A:
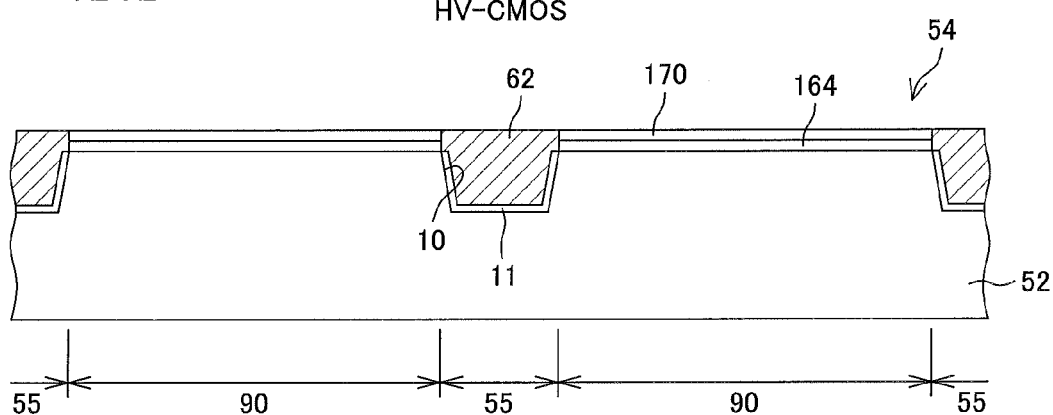
Figure 36B:
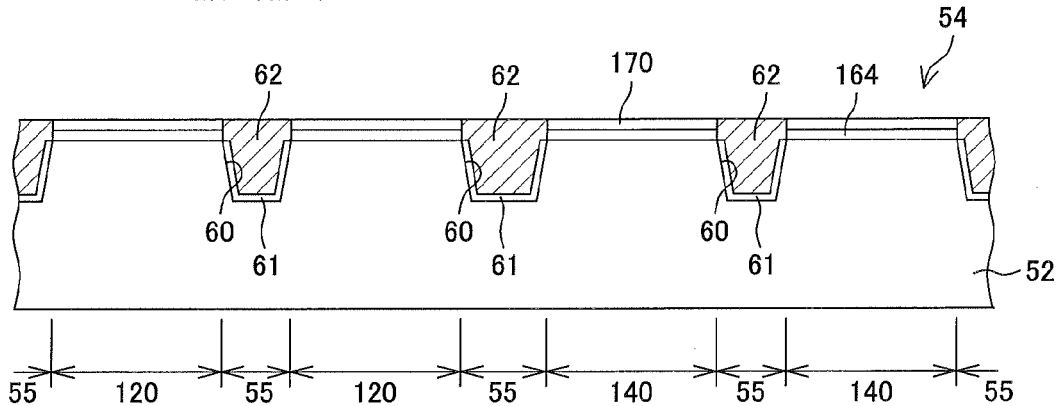
Figure 37A:
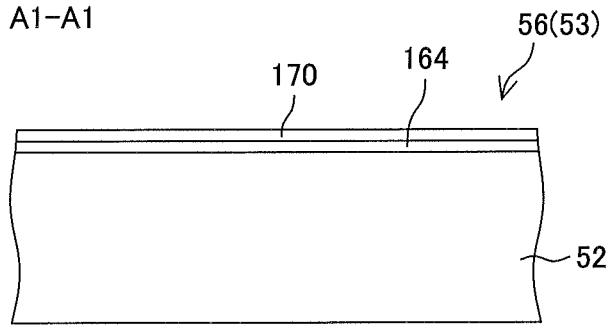
Figure 37B:
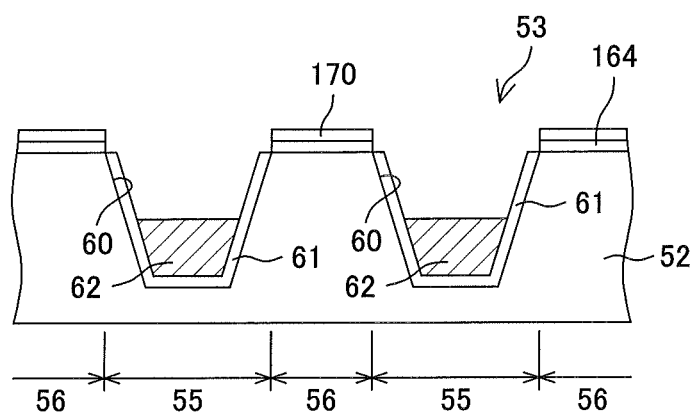
Figure 38A:
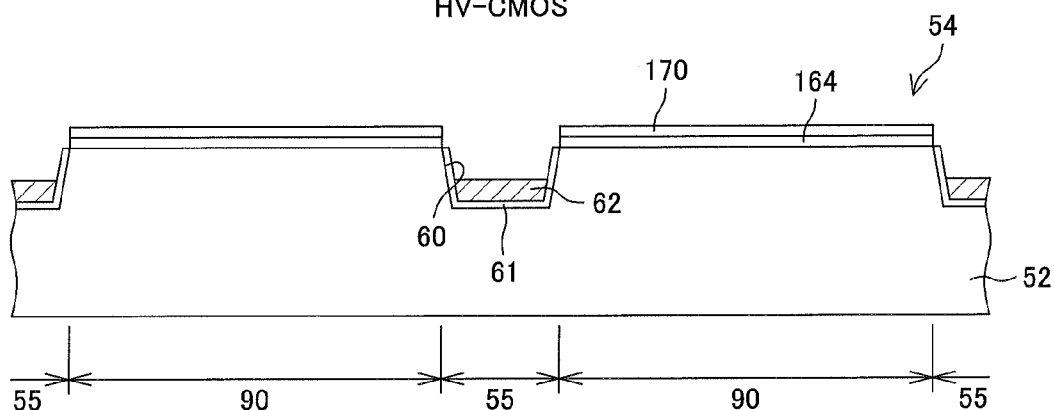
Figure 38B:
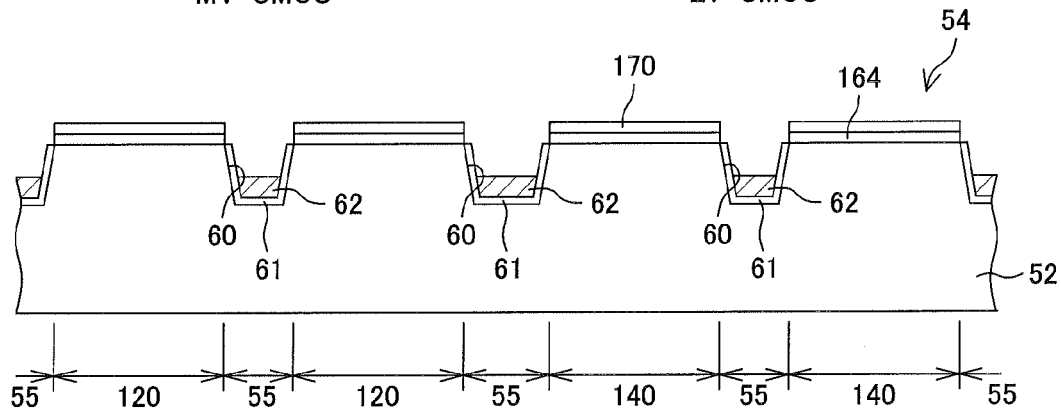
Figure 39A:
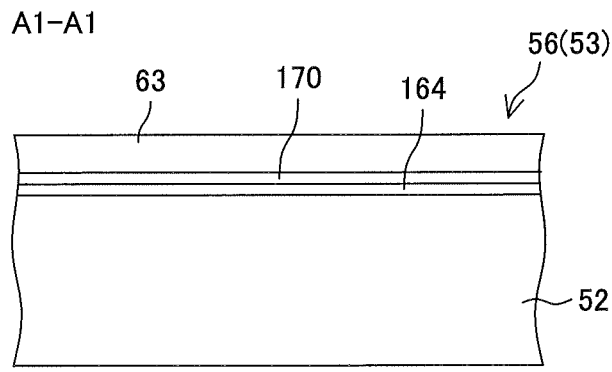
Figure 39B:
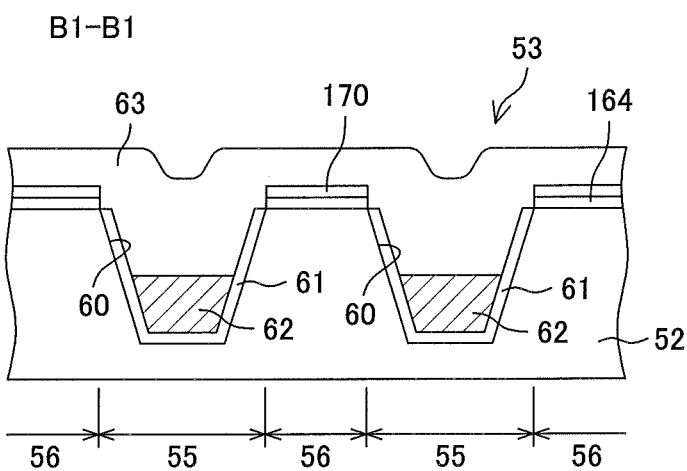
Figure 40A:
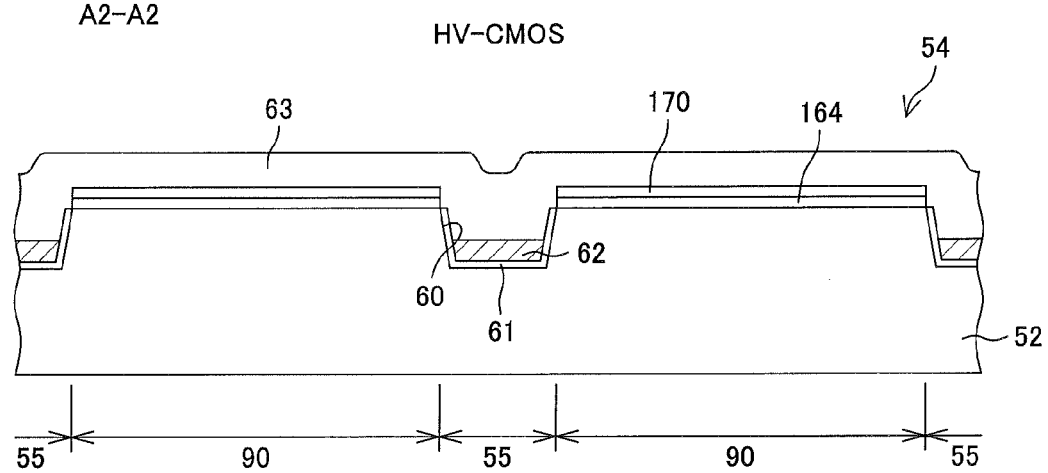
Figure 40B:
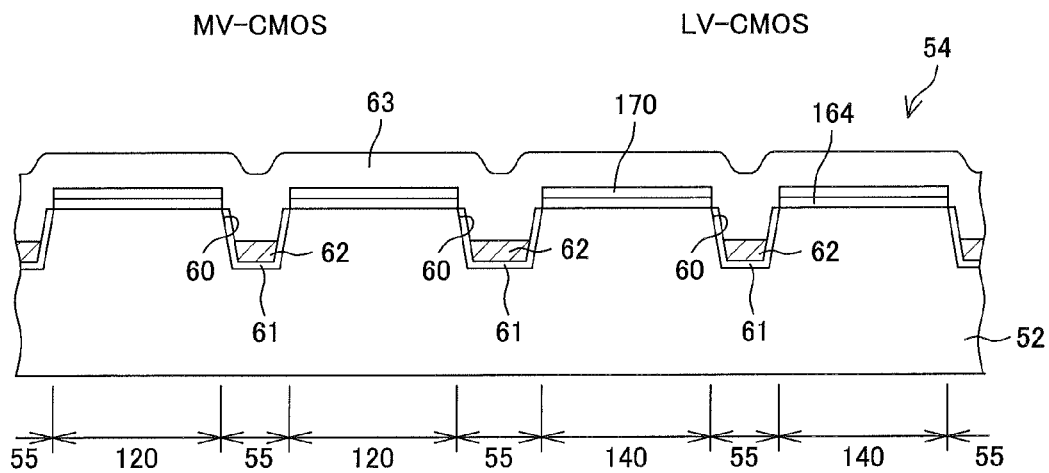
Figure 41A:
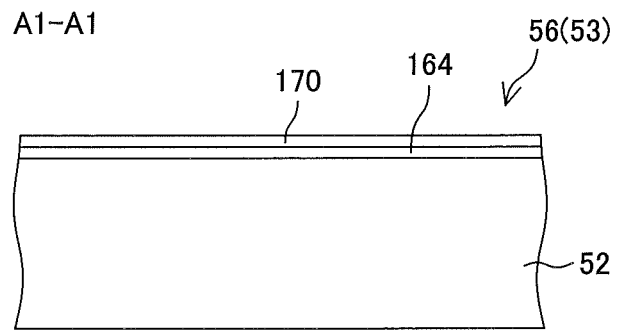
Figure 41B:
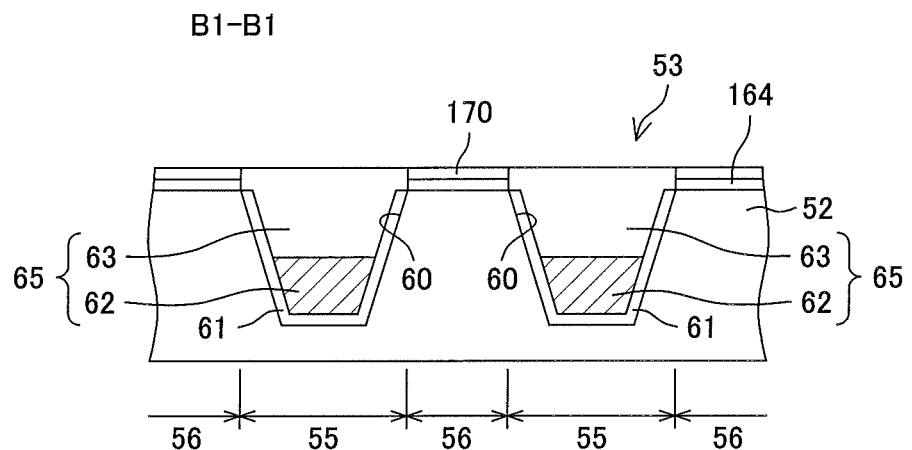
Figure 42A:
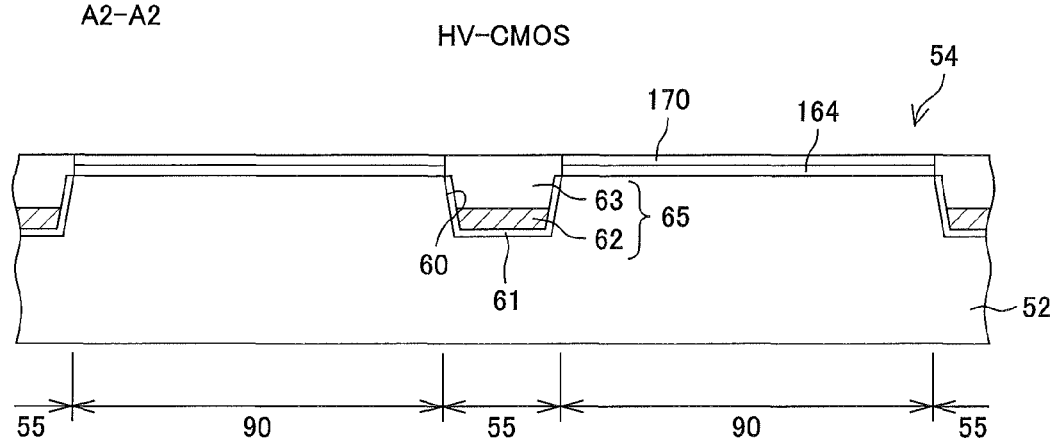
Figure 42B:
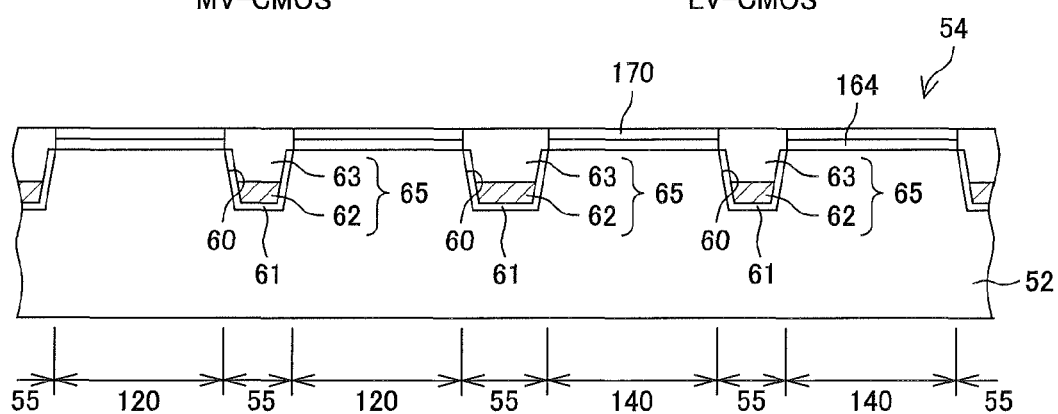
Figure 43A:
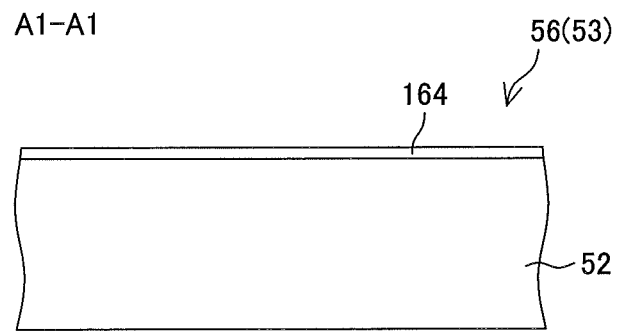
Figure 43B:
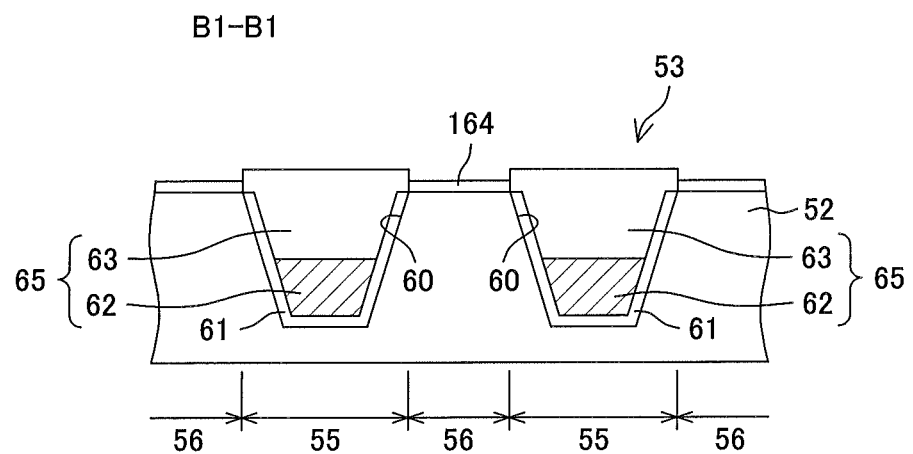
Figure 44A:
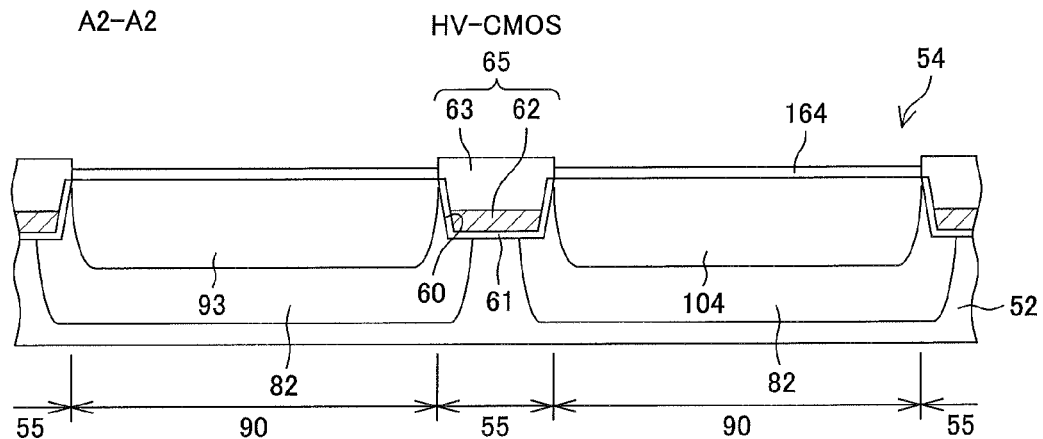
Figure 44B:
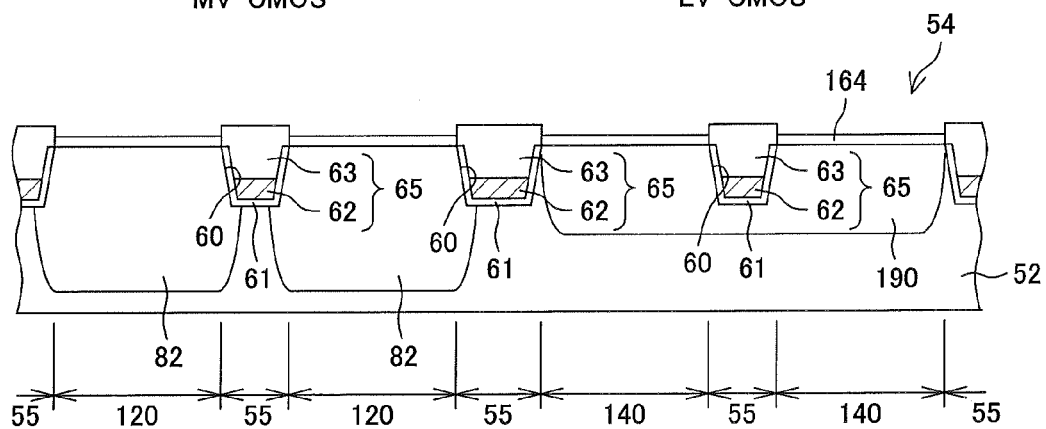
Figure 45A:
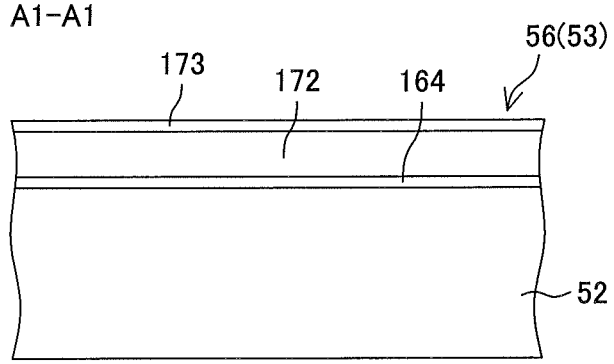
Figure 45B:
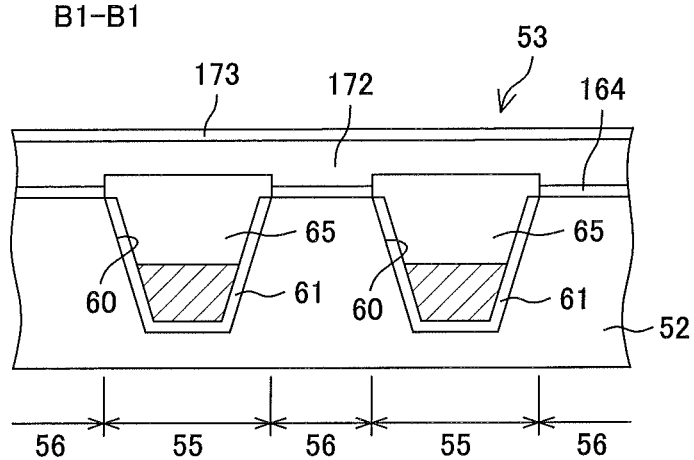
Figure 46A:
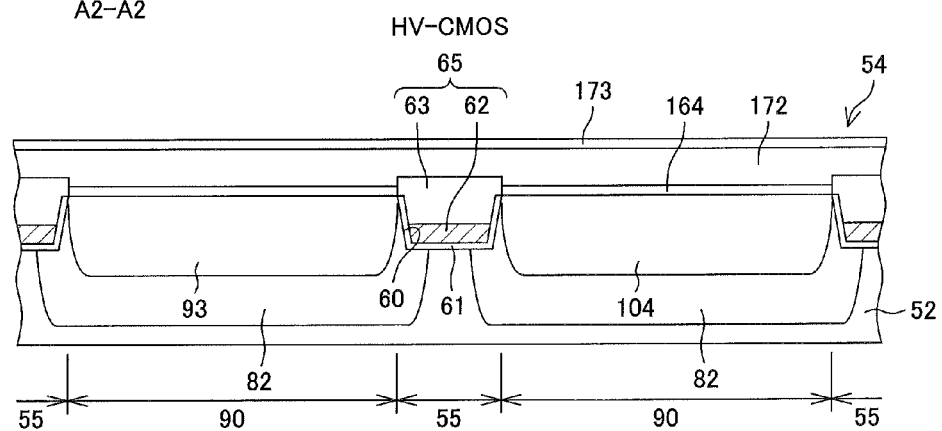
Figure 46B:
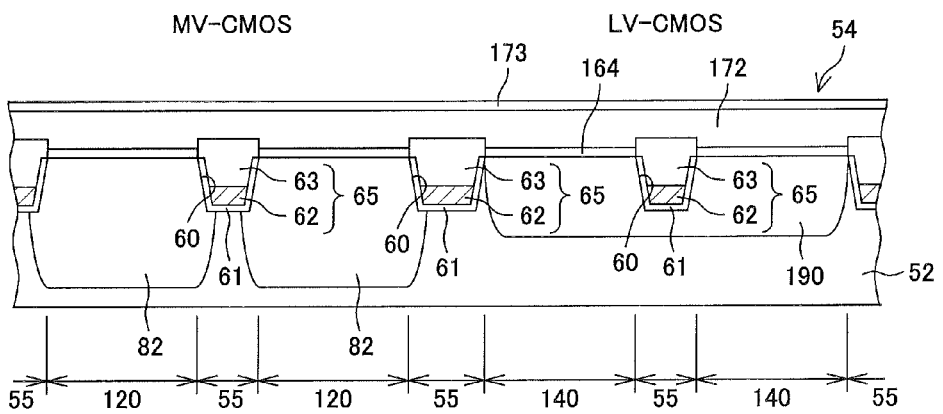
Figure 47A:
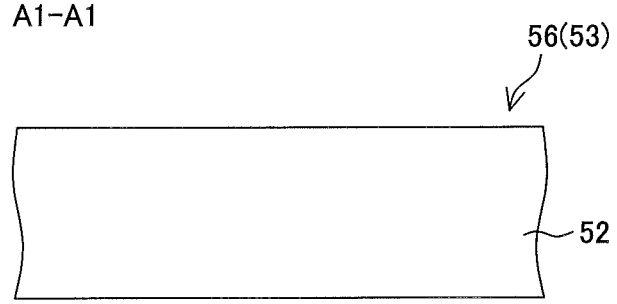
Figure 47B:
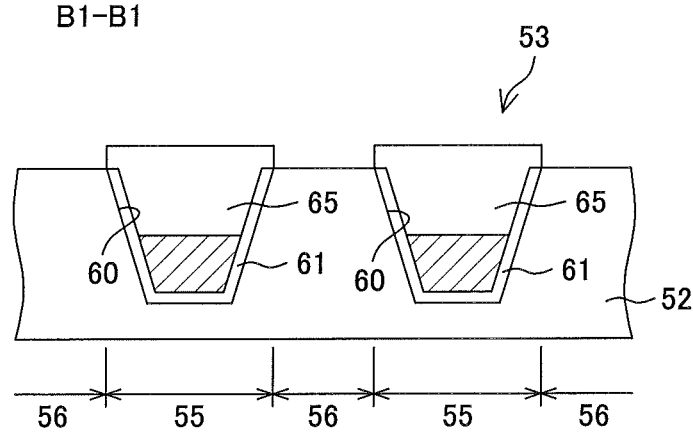
Figure 48A:
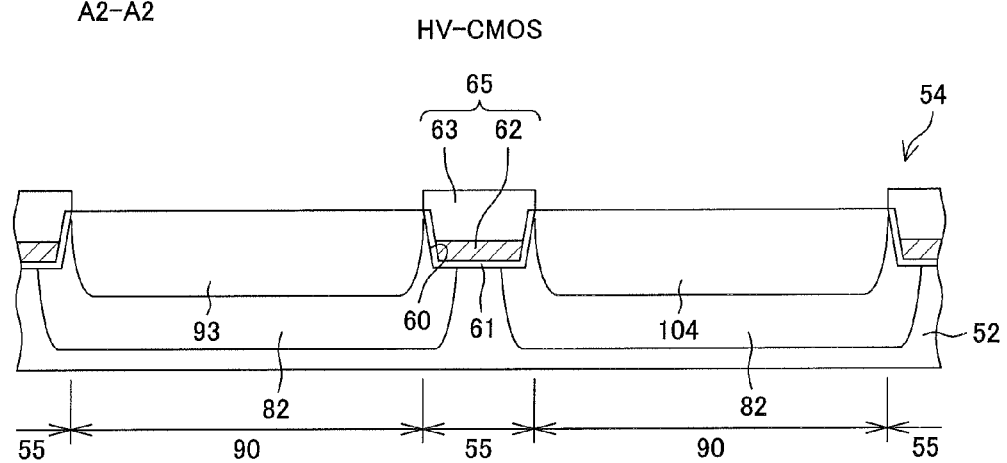
Figure 48B:
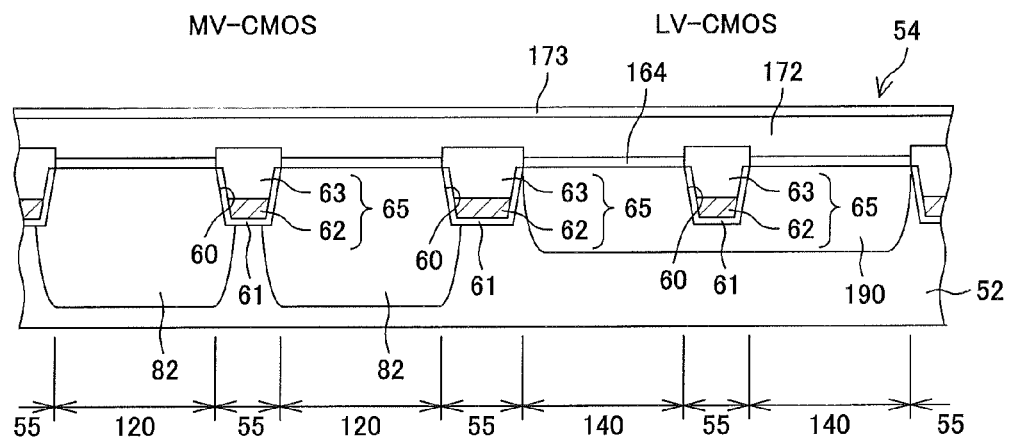
Figure 49A:
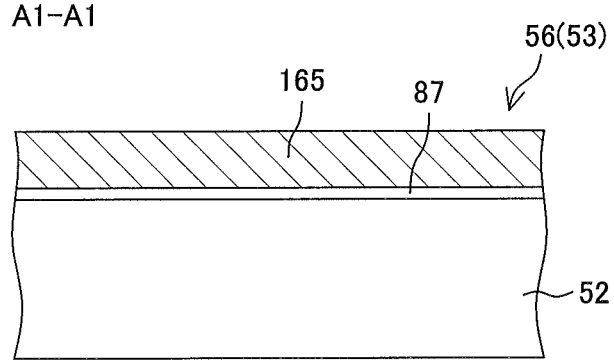
Figure 49B:
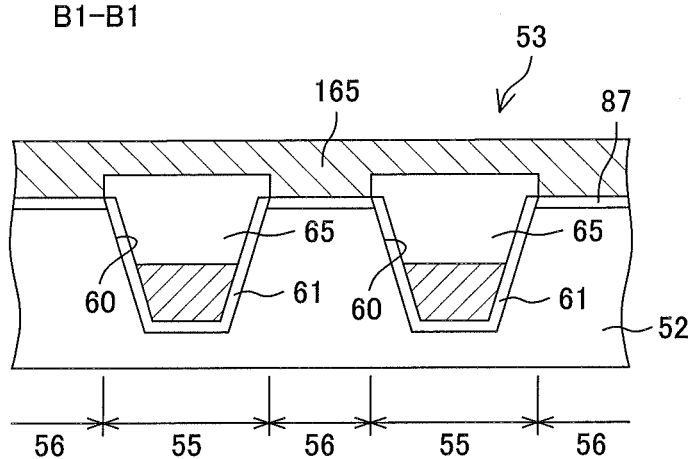
Figure 50A:
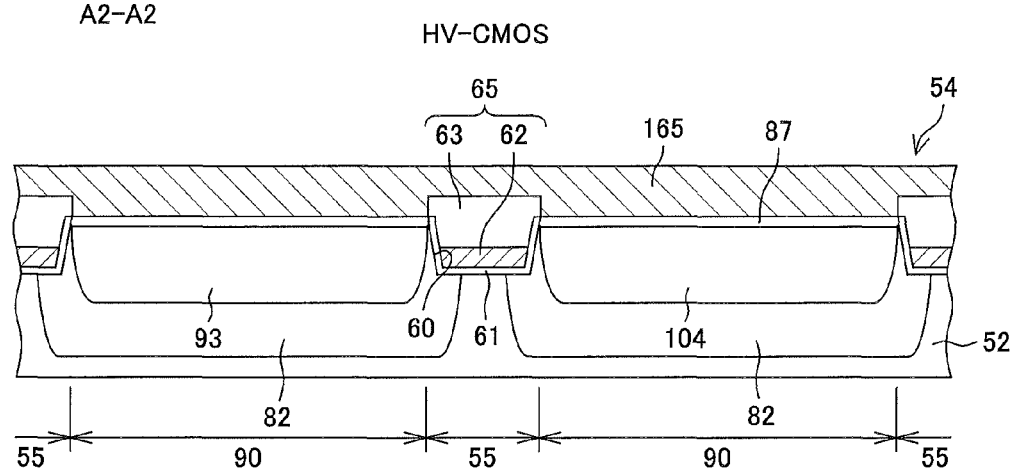
Figure 50B:
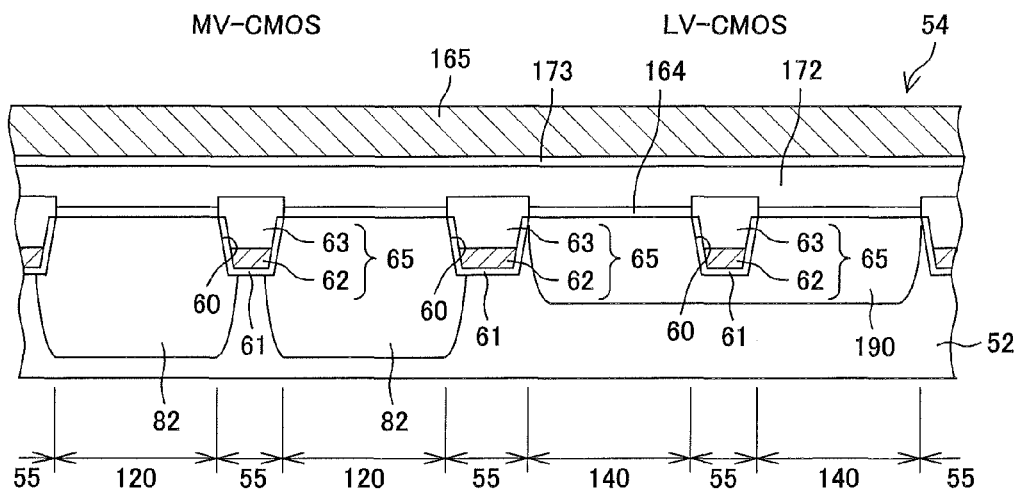
Figure 51A:
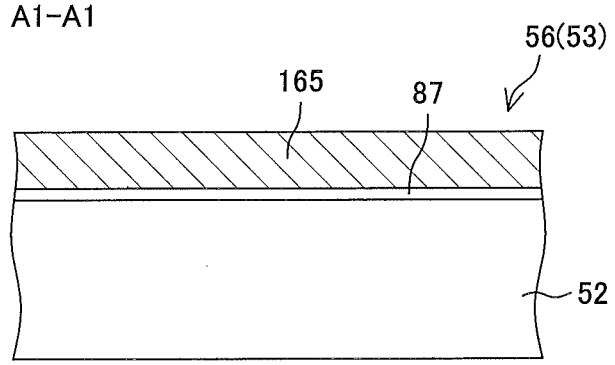
Figure 51B:
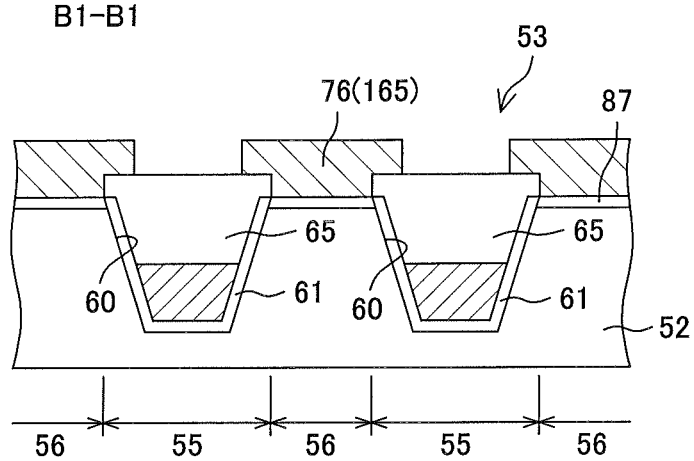
Figure 52A:
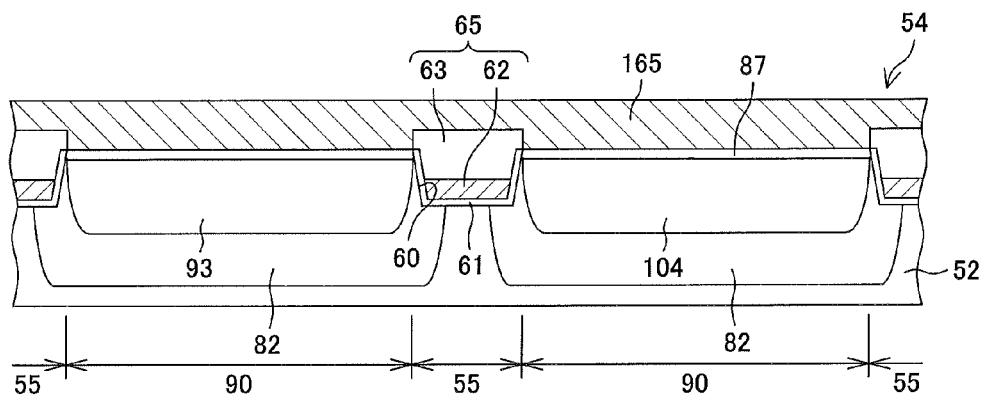
Figure 52B:
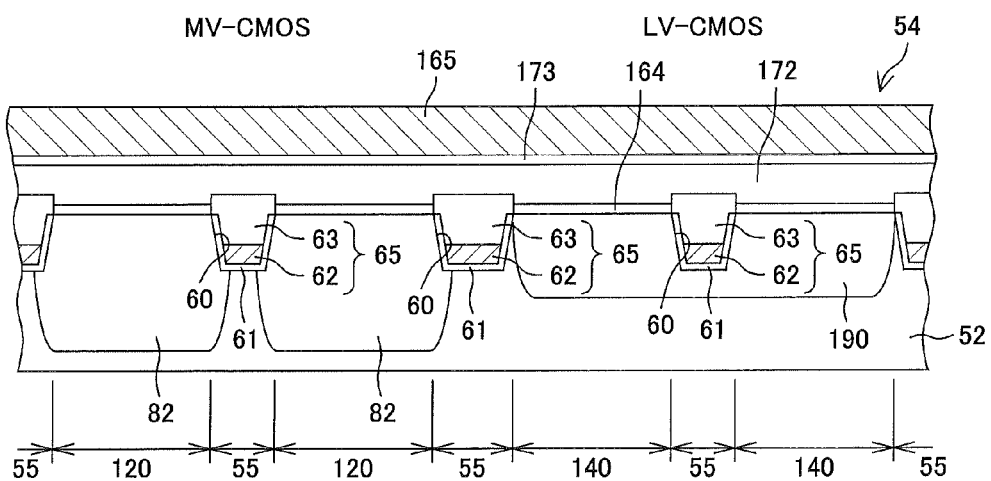
Figure 53A:
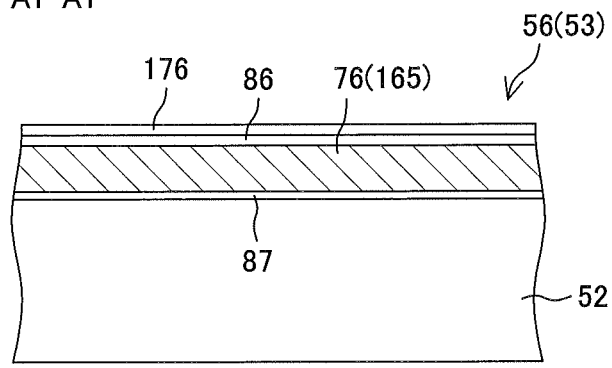
Figure 53B:
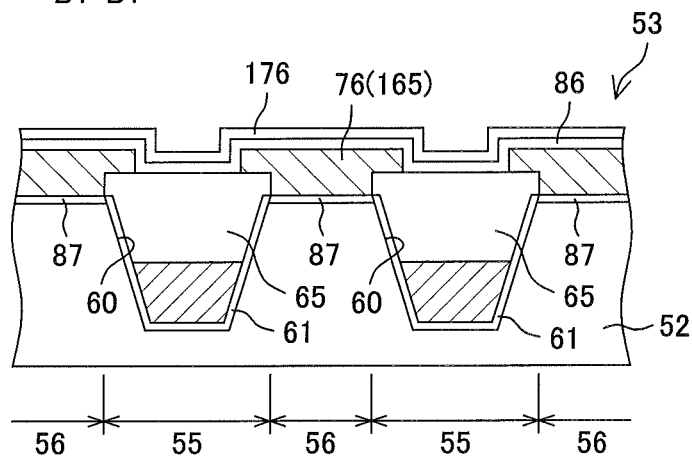
Figure 54A:
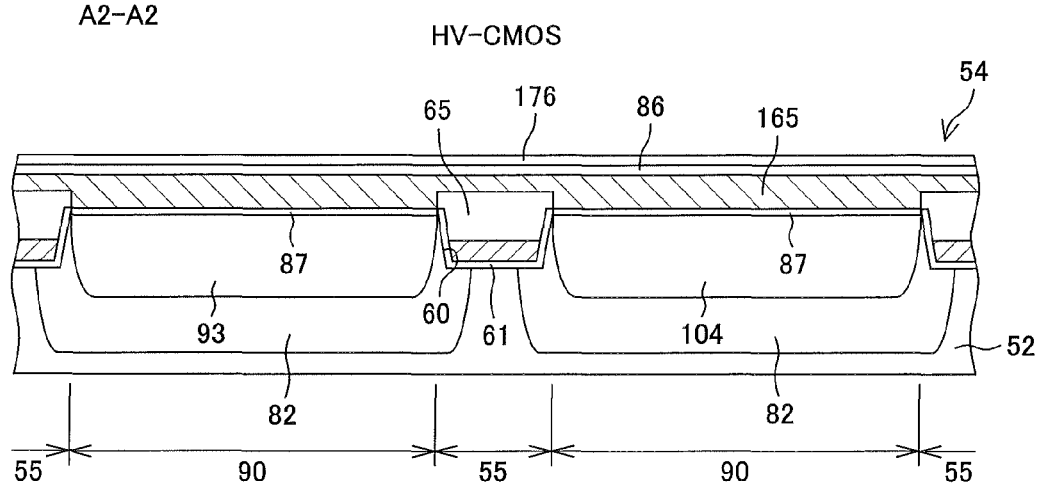
Figure 54B:
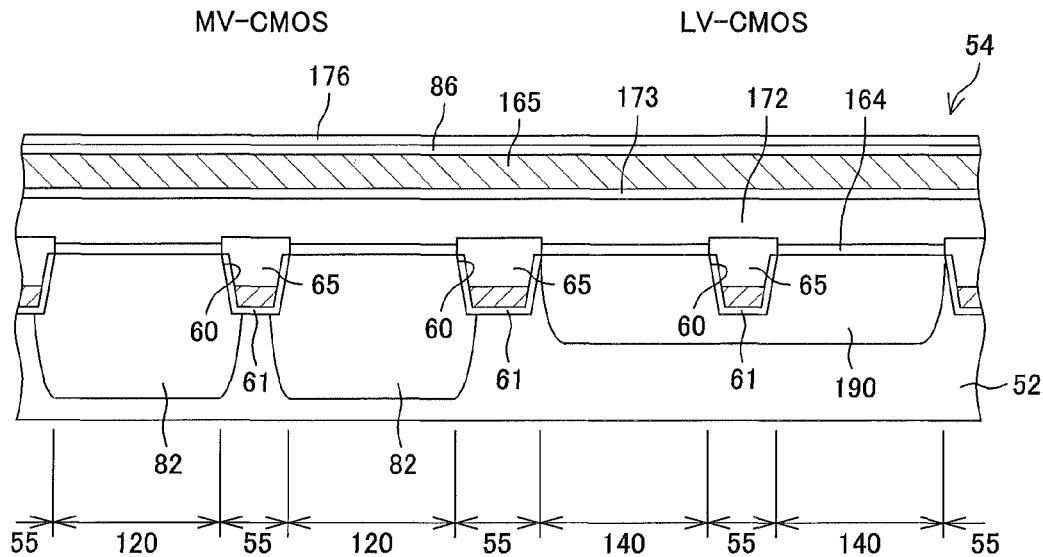
Figure 55A:
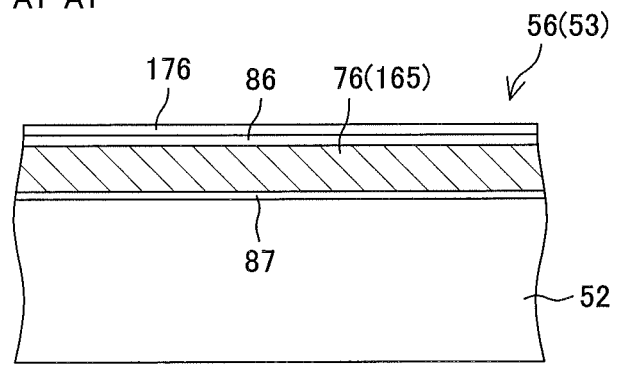
Figure 55B:
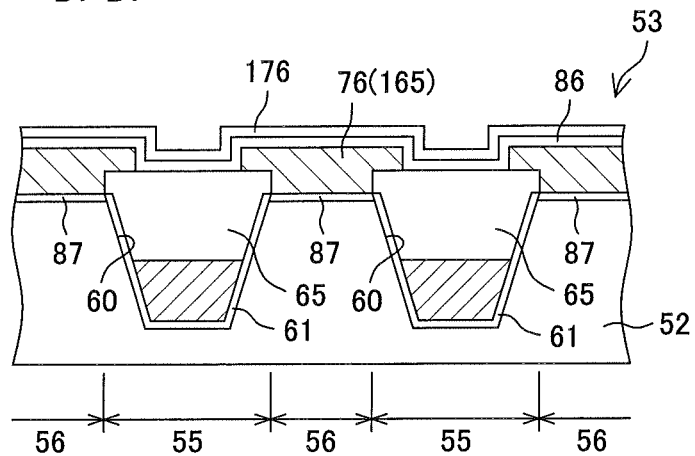
Figure 56A:
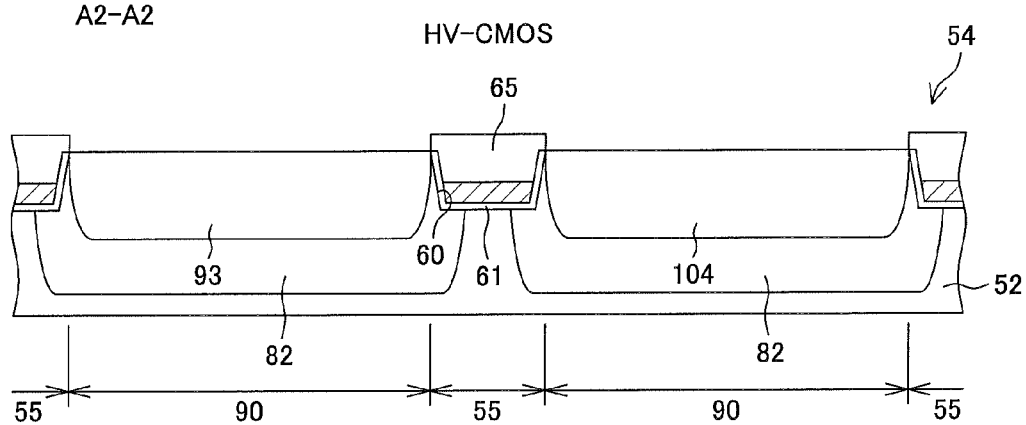
Figure 56B:
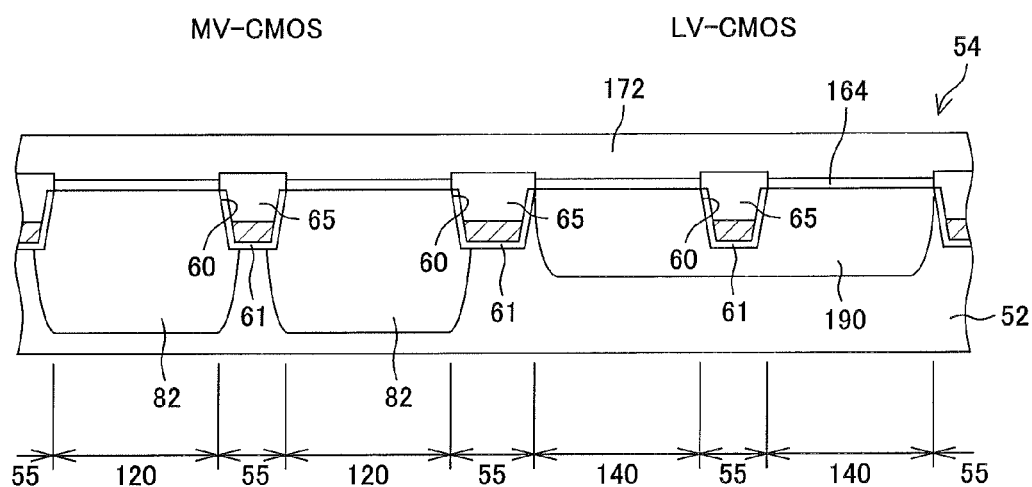
Figure 57A:
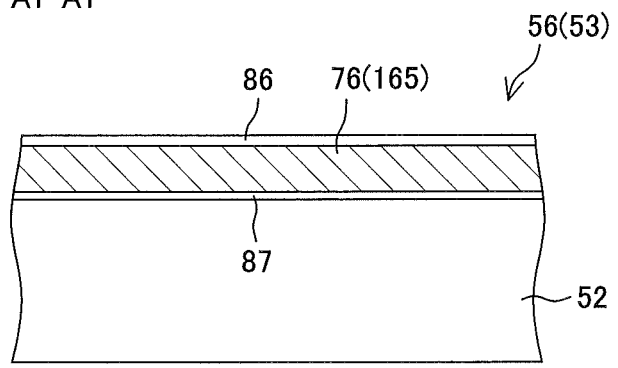
Figure 57B:
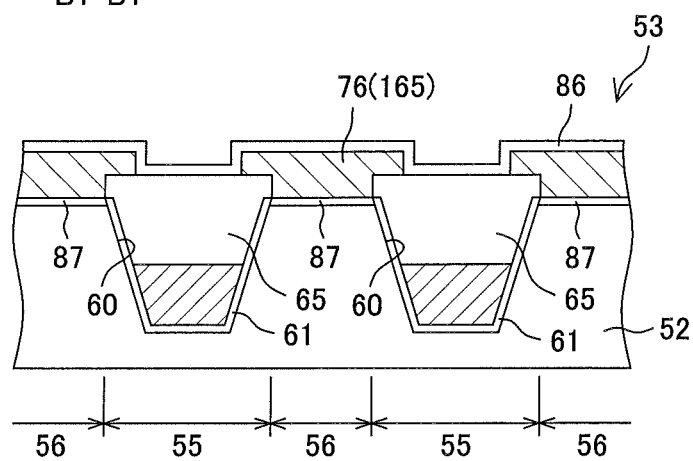
Figure 58A:
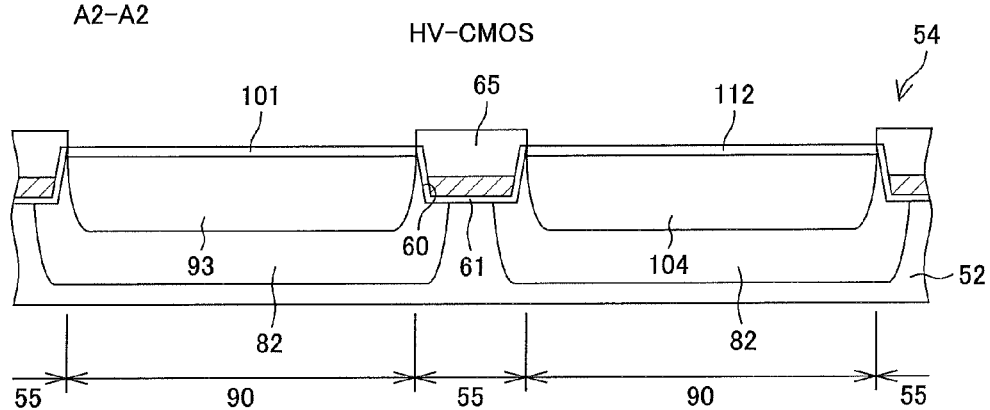
Figure 58B:
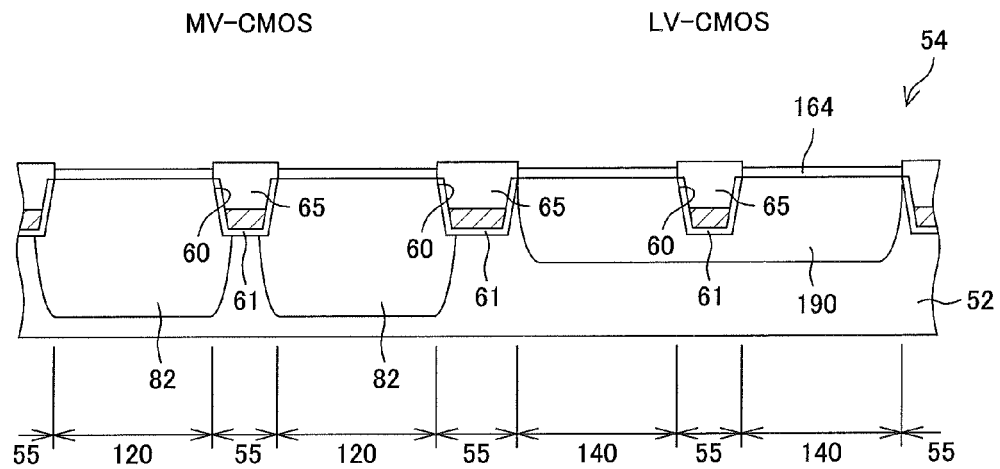
Figure 59A:
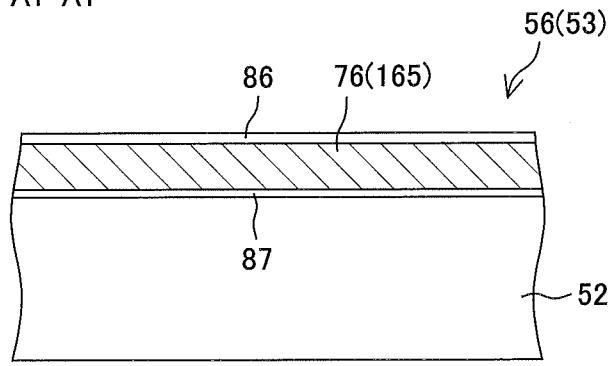
Figure 59B:
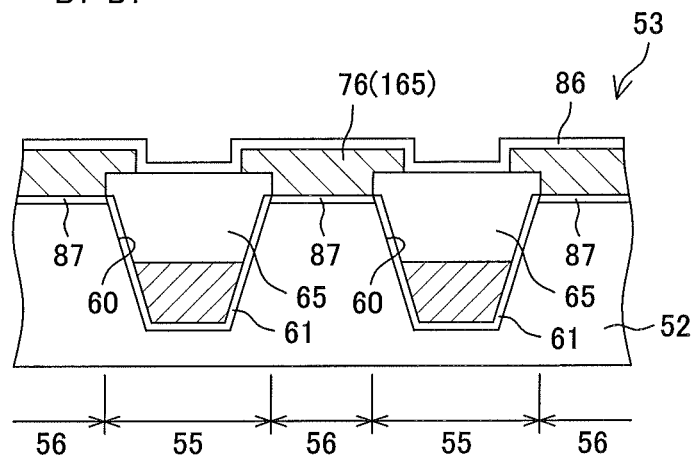
Figure 60A:
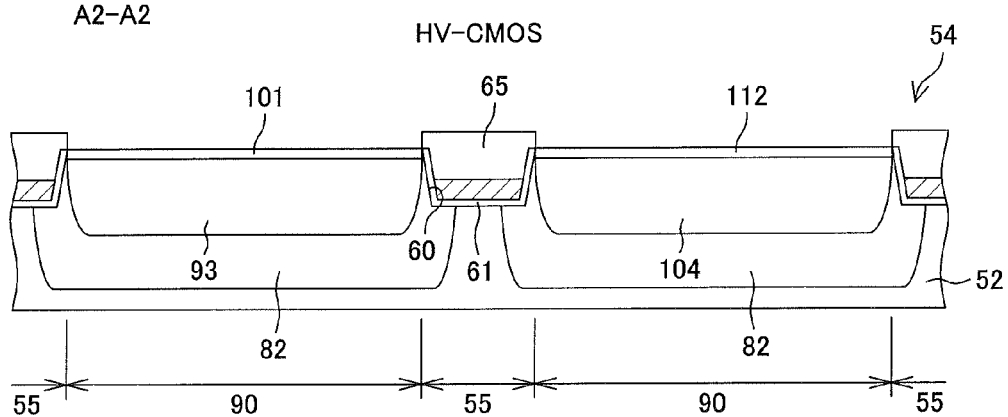
Figure 60B:
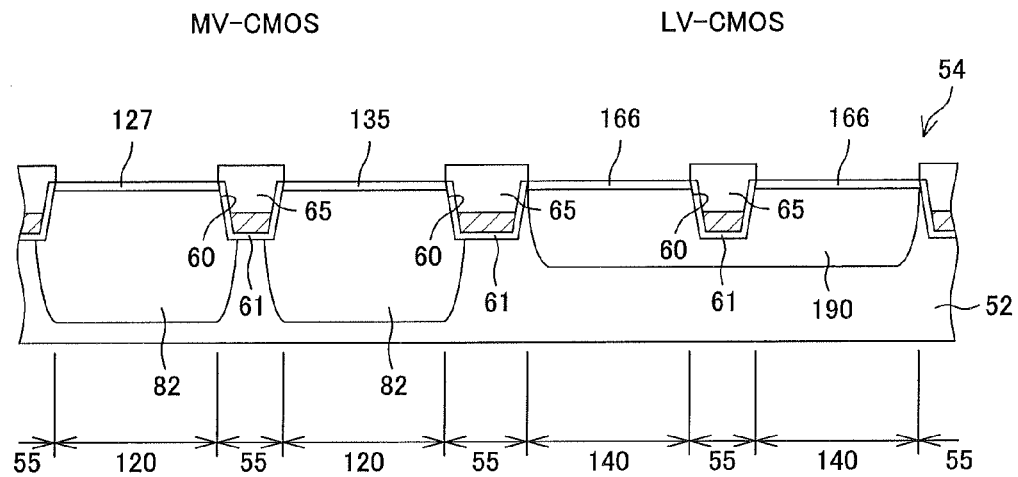
Figure 61A:
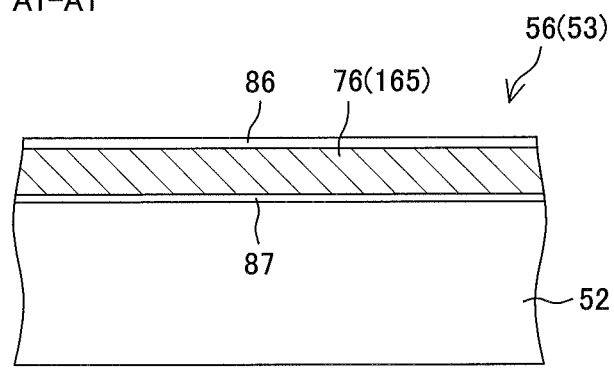
Figure 61B:
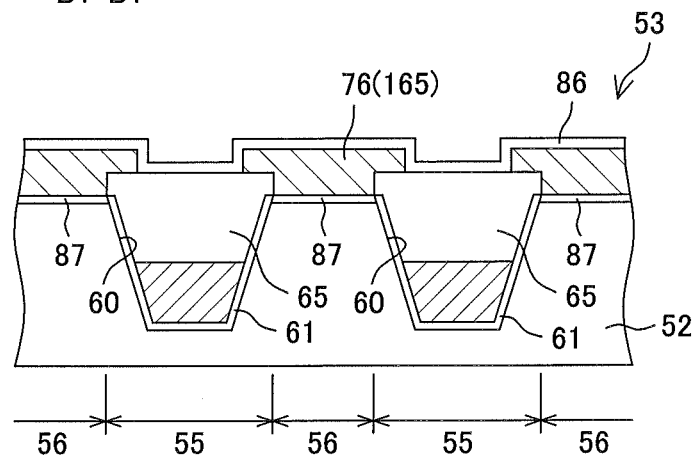
Figure 62A:
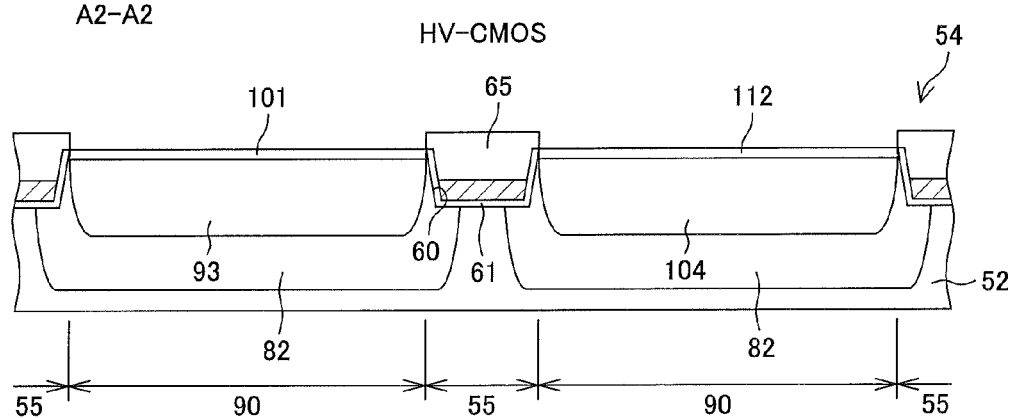
Figure 62B:
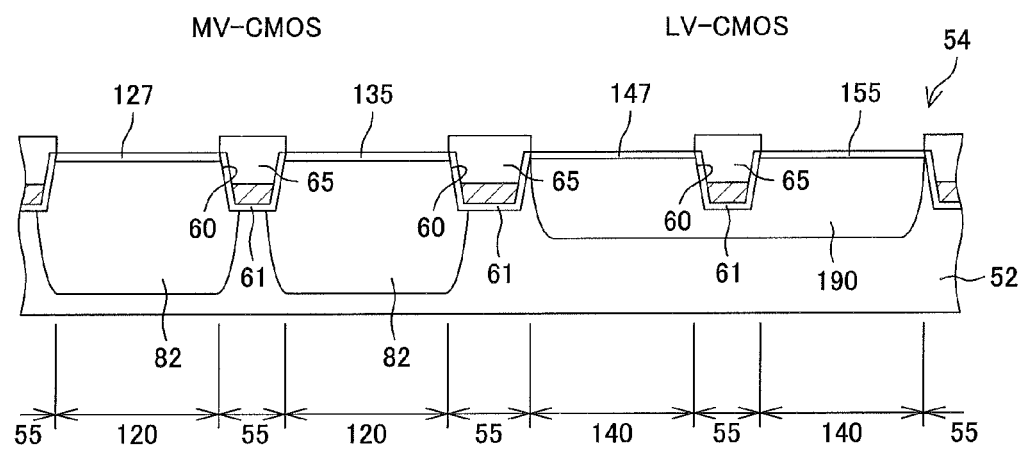
Figure 63A:
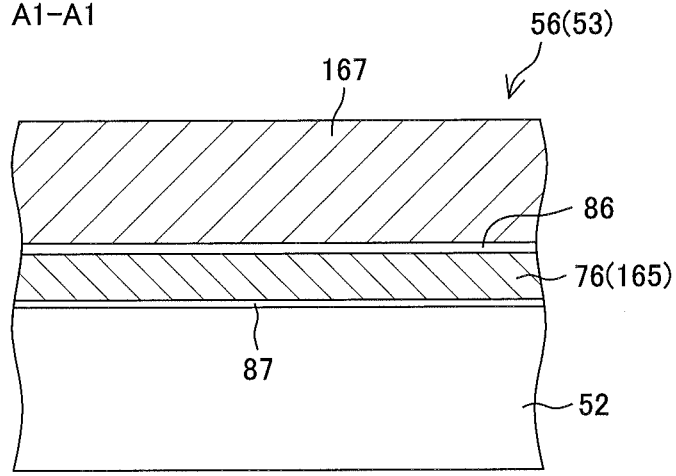
Figure 63B:
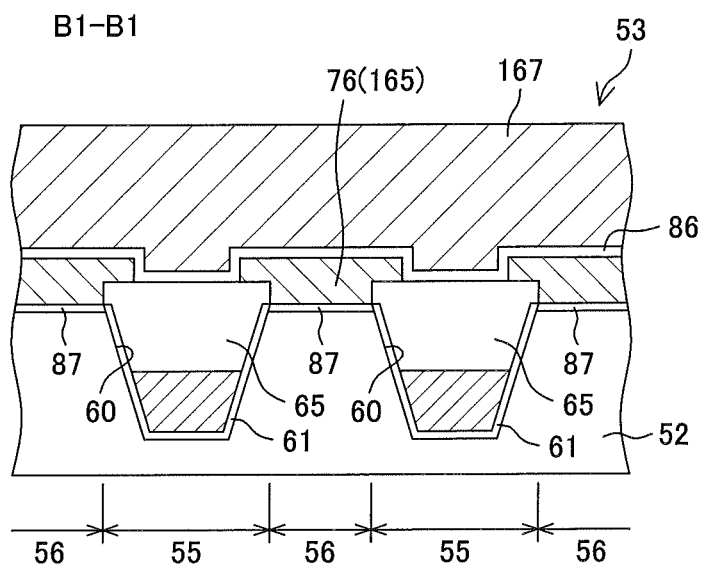
Figure 64A:
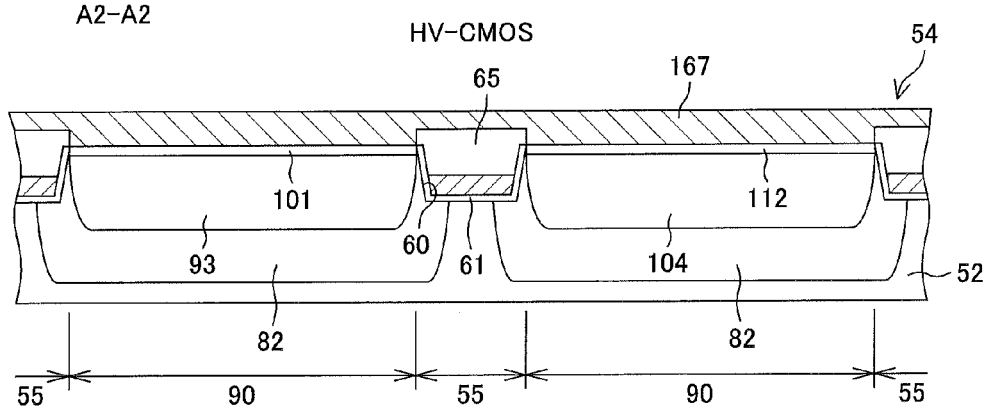
Figure 64B:
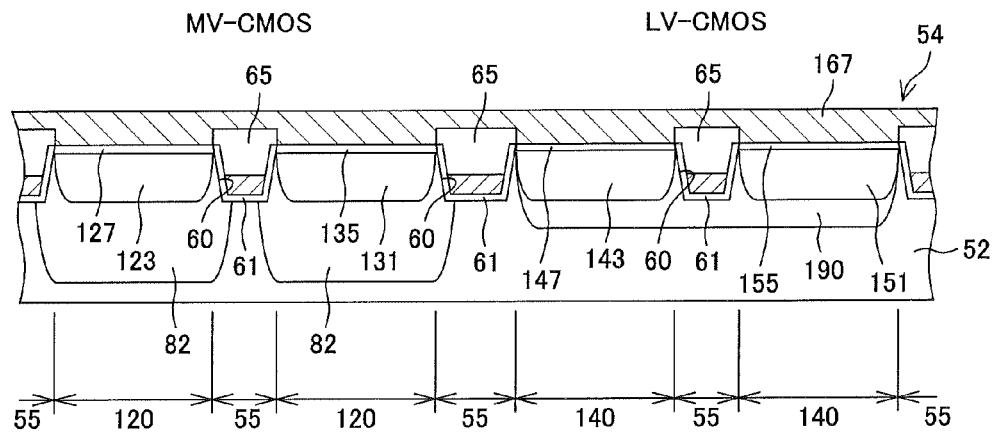
Figure 65A:
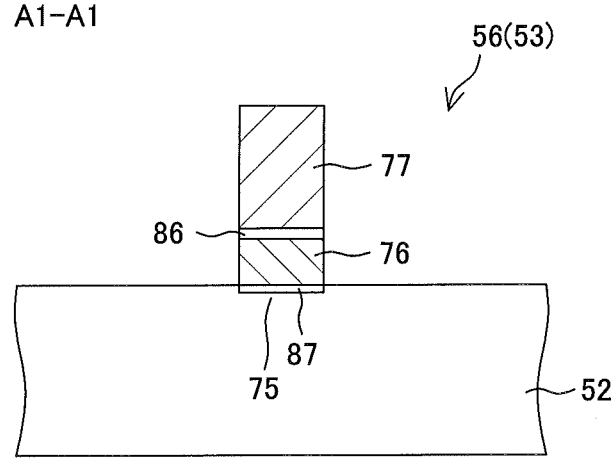
Figure 65B:
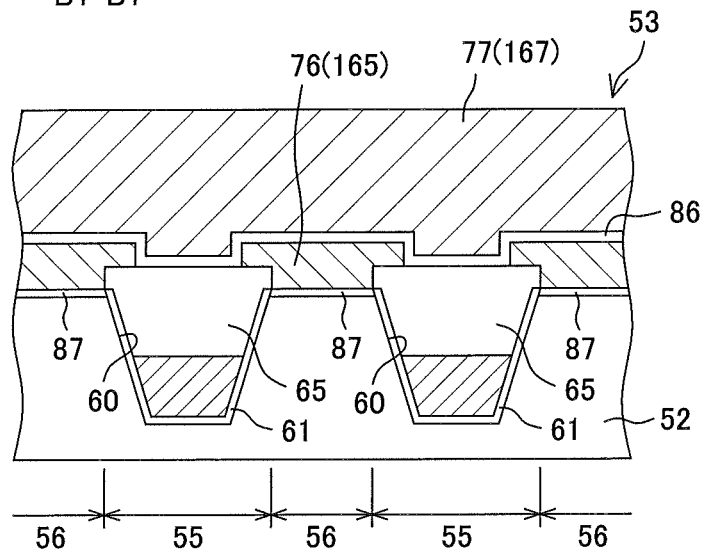
Figure 66A:
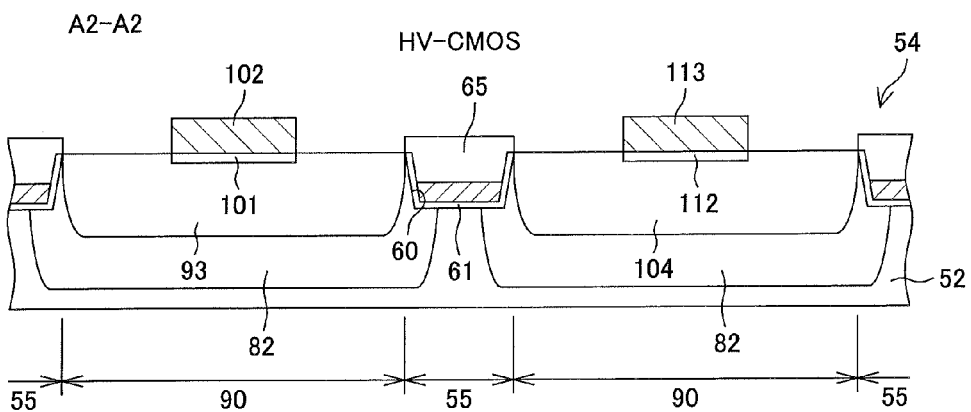
Figure 66B:
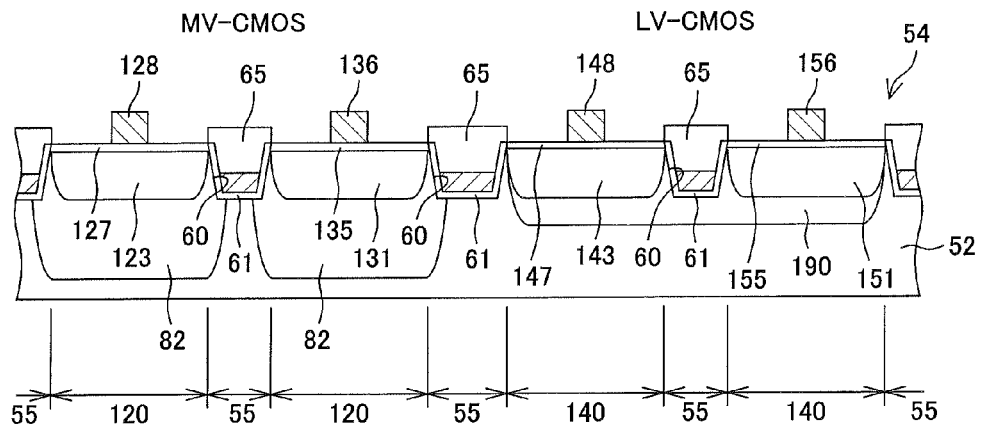
Figure 67A:
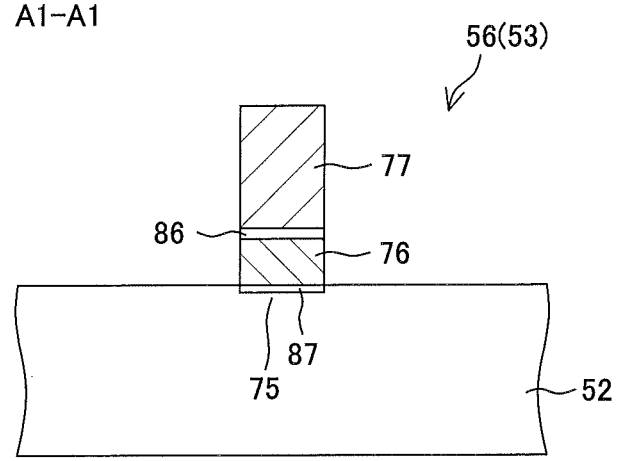
Figure 67B:
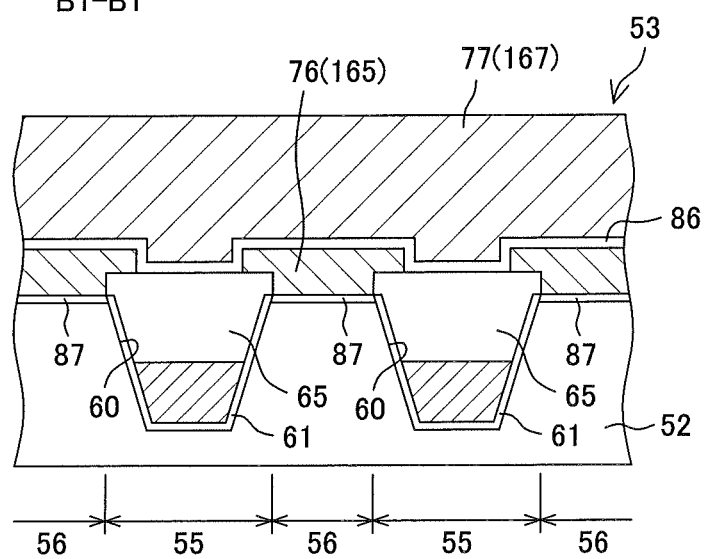
Figure 68A:
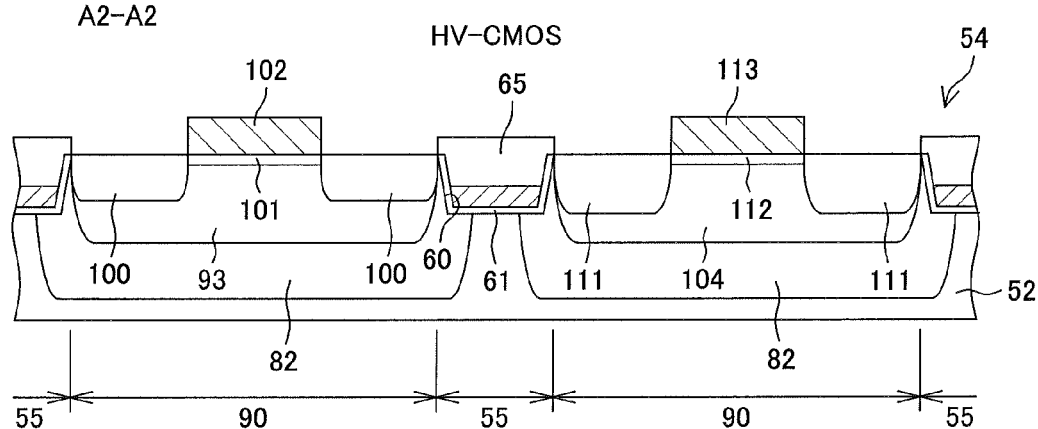
Figure 68B:
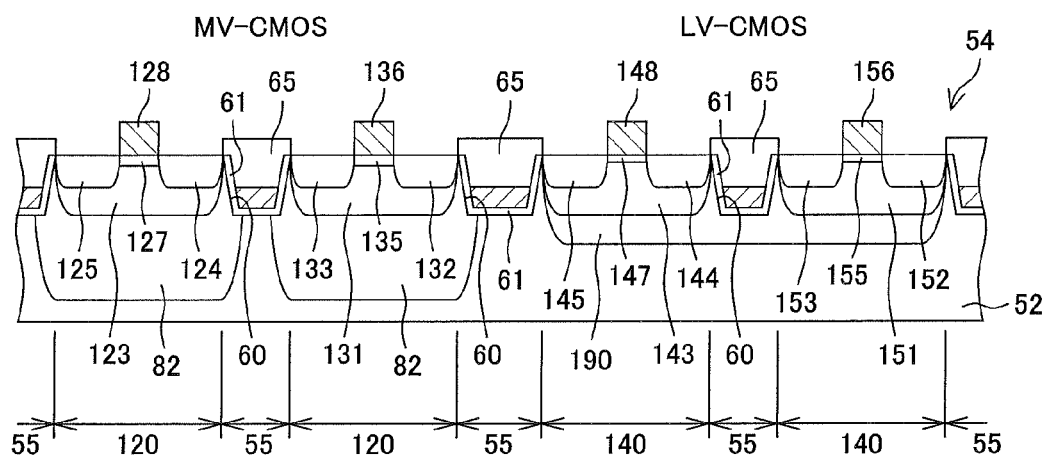
Figure 69A:
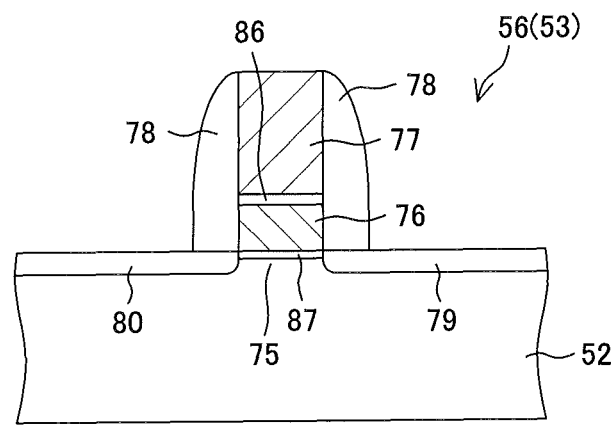
Figure 69B:
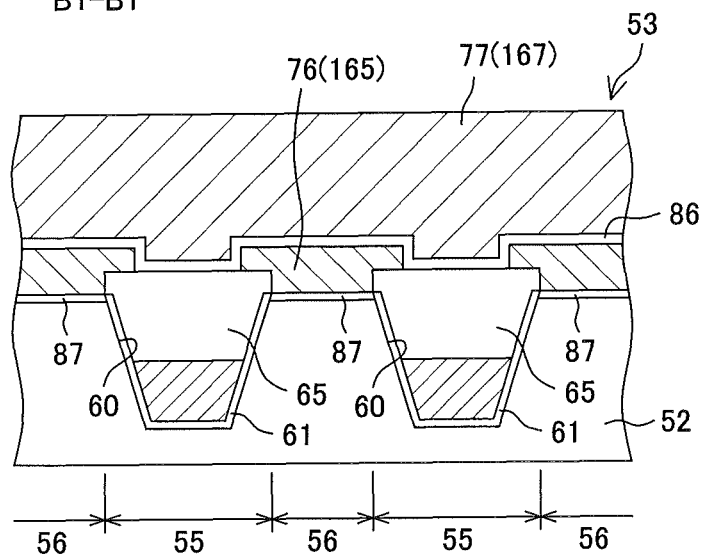
Figure 70A:
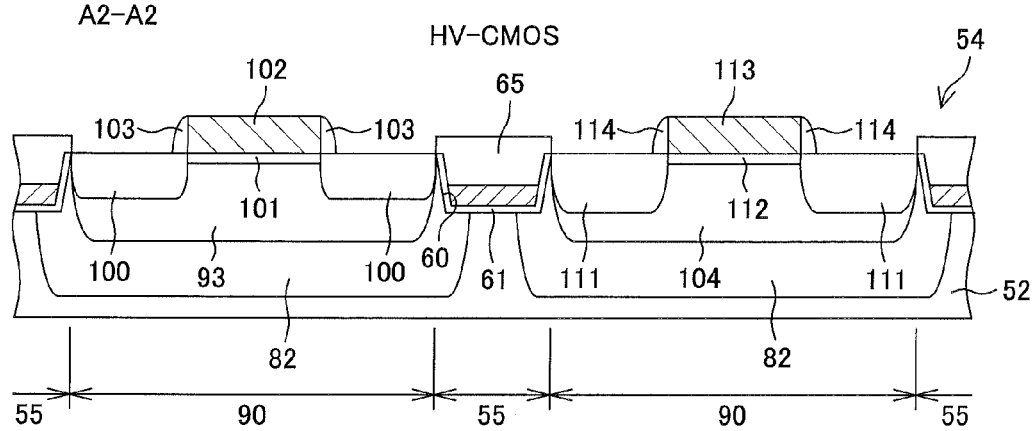
Figure 70B:
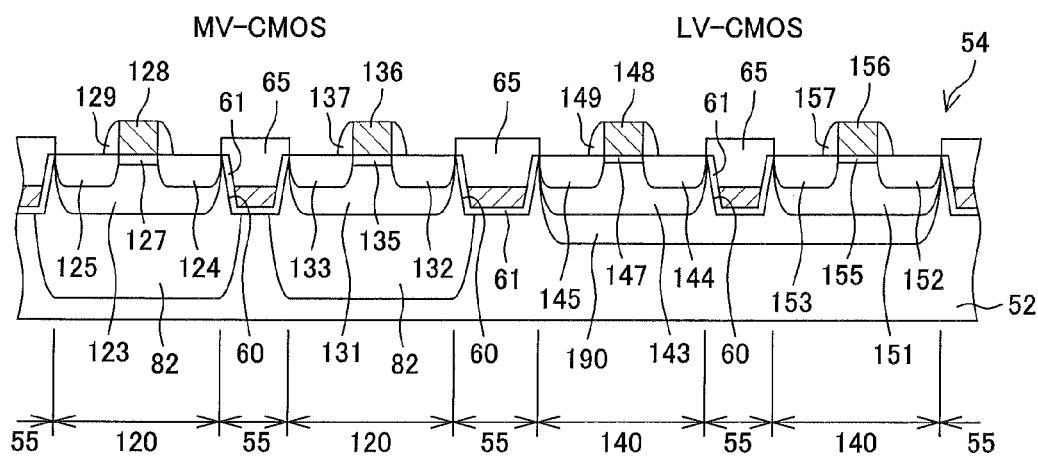
Figure 71A:
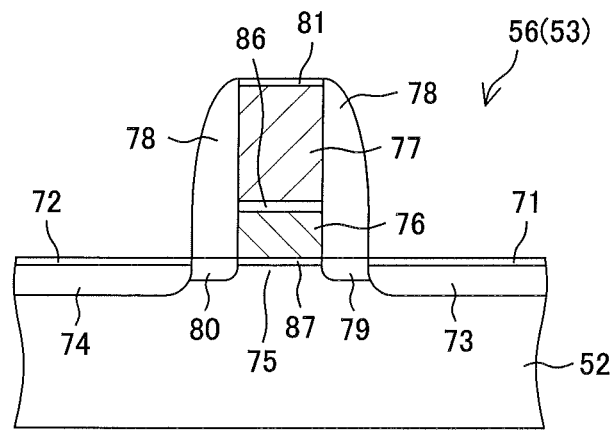
Figure 71B:
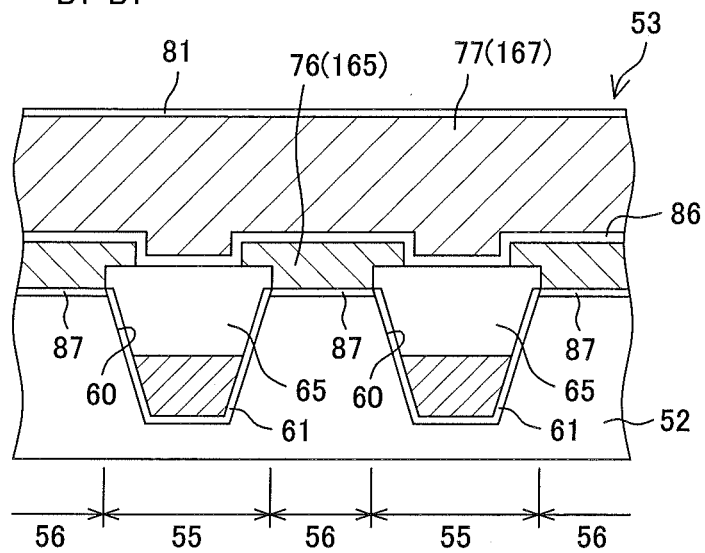
Figure 72A:
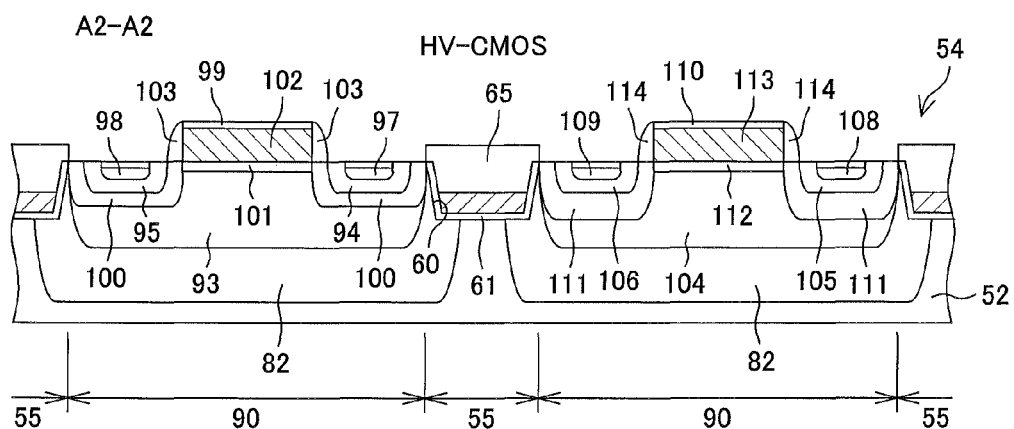
Figure 72B:
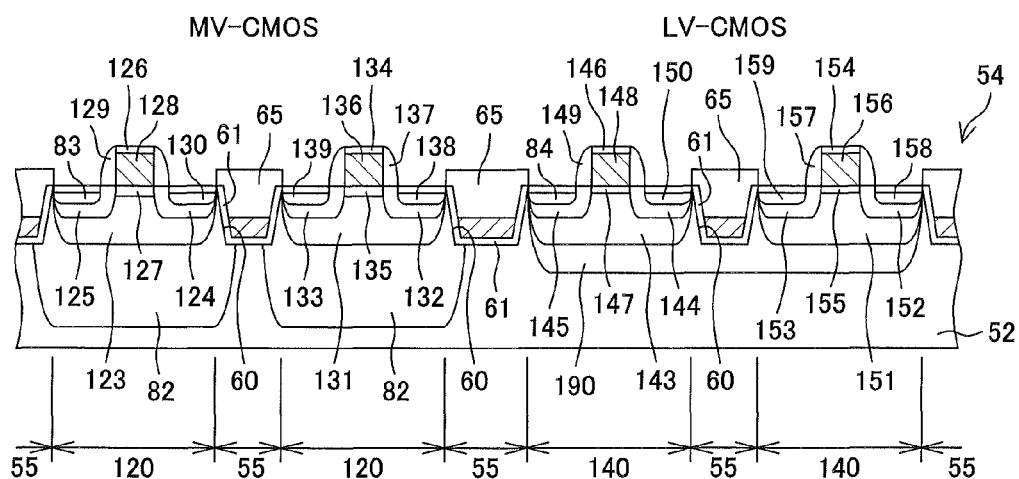

FIGS. 26A and 26B are plan views of a semiconductor device 51 according to a second reference example of the present invention. FIG. 26A is a plan view showing a memory cell region 53 of the semiconductor device 51, and FIG. 26B is a plan view showing a CMOS region 54 of the semiconductor device 51. Also, FIGS. 27A and 27B are sectional views taken along respective section lines in FIG. 26A, in which FIG. 27A corresponds to a section line A1-A1, and FIG. 27B corresponds to a section line B1-B1. Also, FIGS. 28A and 28B are sectional views taken along respective section lines in FIG. 26B, in which FIG. 28A corresponds to a section line A2-A2, and FIG. 28B corresponds to a section line B2-B2.

In the following, first, the memory cell region 53 of the semiconductor device 51 will be described with reference to FIG. 26A and FIGS. 27A and 27B, and next, the CMOS region 54 of the semiconductor device 51 will be described with reference to FIG. 26B and FIGS. 28A and 28B.

<Memory Cell Region>

The semiconductor device 51 includes a semiconductor substrate 52 and a memory cell region 53 set on the semiconductor substrate 52. The semiconductor substrate 52 is, for example, a silicon substrate having a p-type conductivity.

The memory cell region 53 is demarcated into a plurality of active regions 56 by an element separation portion 55.

The element separation portion 55 includes a trench 60 formed in the surface of the semiconductor substrate 52, a liner oxide film 61 formed at an inner face of the trench 60, and a buried film 65 buried into the trench 60.

The trenches 60 are, in the present preferred embodiment, arrayed in a stripe shape such that linear line trenches become parallel to each other. The distance between mutually adjacent trenches 60 is 0.02 μm to 1 μm. This distance corresponds to the width of each active region 56. Each trench 60 is, in a sectional view when cut in its width direction orthogonal to the longitudinal direction (hereinafter, simply referred to as a "sectional view"), formed in a tapered shape to have a narrower width in a depth direction from an opening end toward a bottom portion.

The trenches 60 have an STI structure having a depth of 50 nm to 500 nm and an aspect ratio (a value of the depth of the trench divided by the opening width of the trench) of 4 or more (preferably, 4 to 8) in the present preferred embodiment, but their depth and aspect ratio can be appropriately changed. For example, the trenches 6 may have a DTI structure having a depth of 0.5 μm or more, and preferably, 1 μm to 40 μm, and an aspect ratio of 8 to 20.

The liner oxide film 61 is made of, for example, silicon oxide, and formed over the entire area of side faces and bottom faces of the trenches 60. Moreover, the buried film 65 is buried inside the liner oxide film 61 in the trenches 60.

The buried film 65 includes a first material layer 62 and a second material layer 63 stacked in this order from the bottom portion of the trench 60 to the opening side.

The first material layer 62 is buried up to a halfway portion in the depth direction of the trench 60 such that an interface with the second material layer 63 is located at a fixed height position with reference to the bottom portion of the trench 60. That is, in the present preferred embodiment, a region from the bottom portion of the trench 60 to the fixed height is filled with the first material layer 62 such that the interface between the first material layer 62 and the second material layer 63 becomes parallel with the surface of the semiconductor substrate 52, and a remaining region above the first material layer 62 is filled with the second material layer 63.

Also, the aspect ratio of the region above the first material layer 62 (that is, the part demarcated by an upper face of the first material layer 62 and the side faces of the trench 60 above said upper face) is preferably 4 or less. The second material layer 63 buried into this region is buried into the trench 60 so that, for example, its upper face becomes almost flush with the surface of the semiconductor substrate 52.

The first material layer 62 is made of, for example, polysilicon, and the second material layer 63 is made of silicon oxide ($SiO_2$). In addition, as other materials for the first material layer 62, TEOS (Tetraethyl orthosilicate) and silicon nitride ($SiN_2$) can be exemplified.

In each of the plurality of active regions 56 demarcated by the element separation portion 55, nonvolatile memory cells 70 (EEPROMs) are provided one each.

The nonvolatile memory cell 70 includes an n-type source region 73 and an n-type drain region 74 formed in a surface portion of the semiconductor substrate 52 at an interval from each other, a floating gate 76 disposed so as to be opposed to a channel region 75 between the n-type source and drain regions 73 and 74, and a control gate 77 stacked on the floating gate 76. On the surfaces of the n-type source region 73, the n-type drain region 74, and the control gate 77, silicides 71, 72, and 81 are formed, respectively.

The floating gates 76 are provided one each for each active region 56. Each floating gate 76 is formed such that both end portions (overlapping parts) in a width direction of the active region 56 orthogonal to the longitudinal direction overlap the second material layer 63.

The control gate 77 is formed in a linear form extending in the width direction of the active region 56 orthogonal to the longitudinal direction. The control gate 77 strides across the plurality of active regions 56, and covers all floating gates 76 collectively such that its upper face becomes flat. That is, the control gate 77 serves as a common electrode of the plurality of nonvolatile memory cells 70.

Also, both side faces of the floating gate 76 and the control gate 77 in the longitudinal direction of the active region 56 are formed so as to be flush with each other. Accordingly, the stacked structure of the floating gate 76 and the control gate 77 has planar side faces without a step. That is, these two gates 76 and 77 fit in a region on the same space of the semiconductor substrate 52.

These two gates 76 and 77 suppress variation in threshold voltage of the floating gate 76, and miniaturize the nonvolatile memory cell 70. Further, both side faces of the floating gate 76 and the control gate 77 are covered with sidewalls 78 made of an insulating material such as silicon nitride.

Between the n-type source region 73 and the n-type drain region 74 and the floating gate 76, that is, in regions directly under the sidewalls 78, a low-concentration n-type source layer 79 and a low-concentration n-type drain layer 80 are formed, respectively. Accordingly, an LDD (Lightly Doped Drain) structure is formed.

The low-concentration n-type source layer 79 and the low-concentration n-type drain layer 80 are regions that are formed to be lower in concentration than the n-type source and drain regions 73 and 74 and formed by doping impurity ions shallower than for these n-type source and drain regions 73 and 74. The low-concentration n-type source and drain regions 79 and 80 are formed in a self-aligned manner with respect to the floating gate 76 and the control gate 77. On the other hand, the n-type source and drain regions 73 and 74 are formed in a self-aligned manner with respect to the sidewalls 78.

At the surface of the semiconductor substrate 52 in the channel region 75, a tunneling oxide film 87 is formed so as to be opposed to the floating gate 76. The thickness of the tunneling oxide film 87 is, for example, on the order of 90 Å. The tunneling oxide film 87 passes electrons by FN (Fowler-Nordheim) tunneling between the channel region 75 and the floating gate 76.

Also, the floating gate 76 and the control gate 77 are insulated by an insulating film therebetween. The insulating film is made of, for example, a film having an ONO (oxide film-nitride film-oxide film) structure for which a silicon nitride film is sandwiched by a pair of silicon oxide films (hereinafter, referred to as an ONO film 86).

<CMOS Region>

The semiconductor device 51 includes a HV-CMOS (High Voltage-Complementary Metal Oxide Semiconductor) region 90, a MV-CMOS (Middle Voltage-Complementary Metal Oxide Semiconductor) region 120, and a LV-CMOS (Low Voltage-Complementary Metal Oxide Semiconductor) region 140 on the common semiconductor substrate 52.

The HV-COMS region 90, the MV-CMOS region 120, and the LV-CMOS region 140 are separated from each other by the element separation portions 55. In the following, description will be given in the order of (1) the HV-CMOS region 90, (2) the MV-CMOS region 120, and (3) the LV-CMOS region 140.

(1) HV-CMOS Region

The HV-CMOS region 90 includes an n-type HV-nMOS 91 and a p-type HV-pMOS 92. The n-type HV-nMOS 91 and the p-type HV-pMOS 92 are separated from each other by the element separation portions 55 surrounding these MOSs 91 and 92 in rectangular forms. The HV-nMOS 91 and the HV-pMOS 92 are high-voltage elements whose rated voltage is, for example, over 5V and not more than 40V.

In a region for the HV-nMOS 91, a deep n-type well 82 is formed along sides of the element separation portions 55 surrounding the region in a rectangular form, and further, in an inner region of the deep n-type well 82, a p-type base region 93 is formed. The p-type base region 93 is formed such that its bottom portion becomes deeper than the trench 60.

At the surface of the semiconductor substrate 52 in the p-type base region 93, a HV-nMOS gate insulating film 101 is formed. The HV-nMOS gate insulating film 101 is formed, for example, with a thickness of 300 Å to 500 Å. Moreover, in such a manner so as to be opposed to the semiconductor substrate 52 across the HV-nMOS gate insulating film 101, a HV-nMOS gate electrode 102 is formed. On the surface of the HV-nMOS gate electrode 102, a silicide 99 is formed. Also, both side faces of the HV-nMOS gate electrode 102 are covered with sidewalls 103 made of an insulating material such as silicon nitride.

Moreover, on one side of the HV-nMOS gate electrode 102, a HV-n-type drift region 100, a HV-n-type source region 94, and a HV-n-type source contact region 97 are formed, and on the opposite side thereof, a HV-n-type drift region 100, a HV-n-type drain region 95, and a HV-n-type drain contact region 98 are formed.

The HV-n-type drift regions 100 are formed in a self-aligned manner with respect to the HV-nMOS gate electrode 102, and the HV-n-type source and drain regions 94 and 95 are respectively formed in a self-aligned manner with respect to the sidewalls 103. Also, the HV-n-type source and drain contact regions 97 and 98 are respectively formed in inner regions of the HV-n-type source and drain regions 94 and 95. Also, on the surfaces of the HV-n-type source and drain contact regions 97 and 98, silicides are respectively formed.

In a region for the HV-pMOS 92, similar to the region for the HV-nMOS 91, a deep n-type well 82 is formed along sides of the element separation portions 55 surrounding the region in a rectangular form, and further, in an inner region of the deep n-type well 82, an n-type base region 104 is formed. The n-type base region 104 is formed such that its bottom portion becomes deeper than the trench 60.

At the surface of the semiconductor substrate 52 in the n-type base region 104, a HV-pMOS gate insulating film 112 is formed. The HV-pMOS gate insulating film 112 is formed with the same thickness and the same material as those of the HV-nMOS gate insulating film 101. Moreover, in such a manner so as to be opposed to the semiconductor substrate 52 across the HV-pMOS gate insulating film 112, a HV-pMOS gate electrode 113 is formed. On the surface of the HV-pMOS gate electrode 113, a silicide 110 is formed. Also, both side faces of the HV-pMOS gate electrode 113 are covered with sidewalls 114 made of an insulating material such as silicon nitride.

Moreover, on one side of the HV-pMOS gate electrode 113, a HV-p-type drift region 111, a HV-p-type source region 105, and a HV-p-type source contact region 108 are formed, and on the opposite side thereof, a HV-p-type drift region 111, a HV-p-type drain region 106, and a HV-p-type drain contact region 109 are formed.

The HV-p-type drift regions 111 are formed deeper than the HV-n-type drift regions 100, and are formed in a self-aligned manner with respect to the HV-pMOS gate electrode 113. The HV-p-type source and drain regions 105 and 106 are formed with the same depth as that of the HV-n-type source and drain regions 94 and 95, and are respectively formed in a self-aligned manner with respect to sidewalls 114. Also, the HV-p-type source and drain contact regions 108 and 109 are formed with the same depth as that of the HV-n-type source and drain contact regions 97 and 98, and are respectively formed in inner regions of the HV-p-type source and drain regions 105 and 106. Also, on the surfaces of the HV-p-type source and drain contact regions 108 and 109, silicides are respectively formed.

(2) MV-CMOS Region

The MV-CMOS region 120 includes an n-type MV-nMOS 121 and a p-type MV-pMOS 122. The n-type MV-nMOS 121 and the p-type MV-pMOS 122 are separated from each other by the element separation portions 55 surrounding these MOSs 121 and 122 in rectangular forms. The MV-nMOS 121 and the MV-pMOS 122 are middle-voltage elements whose rated voltage is, for example, not less than 2V and not more than 5V.

In a region for the MV-nMOS 121, similar to the region for the HV-nMOS 91, a deep n-type well 82 is formed along sides of the element separation portions 55 surrounding the region in a rectangular form, and further, in an inner region of the deep n-type well 82, a MV-p-type well 123 is formed. The MV-p-type well 123 is formed to be higher in impurity concentration than the p-type base region 93 and shallower than the p-type base region 93. For example, the MV-p-type well 123 is formed such that its bottom portion becomes the same in depth position as the bottom portion of the trench 60. Also, the MV-p-type well 123 is formed with the same impurity concentration and the same depth as those of the HV-p-type drift region 111 and a LV-p-type well 143 to be described later.

In an inner region of the MV-p-type well 123, a MV-n-type source region 124 and a MV-n-type drain region 125 are formed at an interval from each other along the surface of the semiconductor substrate 52. The region between the MV-n-type source region 124 and the MV-n-type drain region 125 serves as a channel region of the MV-p-type well 123.

At the surface of the semiconductor substrate 52 in the region for the MV-nMOS 121, a MV-nMOS gate insulating film 127 is formed. The MV-nMOS gate insulating film 127 is formed thinner than the above-described HV-nMOS gate insulating film 101. Its thickness is, for example, 100 Å to 300 Å. Moreover, in such a manner so as to be opposed to the channel region of the MV-nMOS 121, a MV-nMOS gate electrode 128 is formed with the MV-nMOS gate insulating film 127 sandwiched therebetween. On the surface of the MV-nMOS gate electrode 128, a silicide 126 is formed. Also, the MV-n-type source region 124 and the MV-n-type drain region 125 are formed in a self-aligned manner with respect to the MV-nMOS gate electrode 128. Both side faces of the MV-nMOS gate electrode 128 are covered with sidewalls 129 made of an insulating material such as silicon nitride.

Moreover, in inner regions of the MV-n-type source and drain regions 124 and 125, a MV-n-type source contact region 130 and a MV-n-type drain contact region 83 are formed respectively in a self-aligned manner with respect to the sidewalls 129. Also, on the surfaces of the MV-n-type source and drain contact regions 130 and 83, silicides are respectively formed.

In a region for the MV-pMOS 122, similar to the region for the HV-nMOS 91, a deep n-type well 82 is formed along sides of the element separation portions 55 surrounding the region in a rectangular form, and further, in an inner region of the deep n-type well 82, a MV-n-type well 131 is formed. The MV-n-type well 131 is formed to be higher in impurity concentration than the n-type base region 104 and shallower than the n-type base region 104. For example, the MV-n-type well 131 is formed such that its bottom portion becomes the same in depth position as the bottom portion of the trench 60. Also, the MV-n-type well 131 is formed with the same impurity concentration and the same depth as those of a LV-n-type well 151 to be described later.

In an inner region of the MV-n-type well 131, a MV-p-type source region 132 and a MV-p-type drain region 133 are formed at an interval from each other along the surface of the semiconductor substrate 52. The region between the MV-p-type source region 132 and the MV-p-type drain region 133 serves as a channel region of the MV-n-type well 131.

At the surface of the semiconductor substrate 52 in the region for the MV-pMOS 122, a MV-pMOS gate insulating film 135 is formed. The MV-pMOS gate insulating film 135 is formed with the same thickness and the same material as those of the MV-nMOS gate insulating film 127. Moreover, in such a manner so as to be opposed to the channel region of the MV-pMOS 122, a MV-pMOS gate electrode 136 is formed with the MV-pMOS gate insulating film 135 sandwiched therebetween. On the surface of the MV-pMOS gate electrode 136, a silicide 134 is formed. Also, the MV-p-type source region 132 and the MV-p-type drain region 133 are formed in a self-aligned manner with respect to the MV-pMOS gate electrode 136. Both side faces of the MV-pMOS gate electrode 136 are covered with sidewalls 137 made of an insulating material such as silicon nitride.

Moreover, in inner regions of the MV-p-type source and drain regions 132 and 133, a MV-p-type source contact region 138 and a MV-p-type drain contact region 139 are formed respectively in a self-aligned manner with respect to the sidewalls 137. Also, on the surfaces of the MV-p-type source and drain contact regions 138 and 139, silicides are respectively formed.

(3) LV-CMOS Region

The LV-CMOS region 140 includes an n-type LV-nMOS 141 and a p-type LV-pMOS 142. The n-type LV-nMOS 141 and the p-type LV-pMOS 142 are separated from each other by the element separation portions 55 surrounding these MOSs 141 and 142 in rectangular forms. The LV-nMOS 141 and the LV-pMOS 142 are low-voltage elements whose rated voltage is, for example, less than 2V.

In a region for the LV-nMOS 141 and a region for the LV-pMOS 142, a deep n-type well 190 is formed along sides of the element separation portions 55 so as to cover these regions collectively. The deep n-type well 190 is formed with the same impurity concentration and the same depth as those of the n-type base region 104.

In an inner region of the deep n-type well 190 in the region for the LV-nMOS 141, a LV-p-type well 143 is formed along sides of the element separation portions 55 surrounding the region in a rectangular form. The LV-p-type well 143 is formed to be higher in impurity concentration than the p-type base region 93 and shallower than the p-type base region 93. For example, the LV-p-type well 143 is formed such that its bottom portion becomes the same in depth position as the bottom portion of the trench 60.

In an inner region of the LV-p-type well 143, a LV-n-type source region 144 and a LV-n-type drain region 145 are formed at an interval from each other along the surface of the semiconductor substrate 52. The region between the LV-n-type source region 144 and the LV-n-type drain region 145 serves as a channel region of the LV-p-type well 143.

At the surface of the semiconductor substrate 52 in the region for the LV-nMOS 141, a LV-nMOS gate insulating film 147 is formed. The LV-nMOS gate insulating film 147 is formed thinner still than the above-described MV-nMOS gate insulating film 127. Its thickness is, for example, 10 Å to 100 Å. Moreover, in such a manner so as to be opposed to the channel region of the LV-nMOS 141, a LV-nMOS gate electrode 148 is formed with the LV-nMOS gate insulating film 147 sandwiched therebetween. On the surface of the LV-nMOS gate electrode 148, a silicide 146 is formed. Also, the LV-n-type source region 144 and the LV-n-type drain region 145 are formed in a self-aligned manner with respect to the LV-nMOS gate electrode 148. Also, both side faces of the LV-nMOS gate electrode 148 are covered with sidewalls 149 made of an insulating material such as silicon nitride.

Moreover, in inner regions of the LV-n-type source and drain regions 144 and 145, a LV-n-type source contact region 150 and a LV-n-type drain contact region 84 are formed respectively in a self-aligned manner with respect to the sidewalls 149. Also, on the surfaces of the LV-n-type source and drain contact regions 150 and 84, silicides are respectively formed.

In an inner region of the deep n-type well 190 in the region for the LV-pMOS 142, a LV-n-type well 151 is formed along sides of the element separation portions 55 surrounding the region in a rectangular form. The LV-n-type well 151 is formed to be higher in impurity concentration than the n-type base region 104 and shallower than the n-type base region 104. For example, the LV-n-type well 151 is formed such that its bottom portion becomes the same in depth position as the bottom portion of the trench 60.

In an inner region of the LV-n-type well 151, a LV-p-type source region 152 and a LV-p-type drain region 153 are formed at an interval from each other along the surface of the semiconductor substrate 52. The region between the LV-p-type source region 152 and the LV-p-type drain region 153 serves as a channel region of the LV-n-type well 151.

At the surface of the semiconductor substrate 52 in the region for the LV-pMOS 142, a LV-pMOS gate insulating film 155 is formed. The LV-pMOS gate insulating film 155 is formed with the same thickness and the same material as those of the LV-nMOS gate insulating film 147. Moreover, in such a manner so as to be opposed to the channel region of the LV-pMOS 142, a LV-pMOS gate electrode 156 is formed with the LV-pMOS gate insulating film 155 sandwiched therebetween. On the surface of the LV-pMOS gate electrode 156, a silicide 154 is formed. Also, the LV-p-type source region 152 and the LV-p-type drain region 153 are formed in a self-aligned manner with respect to the LV-pMOS gate electrode 156. Also, both side faces of the LV-pMOS gate electrode 156 are covered with sidewalls 157 made of an insulating material such as silicon nitride.

Moreover, in inner regions of the LV-p-type source and drain regions 152 and 153, a LV-p-type source contact region 158 and a LV-p-type drain contact region 159 are formed respectively in a self-aligned manner with respect to the sidewalls 157. Also, on the surfaces of the LV-p-type source and drain contact regions 158 and 159, silicides are respectively formed.

Further, an interlayer insulating film 160 is stacked on the semiconductor substrate 52 so as to cover the memory cell region 53 and the CMOS region 54 described above. The interlayer insulating film 160 is made of, for example, an insulating material such as silicon oxide.

On the interlayer insulating film 160, a plurality of wirings 161 made of a conducting material such as aluminum are formed. The plurality of wirings 161 are respectively connected, via contact plugs 163 that penetrate through the interlayer insulating film 160, to the n-type source region 73, the n-type drain region 74, the HV-n-type source contact region 97, the HV-n-type drain contact region 98, the HV-p-type source contact region 108, the HV-p-type drain contact region 109, the MV-n-type source contact region 130, the MV-n-type drain contact region 83, the MV-p-type source contact region 138, the MV-p-type drain contact region 139, the LV-n-type source contact region 150, the LV-n-type drain contact region 84, the LV-p-type source contact region 158, and the LV-p-type drain contact region 159.

Moreover, on the interlayer insulating film 160, a surface protective film 168 made of an insulating material such as silicon nitride is formed so as to coat the respective wirings 161.

Operations of writing, erasing, and reading of information with respect to the nonvolatile memory cell 70 can be performed in the following manner.

As an injection of electrons into the floating gate 76, for example, when a positive voltage is applied to the control gate 77 and the n-type drain region 74 with the n-type source region 73 provided at a ground potential, electrons are injected into the floating gate 76 by FN tunneling via the tunneling oxide film 87 from the n-type source region 73.

As drawing of electrons from the floating gate 76, for example, when a negative voltage is applied to the control gate 77 and a positive voltage is applied to the n-type source region 73 with the n-type drain region 74 opened, electrons are drawn toward the n-type source region 73 by FN tunneling via the tunneling oxide film 87 from the floating gate 76.

When electrons are injected into the floating gate 76, in a state where the floating gate 76 is charged, a high threshold voltage needs to be applied to the control gate 77 in order to make the nonvolatile memory cell 70 conduct. Therefore, a reading voltage that needs to be supplied to the control gate 77 is set in advance to a value at which the section between the n-type source region 73 and the n-type drain region 74 is kept in a blocked state when the floating gate 76 is in an uncharged state (state in which electrons have been drawn) and the section between the n-type source region 73 and the n-type drain region 74 can be made to conduct when the floating gate 76 is in a charged state (state in which electrons have been injected). At this time, checking whether a current flows to the source side allows to discriminate whether electrons are being injected into the floating gate 76. In this manner, the operations of writing, erasing, and reading of information with respect to the nonvolatile memory cell 70 can be performed.

Next, a manufacturing process of the semiconductor device 51 will be described with reference to FIGS. 29A and 29B to FIGS. 72A and 72B.

FIGS. 29A and 29B to FIGS. 72A and 72B are sectional views for explaining in the order of steps a part of a method for manufacturing the semiconductor device 51. In FIGS. 29A and 29B to FIGS. 72A and 72B, drawings with odd numbers such as FIGS. 29A and 29B, FIGS. 31A and 31B, and FIGS. 33A and 33B show steps of the memory cell region 53, and drawings with even numbers such as FIGS. 30A and 30B, FIGS. 32A and 32B, and FIGS. 34A and 34B show steps of the CMOS region 54.

For manufacturing the semiconductor device 51, as shown in FIGS. 29A and 29B and FIGS. 30A and 30B, a pad oxide film 164 is formed on the surface of the semiconductor substrate 52 by, for example, a thermal oxidization method, and then, by, for example, a CVD method, a hard mask 170 is formed on the pad oxide film 164. The thickness of the pad oxide film 164 is, for example, on the order of 125 Å. Also, the hard mask 170 is formed of a silicon nitride film having a thickness, for example, on the order of 800 Å.

Next, as shown in FIGS. 31A and 31B and FIGS. 32A and 32B, the hard mask 170 and the pad oxide film 164 are selectively etched in order to selectively form openings in regions where trenches 60 need to be formed. Then, an etching gas is supplied to the semiconductor substrate 52 via the openings. The etching gas proceeds from said openings in a depth direction of the semiconductor substrate 52, so that trenches 60 having tapered shapes in a sectional view are simultaneously formed in the memory cell region 53 and the CMOS region 54.

Next, as shown in FIGS. 33A and 33B and FIGS. 34A and 34B, the semiconductor substrate 52 is thermally oxidized with the hard mask 170 remaining. The thermal oxidation is performed, for example, at a temperature of 700° C. to 1200° C. in an atmosphere injected with oxygen gas or the like. By the thermal oxidation, a liner oxide film 61 having an almost uniform thickness is formed entirely over the side faces and bottom faces of the trenches 60 at which the semiconductor substrate 52 is exposed.

Next, a step of filling back the trenches 60 with a material of the first material layer 62 is performed. As the material for the first material layer 62, polysilicon, silicon nitride, or TEOS can be adopted. In the following, description will be given of a case in which polysilicon is deposited.

The deposition of polysilicon is performed by, for example, an LP-CVD (Low Pressure-Chemical Vapor Deposition) method. The LP-CVD method is performed, under a pressure on the order of 10 Pa to 50 Pa (Pascals), at a temperature of 600° C. to 900° C. Accordingly, the trenches 60 and the openings in the hard mask 170 are filled back with polysilicon, and further, the hard mask 170 is completely covered with polysilicon. Accordingly, a first material layer 62 is formed.

Next, as shown in FIGS. 35A and 35B and FIGS. 36A and 36B, an unnecessary part of the first material layer 62 (part out of the trenches 60 and the openings in the hard mask 170) is removed by a CMP (Chemical Mechanical Polishing) method. The CMP is continued until the surface of the hard mask 170 and the surface (polished surface) of the first material layer 62 become flush with each other. Accordingly, the first material layer 62 is buried so as to fill the trenches 60 and the openings in the hard mask 170.

Next, as shown in FIGS. 37A and 37B and FIGS. 38A and 38B, the first material layer 62 is etched until a position (depth) where the upper surface of the first material layer 62 becomes lower than the surface of the semiconductor substrate 52. The etching is performed by, for example, dry etching such as a RIE (Reactive Ion Etching) method.

At this time, it is preferable that the first material layer 62 is formed such that the aspect ratio of the part demarcated by the upper face of the first material layer 62 and the trench 60 above said upper face becomes 4 or less. In addition, the same first material layer 62 can also be formed by only the step of etching treatment by a RIE method, by omitting the step of polishing polysilicon by a CMP method described in FIGS. 35A and 35B and FIGS. 36A and 36B.

Next, as shown in FIGS. 39A and 39B and FIGS. 40A and 40B, a step of filling back the trenches 60 with a material of the second material layer 63 is performed. Specifically, silicon oxide is deposited until filling back the trenches 60 with the first material layer 62 formed via the liner oxide film 61 and completely covering the hard mask 170. The deposition of silicon oxide is performed by, for example, an HDP-CVD (High-Density Plasma Chemical Vapor Deposition) method or a P-CVD (Plasma-Enhanced Chemical Vapor Deposition) method. Preferably, the HDP-CVD method is used. Accordingly, a second material layer 63 is formed.

Next, as shown in FIGS. 41A and 41B and FIGS. 42A and 42B, an unnecessary part of the second material layer 63 (part out of the trenches 60 and the openings in the hard mask 170) is removed by a CMP method. The CMP is continued until the surface of the hard mask 170 and the surface (polished surface) of the second material layer 63 become flush with each other. Accordingly, the second material layer 63 is buried so as to fill the trenches 60 and the openings in the hard mask 170. In this manner, a buried film 65 including the first material layer 62 and the second material layer 63 is formed.

Next, as shown in FIGS. 43A and 43B and FIGS. 44A and 44B, in the memory cell region 53, the hard mask 170 is completely removed from over the pad oxide film 164 by etching or the like. Next, in the HV-CMOS region 90 and the MV-CMOS region 120, n-type impurity ions are selectively doped, into regions where deep n-type wells 82 need to be formed, using a resist film, a silicon oxide film, or the like as a mask (not shown). For example, arsenic (As$^+$) ions or phosphorus (P$^+$) ions are used as the n-type impurity ions. Accordingly, deep n-type wells 82 are formed.

Next, in the HV-CMOS region 90 and the LV-CMOS region 140, n-type impurity ions are selectively doped, into respective regions where an n-type base region 104 and a deep n-type well 190 need to be formed, using a resist film, a silicon oxide film, or the like as a mask (not shown). For example, arsenic (As$^+$) ions or phosphorus (P$^+$) ions are used as the n-type impurity ions. Accordingly, an n-type base region 104 and a deep n-type well 190 are simultaneously formed.

Next, in the HV-CMOS region 90, p-type impurity ions are selectively doped, into a region where a p-type base region 93 needs to be formed, using a resist film, a silicon oxide film, or the like as a mask (not shown). For example, boron (B$^+$) ions are used as the p-type impurity ions. Accordingly, a p-type base region 93 is formed.

Next, as shown in FIGS. 45A and 45B and FIGS. 46A and 46B, a hard mask 172 is formed across the entire surface of the semiconductor substrate 52 by, for example, a CVD method. The hard mask 172 is formed of a silicon nitride film having a thickness, for example, on the order of 300 Å. After formation of the hard mask 172, an oxide film 173 is formed on the surfaces of the hard mask 172. The oxide film 173 can be formed by oxidizing the surface of the hard mask 172 made of silicon nitride by, for example, a thermal oxidation method. In addition, the oxide film 173 may be formed by a CVD method.

Next, as shown in FIGS. 47A and 47B and FIGS. 48A and 48B, the oxide film 173, the hard mask 172, and the pad oxide film 164 present on the memory cell region 53 and the HV-CMOS region 90 are selectively removed by, for example, etching. Accordingly, in the memory cell region 53 and the HV-CMOS region 90, the surface of the semiconductor substrate 52 is exposed.

Next, as shown in FIGS. 49A and 49B and FIGS. 50A and 50B, the semiconductor substrate 52 is thermally oxidized with the MV-CMOS region 120 and the LV-CMOS region 140 covered with the hard mask 172. Accordingly, a tunneling oxide film 87 is formed on the surface of the semiconductor substrate 52 in the memory cell region 53 and the HV-CMOS region 90 not covered with the hard mask 172. Next, over the semiconductor substrate 52, a polysilicon film 165 added with impurity ions (for example, phosphorus (P$^+$) ions) is deposited. The thickness of the polysilicon film 165 is, for example, on the order of 700 Å.

Next, as shown in FIGS. 51A and 51B and FIGS. 52A and 52B, the polysilicon film 165 on the element separation portions 55 is selectively removed in the memory cell region 53. Accordingly, floating gates 76 that overlap the second material layer 63 are formed.

Next, as shown in FIGS. 53A and 53B and FIGS. 54A and 54B, an ONO film 86 having a three-layer structure is formed by stacking a silicon oxide film, a silicon nitride film, and a silicon oxide film in order over the semiconductor substrate 52. Next, a protective film 176 is formed on the ONO film 86. The protective film 176 is made of, for example, silicon nitride, and formed thinner than the hard mask 172 that covers the MV-CMOS region 120 and the LV-CMOS region 140. For example, the film thickness of the protective film 176 is on the order of 100 Å.

Next, a thermal oxidation step of the CMOS region 54 is performed. Specifically, thermal oxidation of the HV-CMOS region 90, the MV-CMOS region 120, and the LV-CMOS region 140 are performed in this order.

First, gate oxidation for the HV-CMOS region 90 is performed. As shown in FIGS. 55A and 55B and FIGS. 56A and 56B, the protective film 176, the ONO film 86, and the polysilicon film 165 that cover the HV-CMOS region 90 are selectively removed. In this case, also in the MV-CMOS region 120 and the LV-CMOS region 140, the protective film 176, the ONO film 86, and the polysilicon film 165 on the hard mask 172 are removed. Next, as a result of the tunneling oxide film 87 in the HV-CMOS region 90 being removed, the surface of the semiconductor substrate 52 is exposed in the HV-CMOS region 90. When removing the tunneling oxide film 87, the oxide film 173 on the hard mask 172 is removed.

Next, as shown in FIGS. 57A and 57B and FIGS. 58A and 58B, the semiconductor substrate 52 is thermally oxidized with the hard mask 172 remaining in the MV-CMOS region 120 and the LV-CMOS region 140. The thermal oxidation is performed, for example, for 10 minutes to 30 minutes at 900° C. to 1000° C. Accordingly, a HV-nMOS gate insulating film 101 and a HV-pMOS gate insulating film 112 are simultaneously formed in the HV-CMOS region 90 not covered with the hard mask 172, the polysilicon film 165, the ONO film 86, etc. In this case, the hard mask 172 and the protective film 176 are also oxidized from the surface side, so that silicon oxide parts are formed at their respective surface portions. Also, in the present preferred embodiment, the thickness of the protective film 176 is on the order of 100 Å, but it may be thinner still if in an arrangement where a part of silicon nitride remains in a lower portion of the protective film 176 after thermal oxidation of the HV-CMOS region 90 (namely, unless the protective film 176 is completely oxidized to be dominated by the silicon oxide part at the surface).

Next, after supplying hydrofluoric acid (HF) onto the semiconductor substrate 52 to selectively remove the silicon oxide parts at the surfaces of the hard mask 172 and the protective film 176, by supplying phosphoric acid ($H_3PO_4$), the hard mask 172 and the protective film 176 that cover the MV-CMOS region 120 and the LV-CMOS region 140 are simultaneously removed. In this case, because the protective film 176 has been formed thinner than the hard mask 172, the etching time required for removal of the protective film 176 can be shorter than the etching time for the hard mask 172. Therefore, removal of the protective film 176 can be reliably finished at the completion of removal of the hard mask 172. Accordingly, the protective film 176 can be prevented from remaining on the ONO film 86.

Next, gate oxidation for the MV-CMOS region 120 is performed. Specifically, as shown in FIGS. 59A and 59B and FIGS. 60A and 60B, the pad oxide film 164 is selectively removed from the MV-CMOS region 120 and the LV-CMOS region 140 exposed by removal of the hard mask 172. Then, the surface of the semiconductor substrate 52 exposed in the MV-CMOS region 120 and the LV-CMOS region 140 is thermally oxidized. The thermal oxidation is performed at a lower temperature than that of gate oxidation for the HV-CMOS region 90, and performed, for example, for 5 minutes to 10 minutes at 850° C. to 950° C. Accordingly, a MV-nMOS gate insulating film 127 and a MV-pMOS gate insulating film 135 are simultaneously formed in the MV-CMOS region 120. Subsequently, an insulating film 166 formed in the LV-CMOS region 140 by the thermal oxidization is selectively removed.

Next, gate oxidation for the LV-CMOS region 140 is performed. As shown in FIGS. 61A and 61B and FIGS. 62A and 62B, by the surface of the semiconductor substrate 52 exposed in the remaining LV-CMOS region 140 being thermally oxidized, a LV-nMOS gate insulating film 147 and a LV-pMOS gate insulating film 155 are simultaneously formed in the LV-CMOS region 140. The thermal oxidation is performed at a lower temperature than that of gate oxidation for the MV-CMOS region 120, and performed, for example, for 5 minutes to 10 minutes at 700° C. to 800° C.

Next, as shown in FIGS. 63A and 63B and FIGS. 64A and 64B, n-type impurity ions are selectively doped into regions where a MV-n-type well 131 and a LV-n-type well 151 need to be formed. Accordingly, a MV-n-type well 131 and a LV-n-type well 151 are simultaneously formed.

Next, p-type impurity ions are selectively doped into regions where a MV-p-type well 123 and a LV-p-type well 143 need to be formed. Accordingly, a MV-p-type well 123 and a LV-p-type well 143 are simultaneously formed.

Next, over the semiconductor substrate 52, a polysilicon film 167 added with impurity ions (for example, phosphorus ($P^+$) ions) is deposited. The thickness of the polysilicon film 167 is, for example, on the order of 210 nm.

Next, as shown in FIGS. 65A and 65B and FIGS. 66A and 66B, the polysilicon film 167 is selectively etched. Accordingly, a control gate 77, a HV-nMOS gate electrode 102, a HV-pMOS gate electrode 113, a MV-nMOS gate electrode 128, a MV-pMOS gate electrode 136, a LV-nMOS gate electrode 148, and a LV-pMOS gate electrode 156 are simultaneously formed. That is, the gate electrodes 102, 113, 128, 136, 148, and 156 of the CMOS region 54 are formed using the material of the control gate 77.

Subsequently, parts, in the tunnel oxide film 87, the HV-nMOS gate insulating film 101, the HV-pMOS gate insulating film 112, the MV-nMOS gate insulating film 127, the MV-pMOS gate insulating film 135, the LV-nMOS gate insulating film 147, and the LV-pMOS gate insulating film 155, other than parts present directly under the foregoing gate electrodes 77(76), 102, 113, 128, 136, 148, and 156 are selectively removed.

Next, as shown in FIGS. 67A and 67B and FIGS. 68A and 68B, a low-concentration n-type source layer 79, a low-concentration n-type drain layer 80, a HV-n-type drift region 100, a HV-p-type drift region 111, a MV-n-type source region 124, a MV-n-type drain region 125, a MV-p-type source region 132, a MV-p-type drain region 133, a LV-n-type source region 144, a LV-n-type drain region 145, a LV-p-type source region 152, and a LV-p-type drain region 153 are formed by selective ion doping into the semiconductor substrate 52.

Next, as shown in FIGS. 69A and 69B and FIGS. 70A and 70B, sidewalls 78, 103, 114, 129, 137, 149, and 157 are simultaneously formed at each of the side faces of the floating gate 76 and the control gate 77 and the side faces of the gate electrodes 102, 113, 128, 136, 148, and 156 of the CMOS region 54. The sidewalls 78, 103, 114, 129, 137, 149, and 157 are formed, after an insulating film such as a silicon nitride film is formed entirely over the semiconductor substrate 52 by, for example, a CVD method, by etching back the insulating film by dry etching.

Next, as shown in FIGS. 71A and 71B and FIGS. 72A and 72B, an n-type source region 73, an n-type drain region 74, a HV-n-type source region 94, a HV-n-type drain region 95, a HV-n-type source contact region 97, a HV-n-type drain contact region 98, a HV-p-type source region 105, a HV-p-type drain region 106, a HV-p-type source contact region 108, a HV-p-type drain contact region 109, a MV-n-type source contact region 130, a MV-n-type drain contact region 83, a MV-p-type source contact region 138, a MV-p-type drain contact region 139, a LV-n-type source contact region 150, a LV-n-type drain contact region 84, a LV-p-type source contact region 158, and a LV-p-type drain contact region 159 are formed by selective ion doping into the semiconductor substrate 52.

Next, a siliside is formed on the surface of each of the control gate 77, the HV-nMOS gate electrode 102, the HV-pMOS gate electrode 113, the MV-nMOS gate electrode 128, the MV-pMOS gate electrode 136, the LV-nMOS gate electrode 148, the LV-pMOS gate electrode 156, the n-type source region 73, the n-type drain region 74, the HV-n-type source contact region 97, the HV-n-type drain contact region 98, the HV-p-type source contact region 108, the HV-p-type drain contact region 109, the MV-n-type source contact region 130, the MV-n-type drain contact region 83, the MV-p-type source contact region 138, the MV-p-type drain contact region 139, the LV-n-type source contact region 150, the LV-n-type drain contact region 84, the LV-p-type source contact region 158, and the LV-p-type drain contact region 159.

Thereafter, as shown in FIGS. 27A and 27B and FIGS. 28A and 28B, after an interlayer insulating film 160 is formed, various contact plugs 163 and wirings 161 are formed. Next, a surface protective film 168 made of an insulating material such as silicon nitride is formed so as to coat the interlayer insulating film 160 and the respective wirings 161 in the memory cell region 53 and the CMOS region 54, and openings (not shown) to expose the respective electrodes as pads for wire bonding are formed in the surface protective film 168.

Through the above steps, the semiconductor device 51 including the memory cell region 53 and the CMOS region 54 shown in FIGS. 26A and 26B to FIG. 28A and 28B is obtained. In addition, a plurality of interlayer insulating films 160 may be stacked.

As above, in the present second reference example, for the trenches 60 formed in the semiconductor substrate 52, the first material layer 62 is buried up to the halfway portion in the depth direction thereof. Therefore, the aspect ratio of the trenches 60 into which the second material layer 63 needs to be buried can be made lower than the aspect ratio of the trenches 60 when the first material layer 62 is buried.

That is, even if with any aspect ratio the trenches 60 are formed, the aspect ratio of the trenches 60 when the second material layer 63 is buried can be adjusted by the first material layer 62.

Also, because the aspect ratio of the part demarcated by the upper face of the first material layer 62 and side faces of the trench 60 above said upper face can be adjusted, the second material layer 63 can be buried in a range where the occurrence of voids can be effectively suppressed. As a result, the occurrence of a leak current in the element separation portion 55 caused by said voids can be effectively suppressed.

Moreover, because the occurrence of a leak current in the element separation portion 55 can be suppressed, a highly reliable semiconductor element region can be formed in the memory cell region 53 and each region of the HV-CMOS region 90, the MV-CMOS region 120, and the LV-CMOS region 140.

The first and second reference examples of the present invention have been described above, however, said reference examples can also be carried out in other modes.

For example, an arrangement for which the respective semiconductor parts of the semiconductor device 51, 201 are inverted in conductivity type may be adopted. For example, in the semiconductor device 51, 201, the p-type parts may be n-type, and the n-type parts may be p-type. Thus, the MOSFET that composes the memory cell 53, 2 may be a p-type MOSFET as described above, or may be an n-type MOSFET.

Also, the buried film 65, 34 having a two-layer structure has been described as an example, however, the buried film 65, 34 may have a multi-layer structure of, for example, three layers, four layers, and more than four layers as long as it is a stacked structure of mutually different material layers. The buried film 65, 34 may have a three-layer structure in which a polysilicon layer, a silicon nitride (SiN) layer, and a silicon oxide ($SiO_2$) layer are stacked in this order.

Also, around the memory cell region 53, 2 and the CMOS region 54, a peripheral circuit region formed with various elements such as a charge pump, a Zener diode, and a MIS transistor may be set.

In addition, from the contents of the first and second reference examples, the following features can be extracted besides the inventions described in the claims.

(Section 1)

A semiconductor device including:

a semiconductor substrate selectively including a semiconductor element; and an element separation portion formed in the semiconductor substrate, for demarcating an active region in a region for the semiconductor element, wherein the element separation portion includes a trench formed in the semiconductor substrate, a first material layer buried via an insulating film up to a halfway portion in a depth direction of the trench, and a second material layer different from the first material layer, buried into a part on the first material layer of the trench.

According to this arrangement, for the trenches formed in the semiconductor substrate, the first material layer is buried up to the halfway portion in the depth direction thereof. Therefore, the aspect ratio of the trenches into which the second material layer needs to be buried can be made lower than the aspect ratio of the trenches when the first material layer is buried. That is, even if with any aspect ratio the trenches are formed, the aspect ratio of the trenches when the second material layer is buried can be adjusted by the first material layer.

Accordingly, void generation in the element separation portion can be suppressed, while the first material layer and the second material layer can be buried into the trench to form an element separation portion. As a result, the occurrence of a leak current in the element separation portion caused by said voids can be effectively suppressed.

(Section 2)

The semiconductor device according to section 1, wherein a part demarcated by an upper face of the first material layer and side faces of the trench above said upper face has an aspect ratio of 4 or less.

In this arrangement, by adjusting the aspect ratio of the part demarcated by the upper face of the first material layer and side faces of the aforementioned trench above said upper face, the second material layer can be buried in a range where the occurrence of voids can be effectively suppressed. As a result, the occurrence of a leak current in the element separation portion caused by said voids can be effectively suppressed.

(Section 3)

The semiconductor device according to section 1 or 2, wherein the element separation portion includes an STI (Shallow Trench Isolation) structure.

(Section 4)

The semiconductor device according to section 3, wherein the trench has an aspect ratio of 4 or more.

(Section 5)

The semiconductor device according to section 3 or 4, wherein the trench has a depth of 50 nm to 500 nm.

In this arrangement, because the aspect ratio of the trenches when the second material layer is buried can be adjusted by the first material layer, even when an STI structure consisting of trenches having a high aspect ratio is formed as in sections 3 to 5, the second material layer can be satisfactorily buried.

(Section 6)

The semiconductor device according to any one of sections 1 to 5, wherein the trench is formed in a tapered shape to have a narrower width in its depth direction.

(Section 7)

The semiconductor device according to any one of sections 1 to 6, wherein the first material layer is made of polysilicon, and the second material layer is made of silicon oxide.

In this arrangement, using polysilicon excellent in burying ability for the first material layer allows satisfactorily burying the first material layer into the trenches.

(Section 8)

The semiconductor device according to any one of sections 1 to 7, wherein the semiconductor element includes a non-volatile memory.

(Section 9)

The semiconductor device according to any one of sections 1 to 8, wherein the semiconductor element includes a CMOS transistor.

In this arrangement, because the occurrence of a leak current in the element separation portion can be effectively suppressed, a semiconductor device including a highly reliable semiconductor element can be achieved as in sections 8 and 9.

(Section 10)

A method for manufacturing a semiconductor device including:

a step of forming a trench in a semiconductor substrate in order to demarcate an active region in a region for a semiconductor element of the semiconductor substrate;

a step of burying a first material layer via an insulating film up to a halfway portion in a depth direction of the trench; and a step of burying a second material layer into a part on the first material layer of the trench.

According to this method, a semiconductor device that provides the same effects as those described regarding the semiconductor device according to section 1 can be manufactured.

(Section 11)

The method for manufacturing a semiconductor device according to section 10, wherein the step of burying the first material layer includes a step of burying the first material layer into the trench such that a part demarcated by an upper face of the first material layer and side faces of the trench above said upper face has an aspect ratio of 4 or less.

By this method, a semiconductor device that provides the same effects as those described regarding the semiconductor device according to section 2 can be manufactured.

(Section 12)

The method for manufacturing a semiconductor device according to section 10 or 11, wherein the step of burying the first material layer includes a step of burying the first material layer so as to fill the trench, and then etching said first material layer in a depth direction of the trench such that an upper surface of said first material layer becomes lower than a surface of the semiconductor substrate.

By this method, the aspect ratio of the part into which the second material layer needs to be buried (the part demarcated by an upper face of aforementioned first material layer and side faces of aforementioned trench above said upper face) can be simply controlled by adjusting etching conditions.

(Section 13)

The method for manufacturing a semiconductor device according to any of sections 10 to 12, wherein the step of forming the first material layer includes a step of burying a polysilicon material by a low-pressure CVD (Chemical Vapor Deposition) method.

(Section 14)

The method for manufacturing a semiconductor device according to any of sections 10 to 13, wherein the step of burying the second material layer includes a step of burying silicon oxide by an HDP (High-Density Plasma) CVD method.

(Section 15)

The method for manufacturing a semiconductor device according to any of sections 10 to 14, including a step of forming the semiconductor film by thermally oxidizing an inner face of the trench prior to formation of the first material layer.

Second Embodiment

Figure 73A:
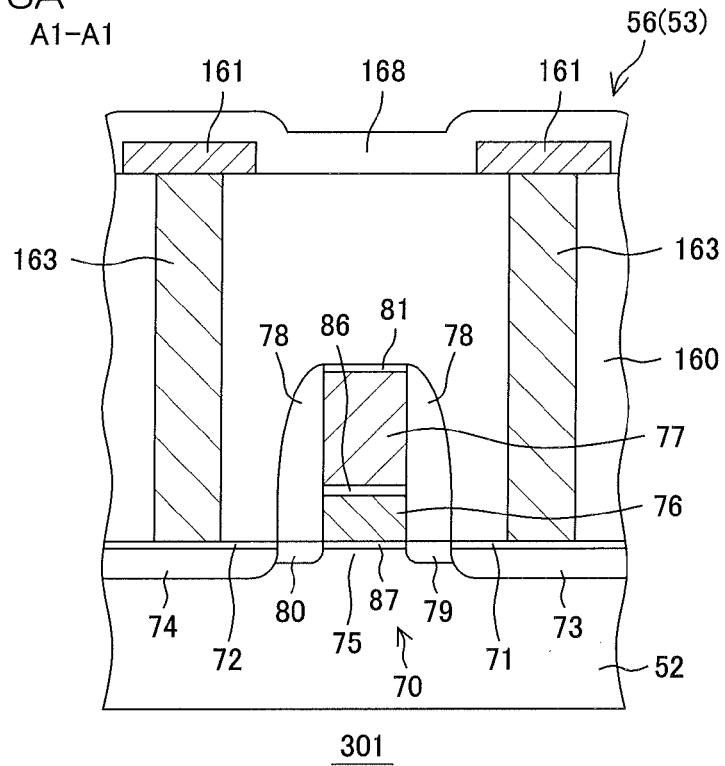
FIGS. 73A and 73B are sectional views of a semiconductor device according to a second preferred embodiment of the present invention.
Figure 73B:
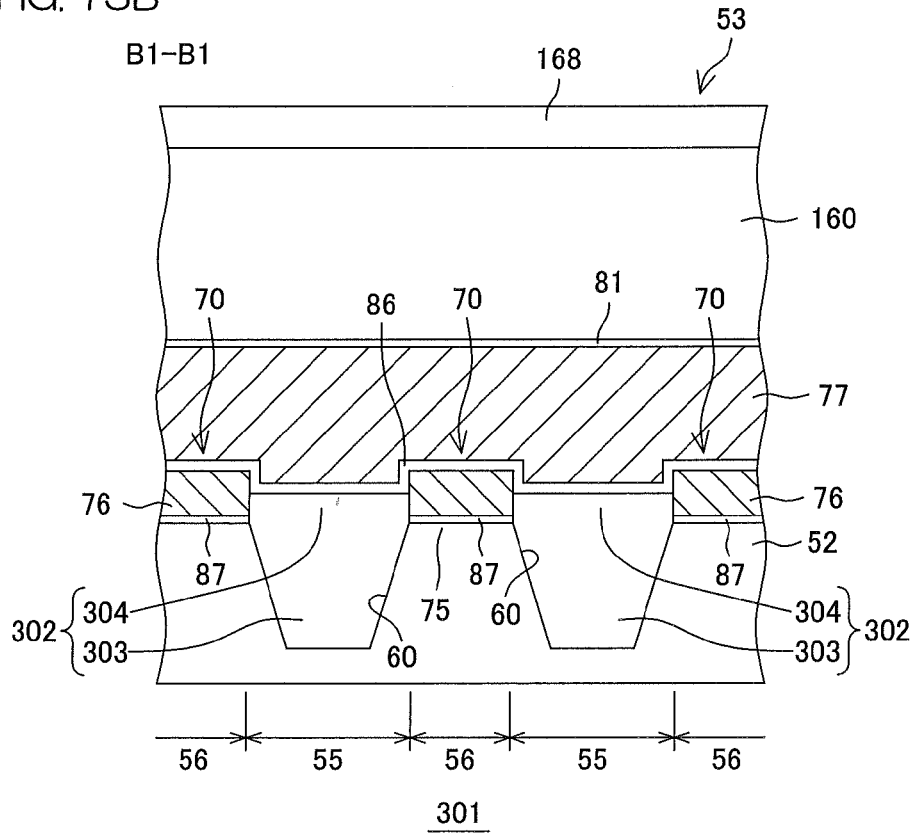
Figure 74A:
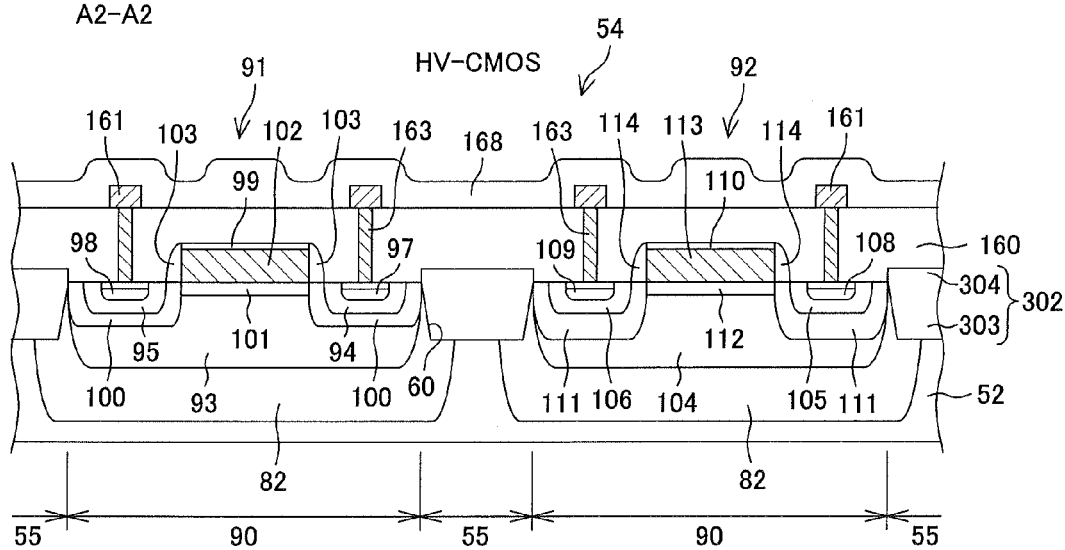
FIGS. 74A and 74B are sectional views of the semiconductor device according to the second preferred embodiment of the present invention.
Figure 74B:
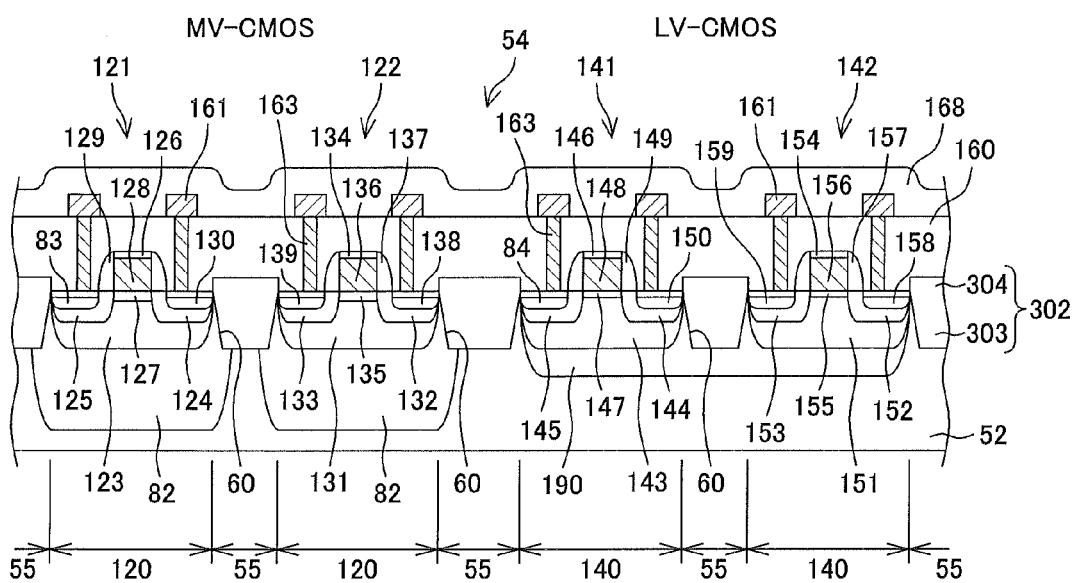
Figure 75A:
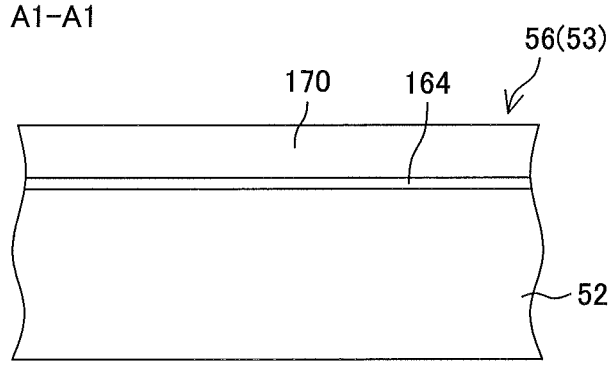
Figure 75B:
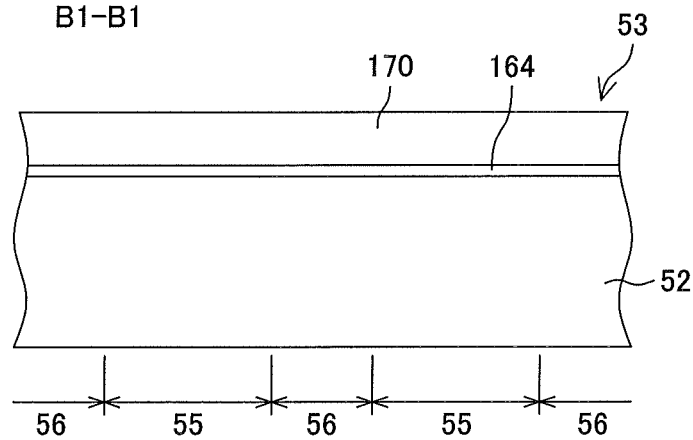
Figure 76A:
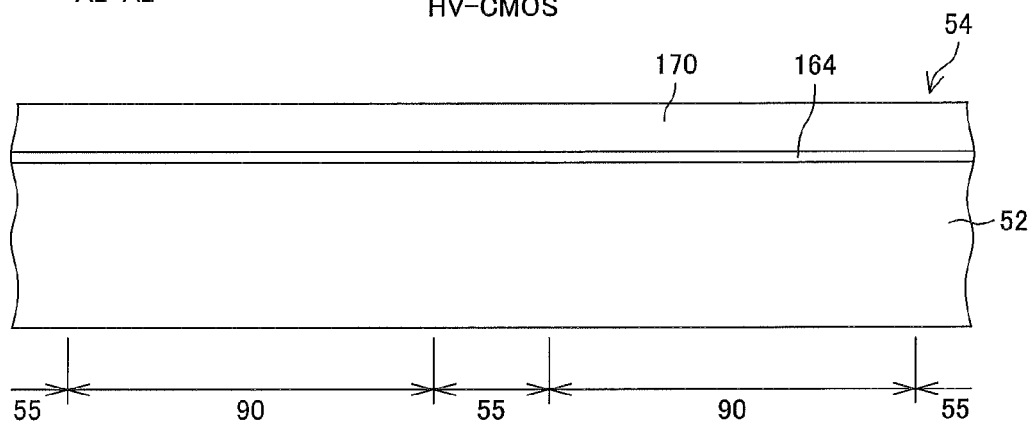
Figure 76B:
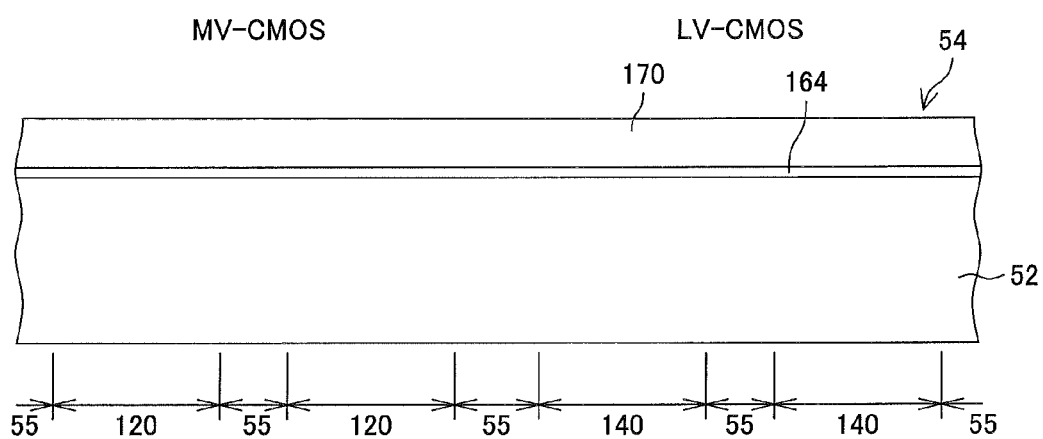
Figure 77A:
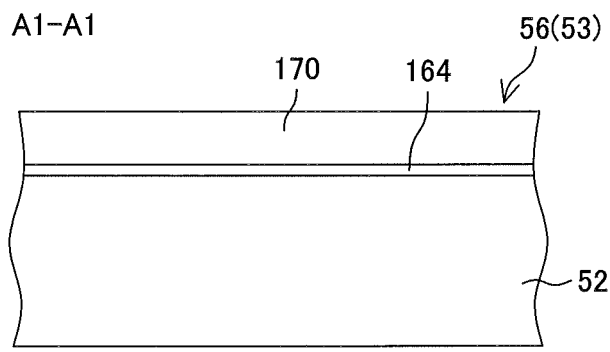
Figure 77B:
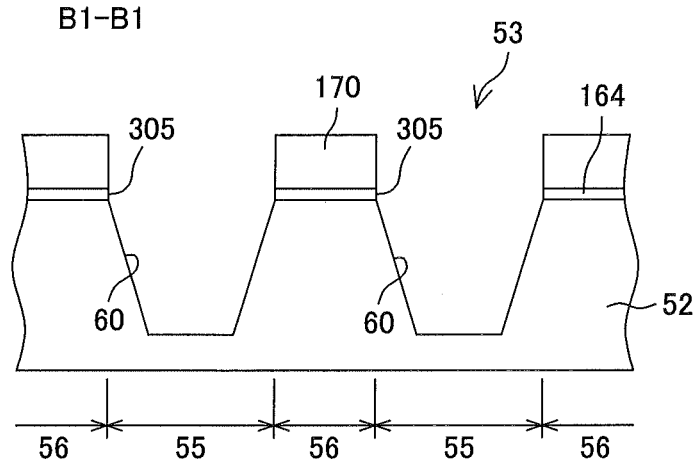
Figure 78A:
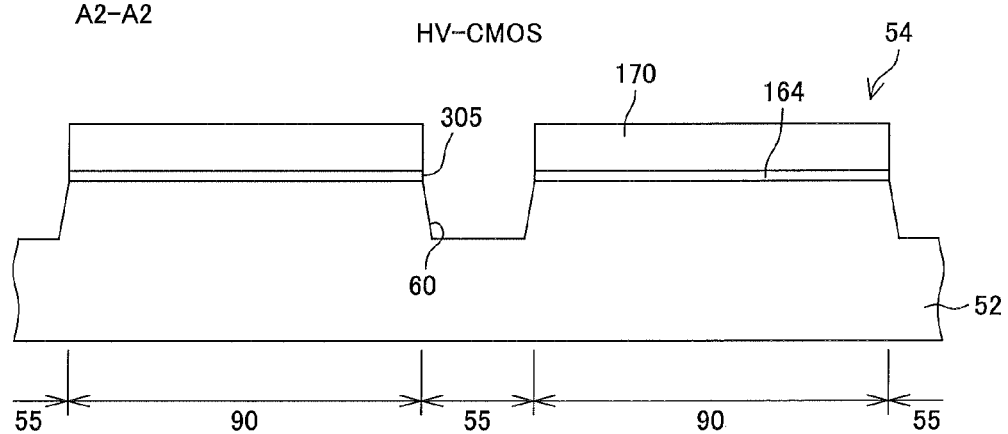
Figure 78B:
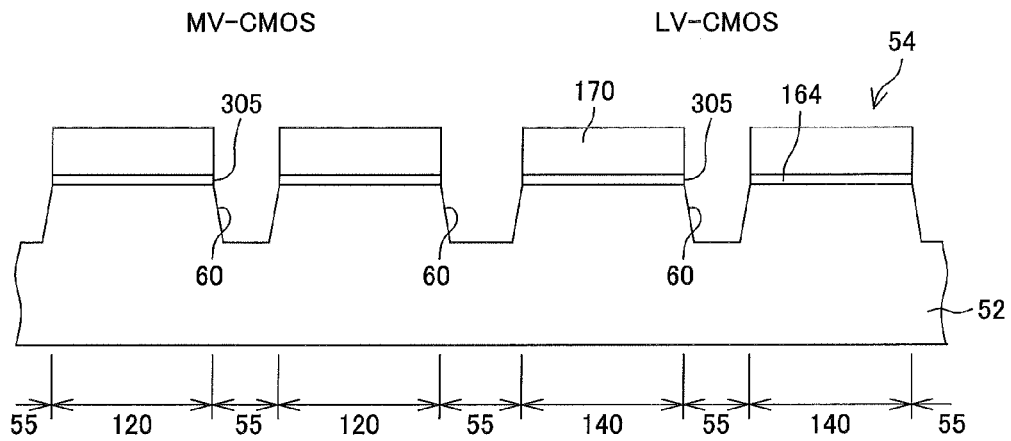
Figure 79A:
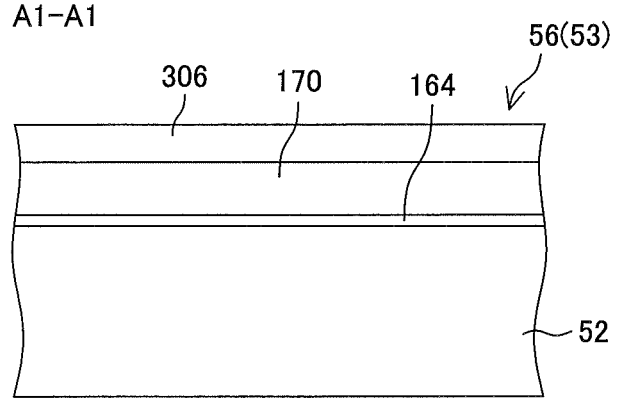
Figure 79B:
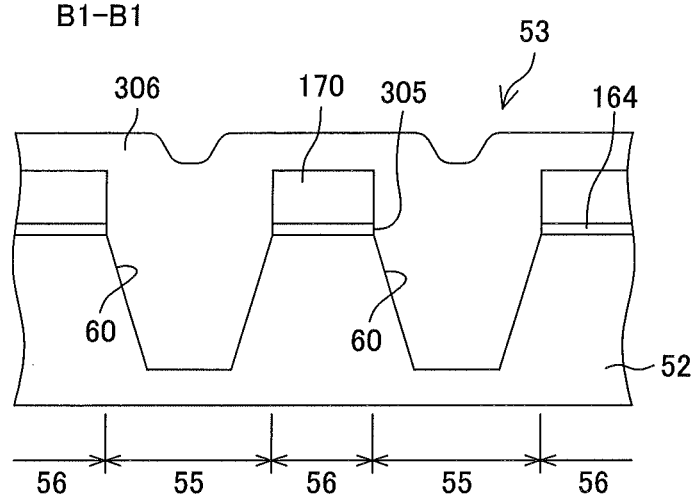
Figure 80A:
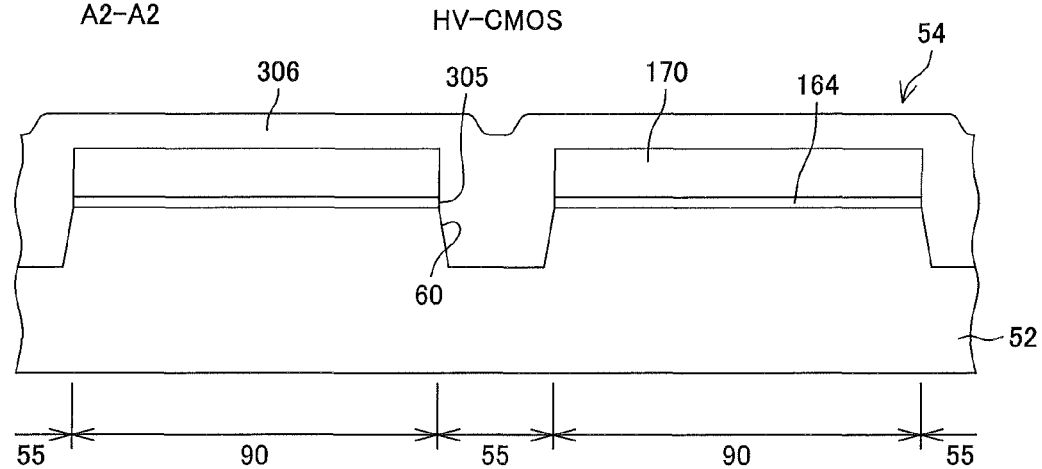
Figure 80B:
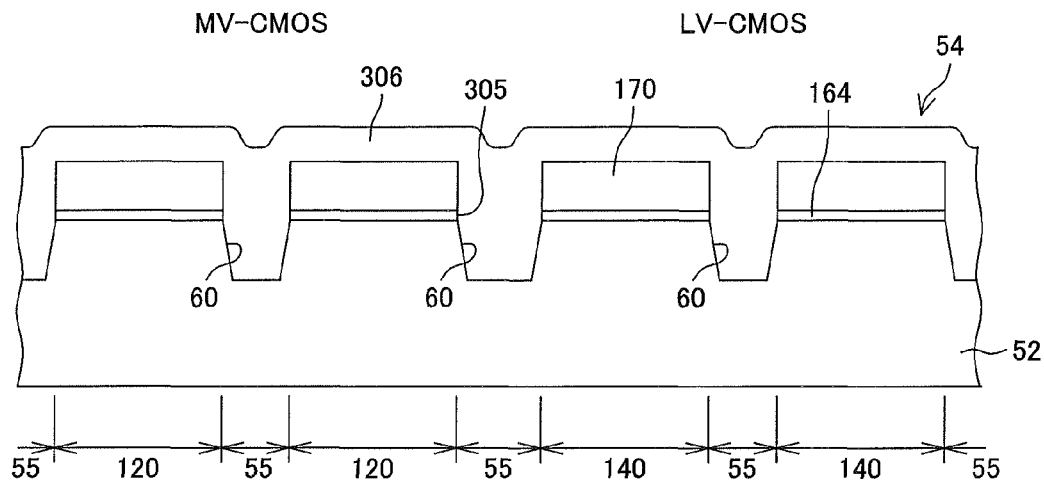
Figure 81A:
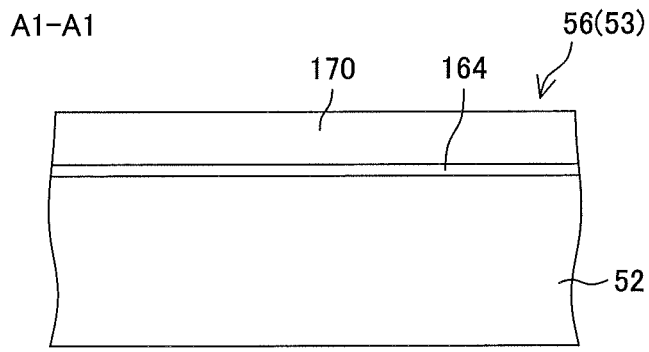
Figure 81B:
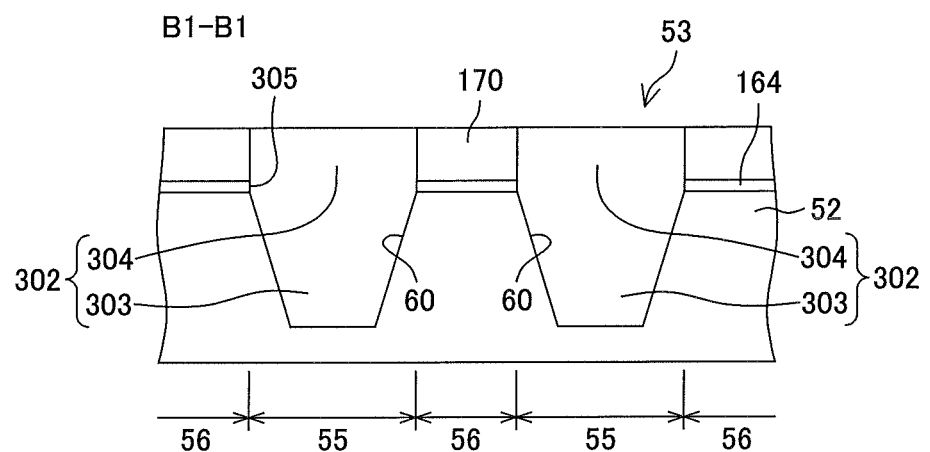
Figure 82A:
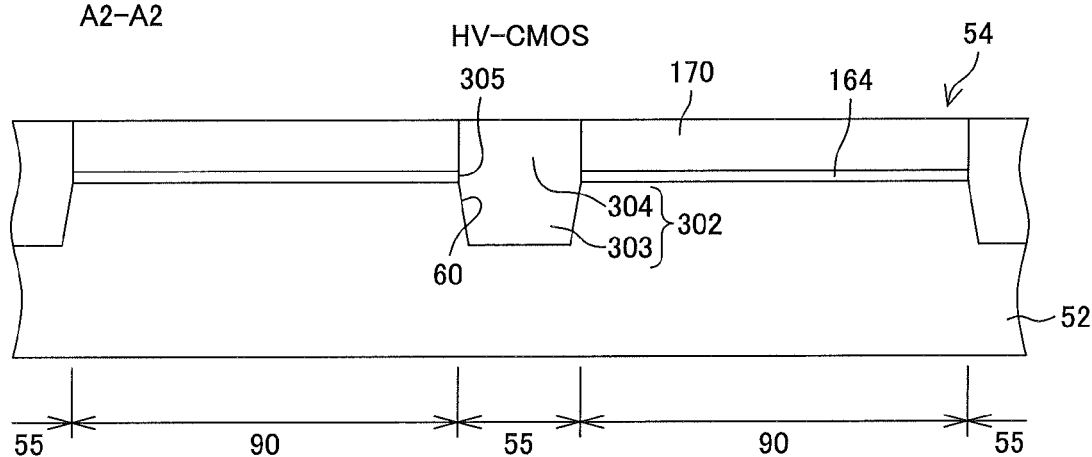
Figure 82B:
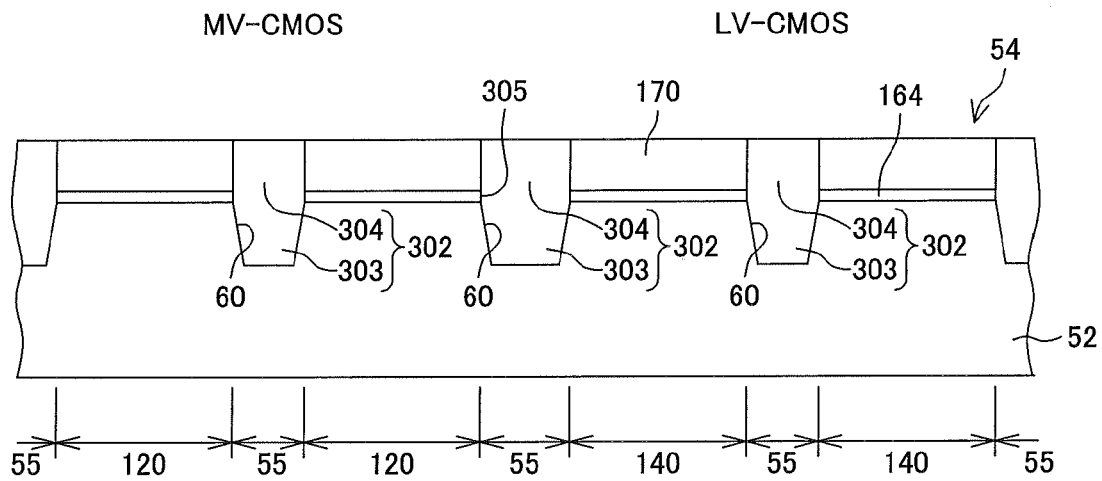
Figure 83A:
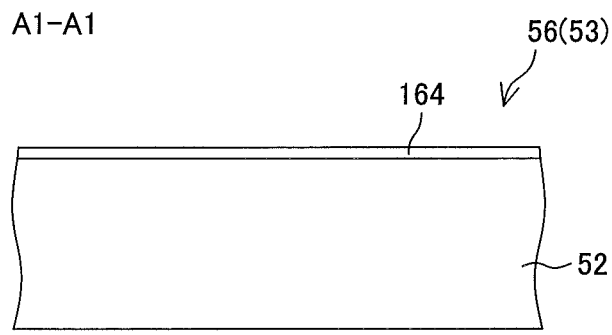
Figure 83B:
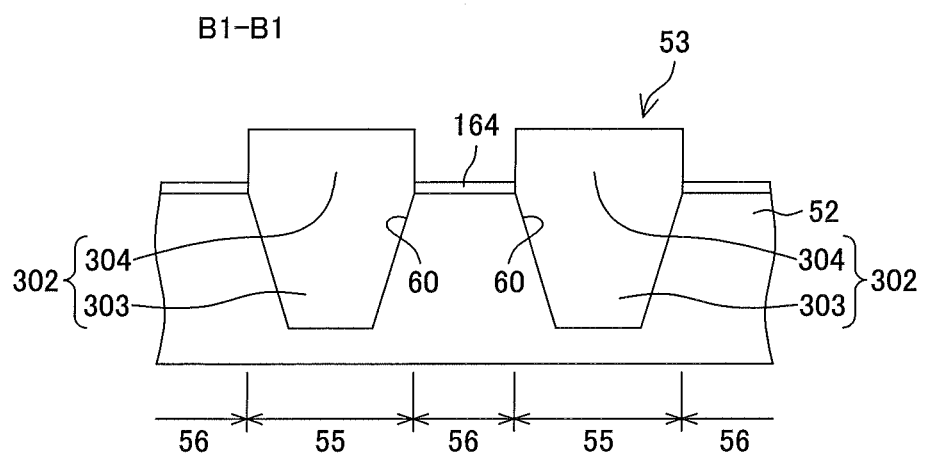
Figure 84A:
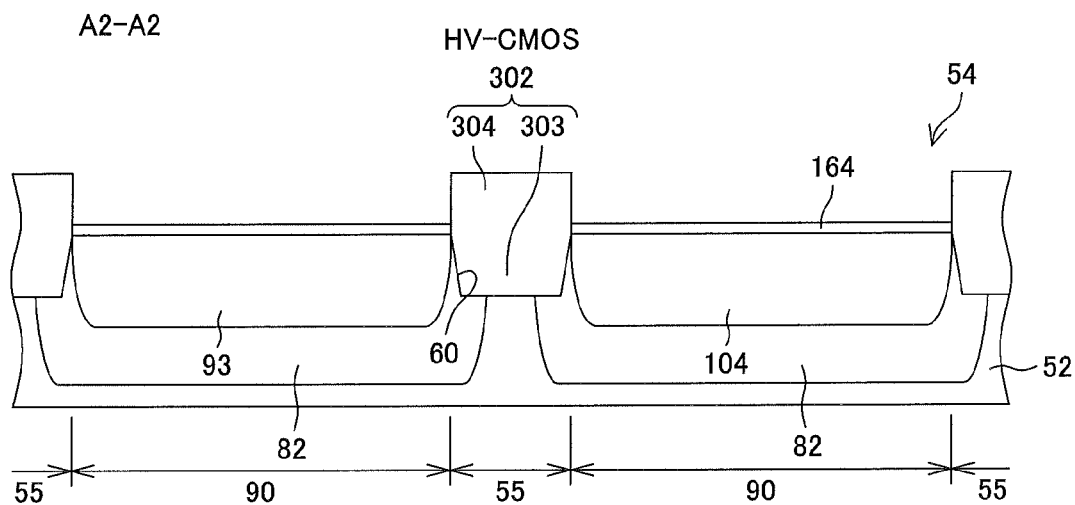
Figure 84B:
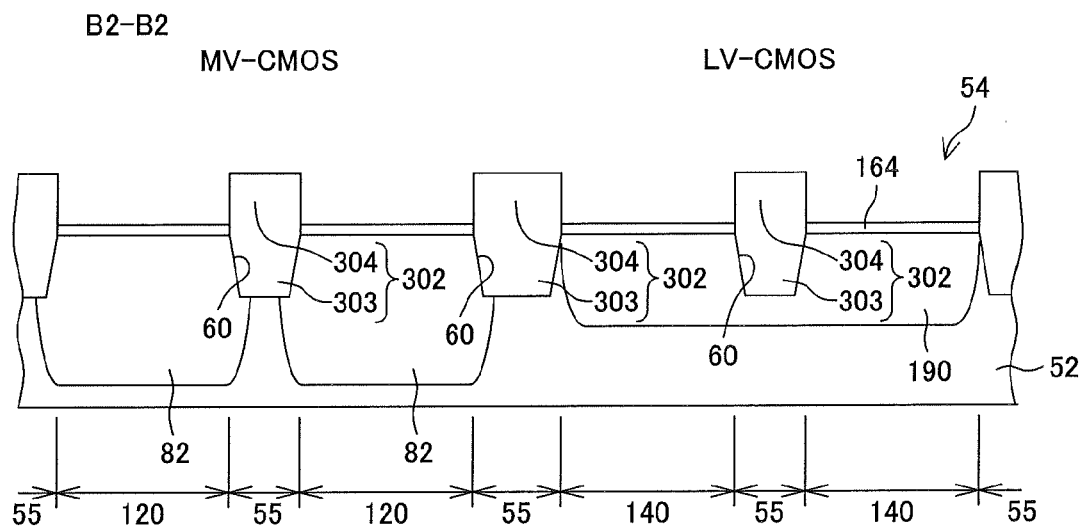
Figure 85A:
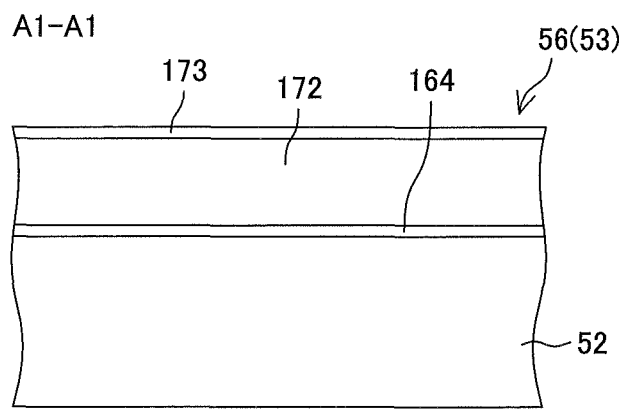
Figure 85B:
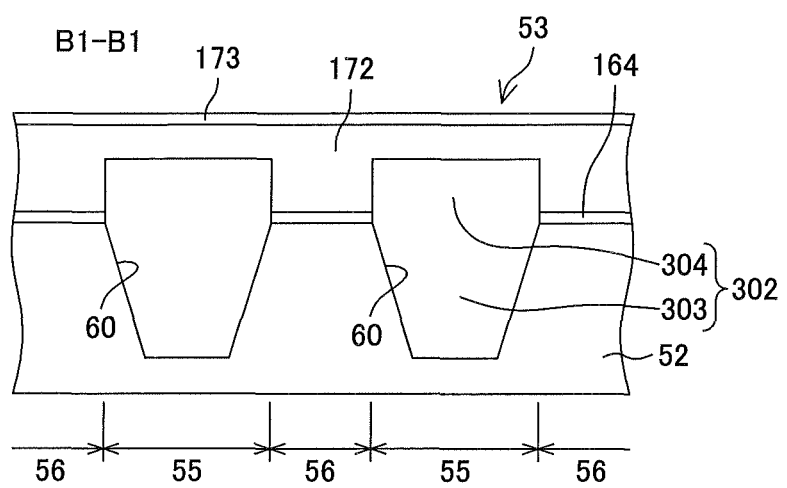
Figure 86A:
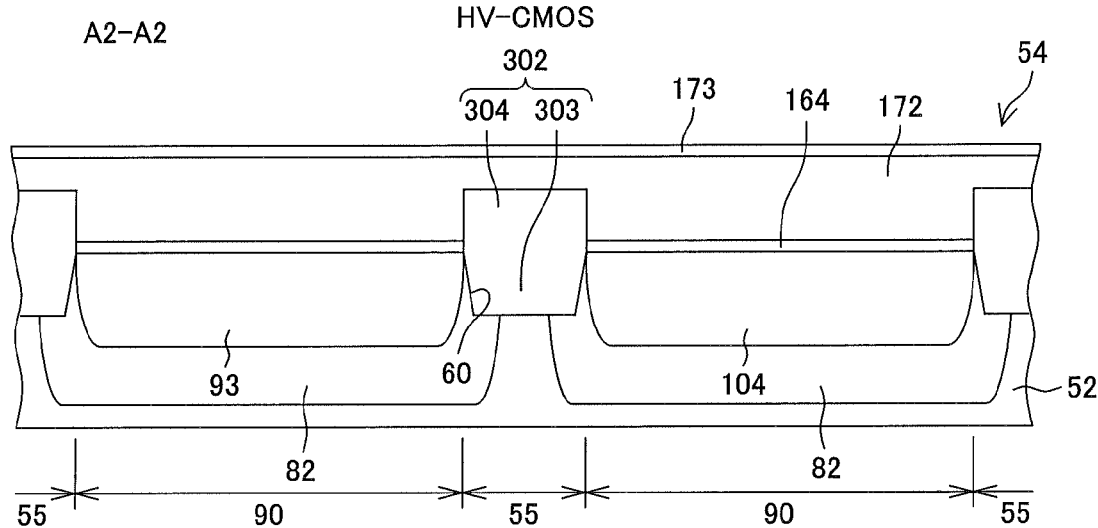
Figure 86B:
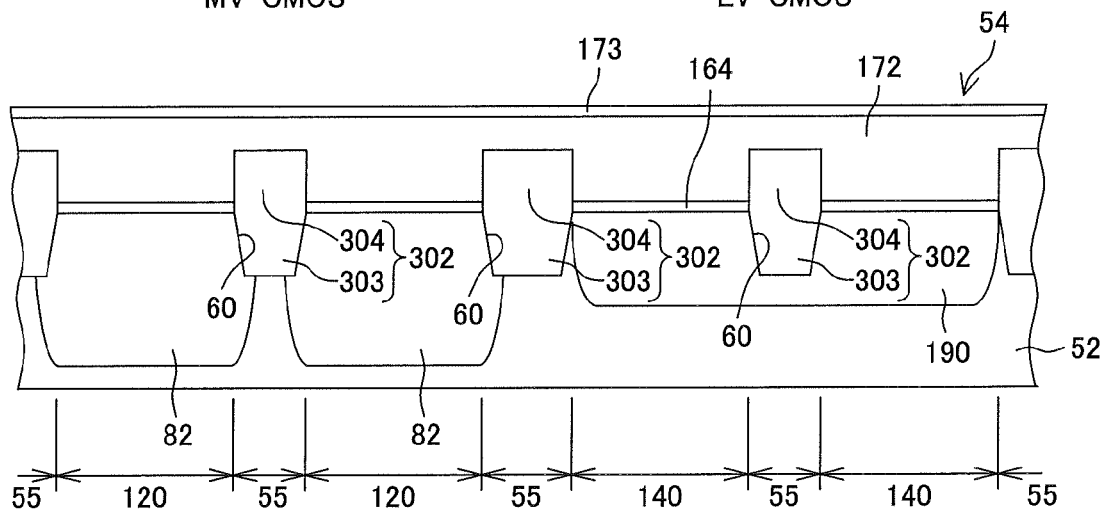
Figure 87A:
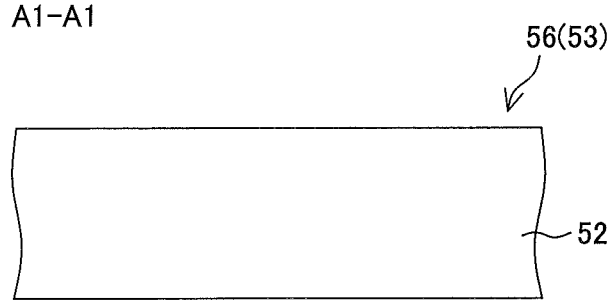
Figure 87B:
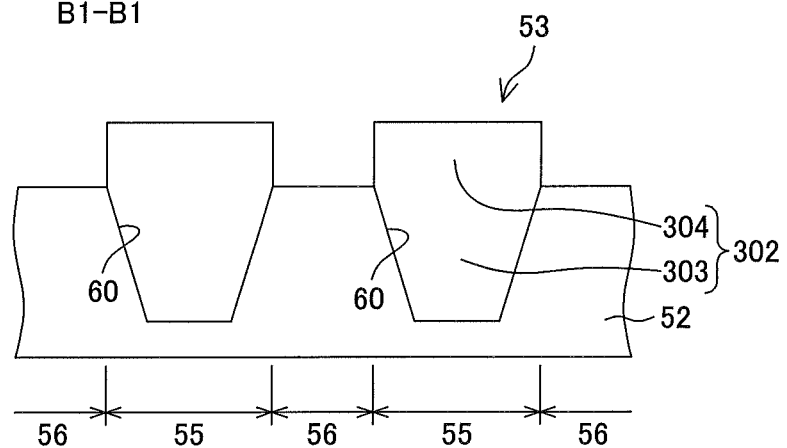
Figure 89A:
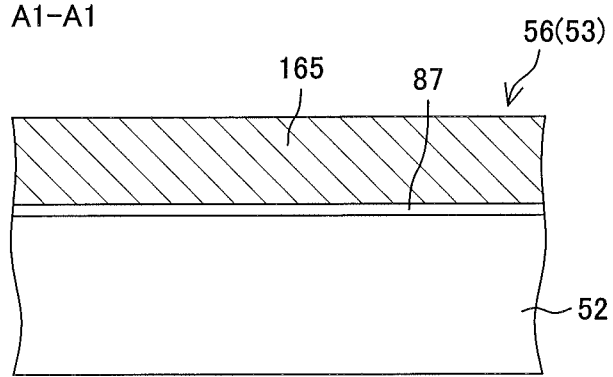
Figure 89B:
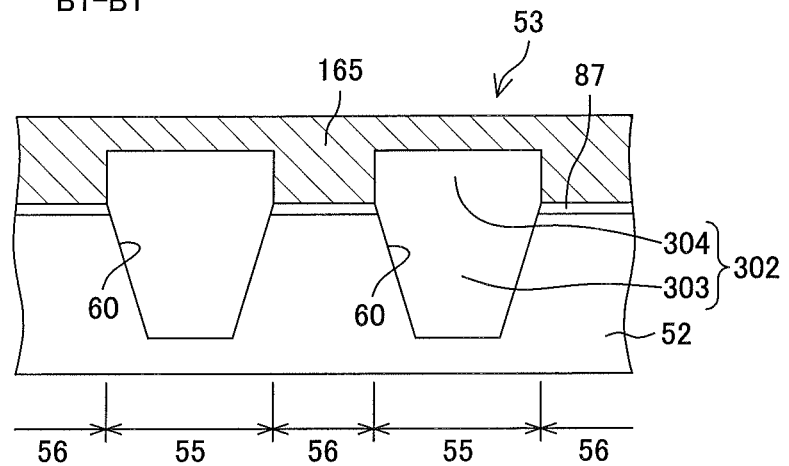
Figure 90A:
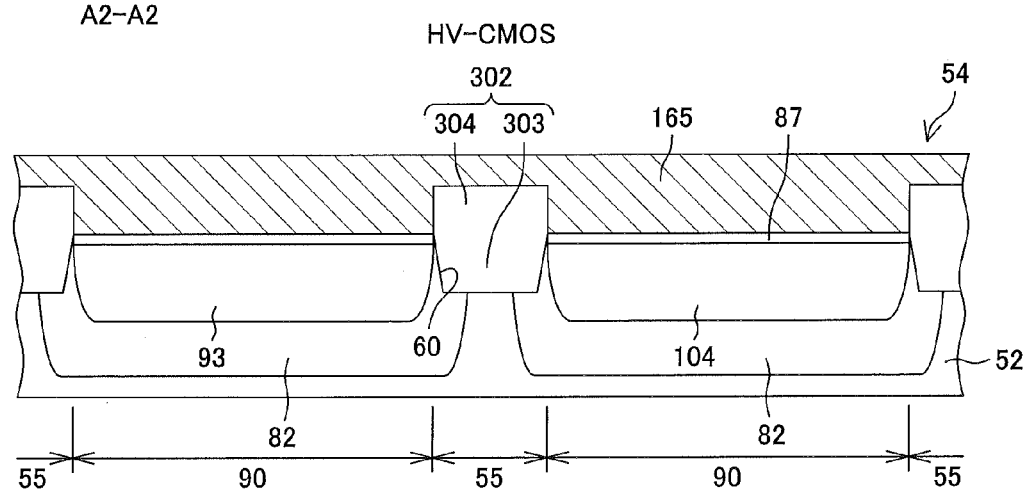
Figure 90B:
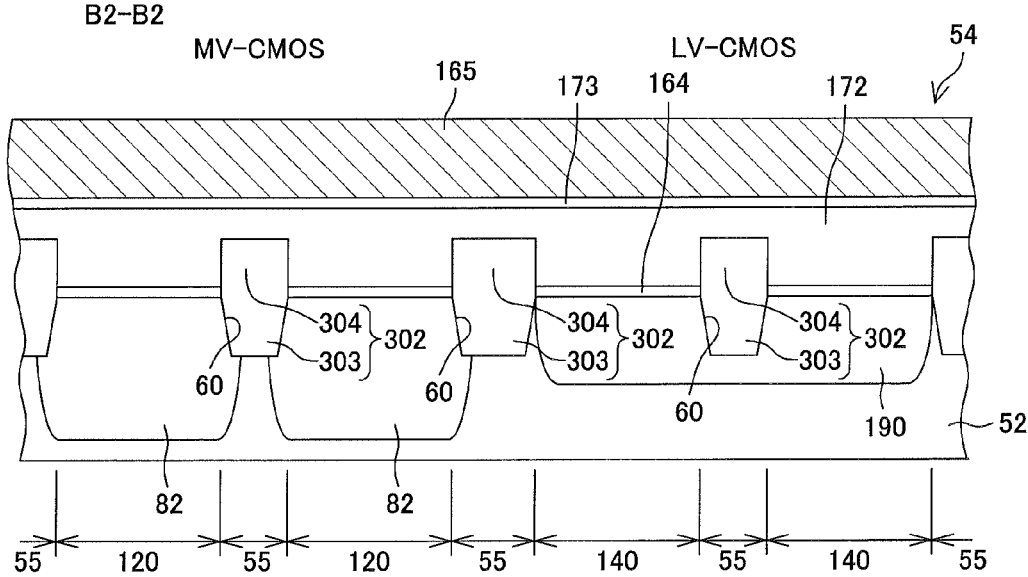
Figure 91A:
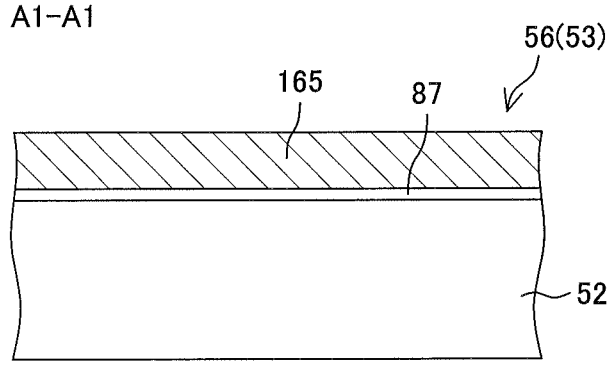
Figure 91B:
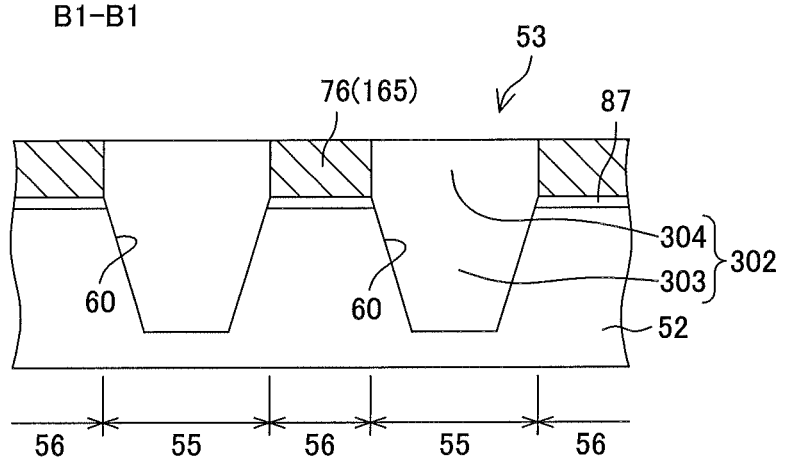
Figure 92A:
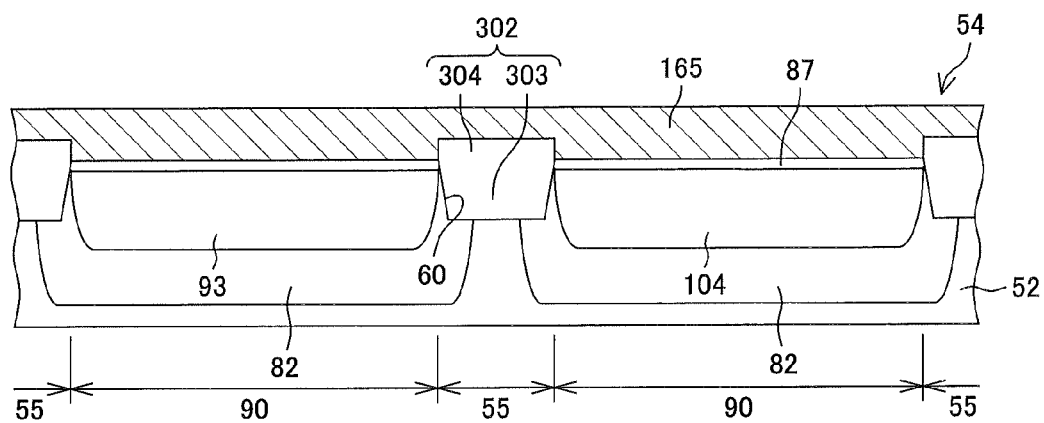
Figure 92B:
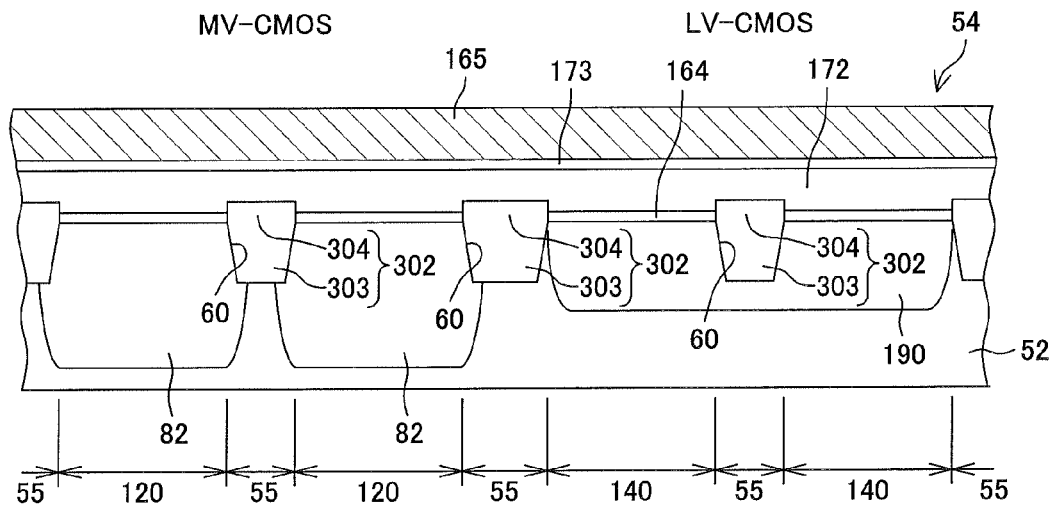
Figure 93A:
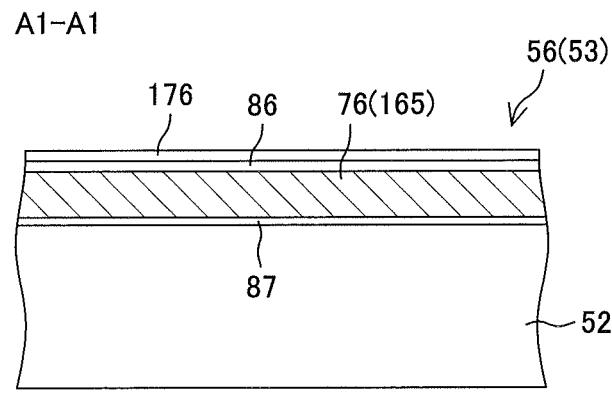
Figure 93B:
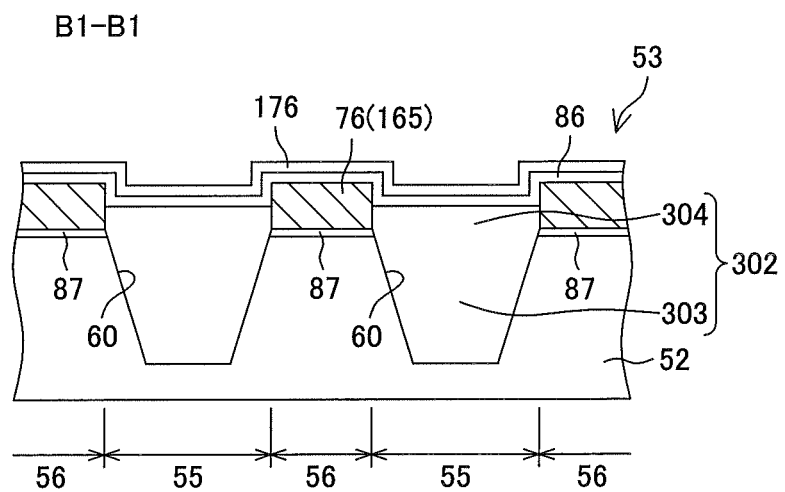
Figure 94A:
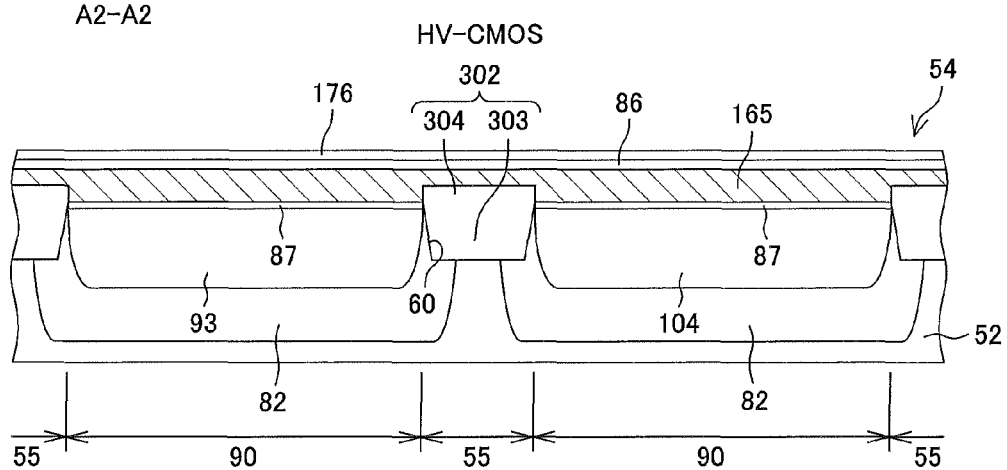
Figure 94B:
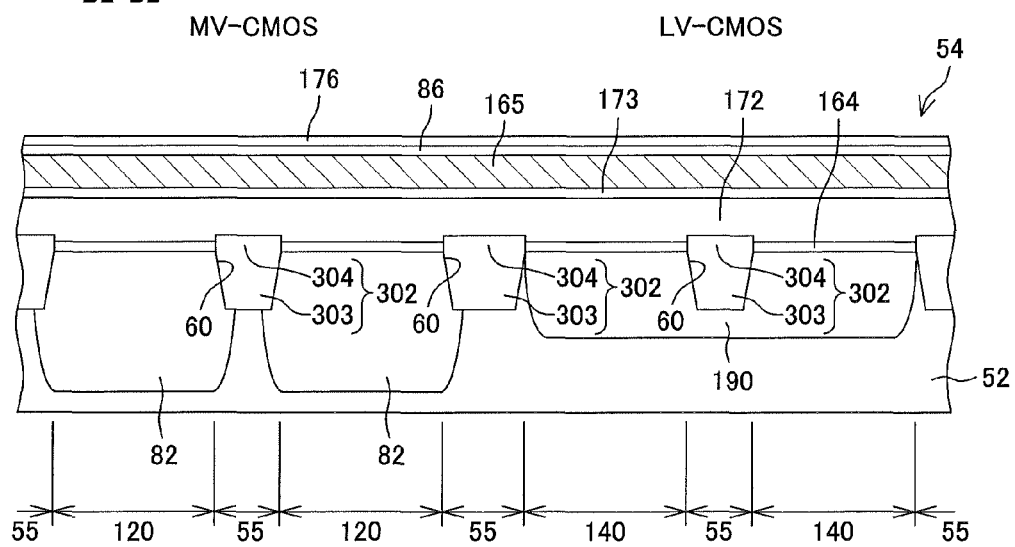
Figure 95A:
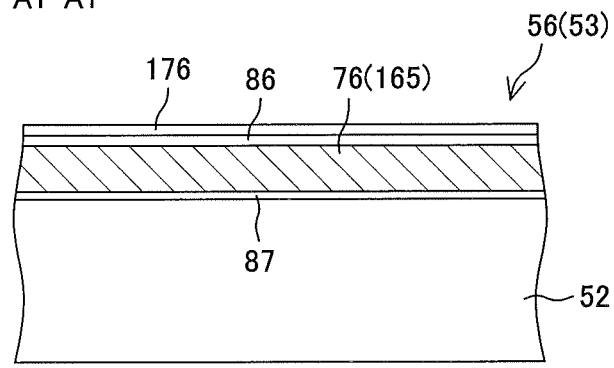
Figure 95B:
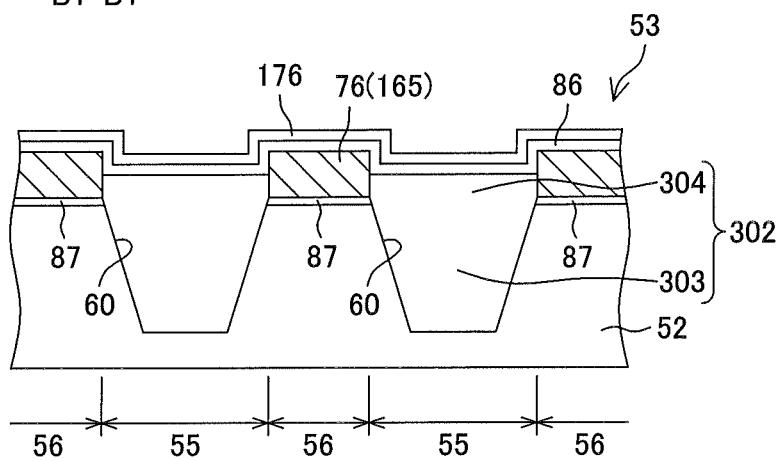
Figure 96A:
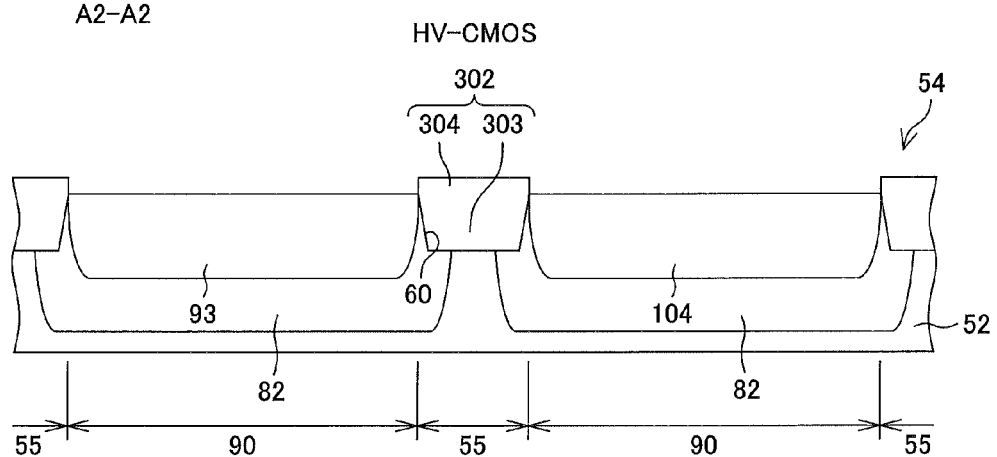
Figure 96B:
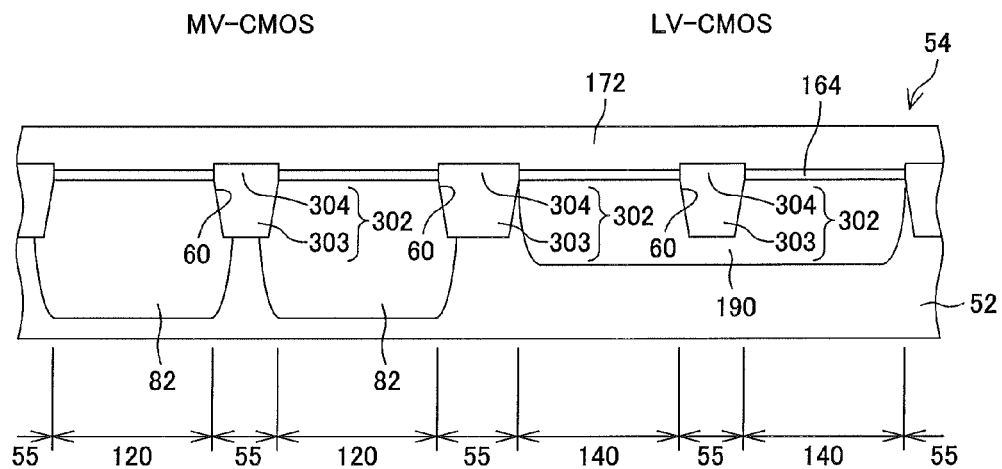
Figure 97A:
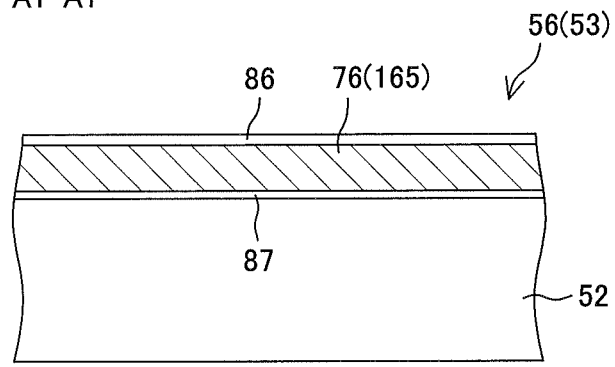
Figure 97B:
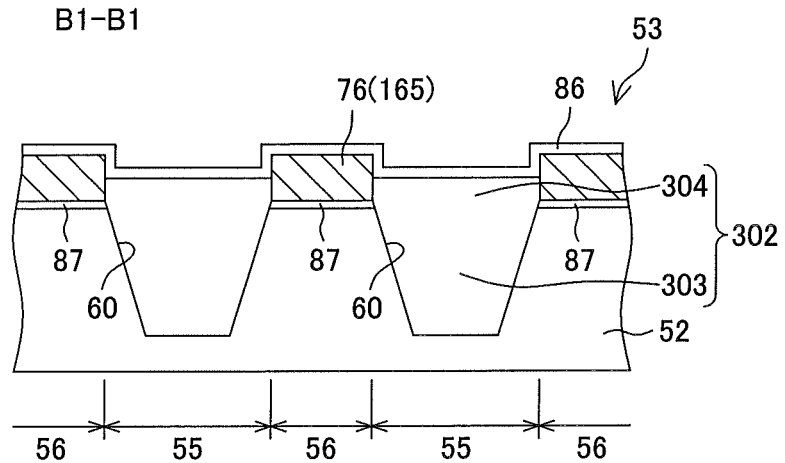
Figure 98A:
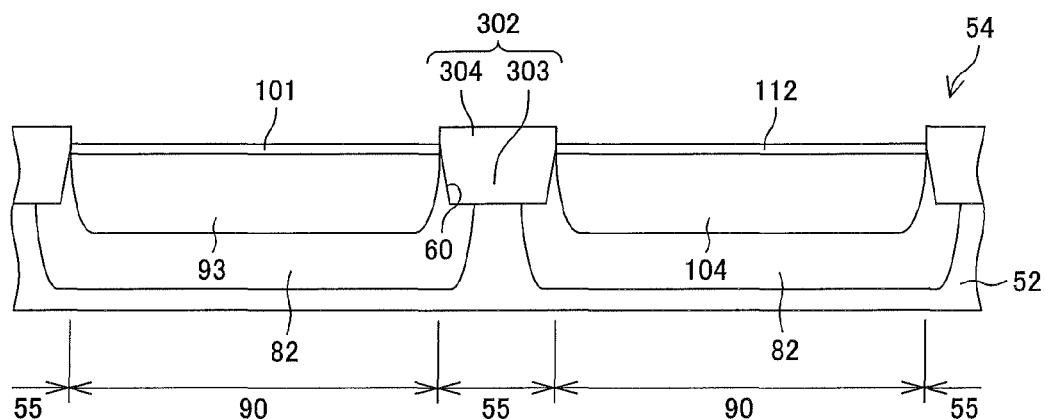
Figure 98B:
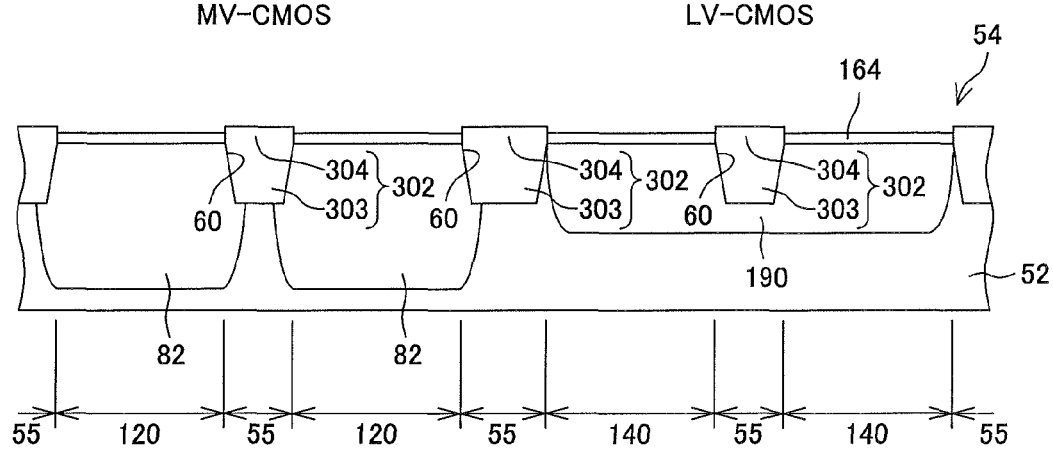
Figure 99A:
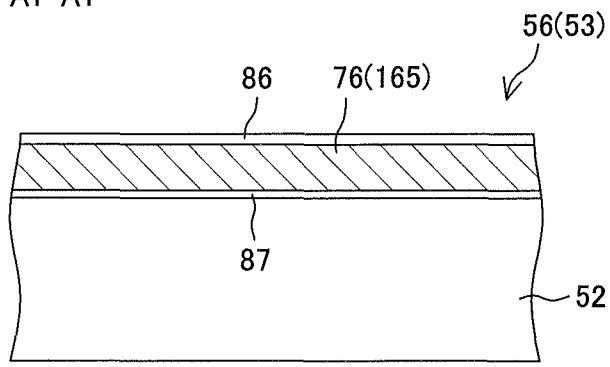
Figure 99B:
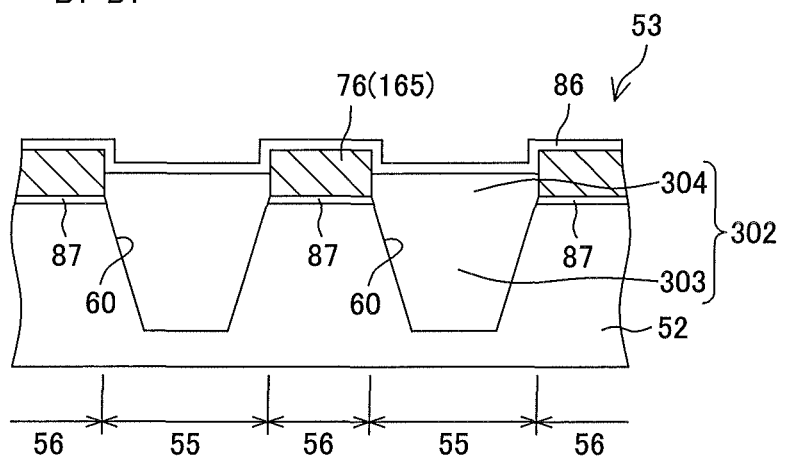
Figure 100A:
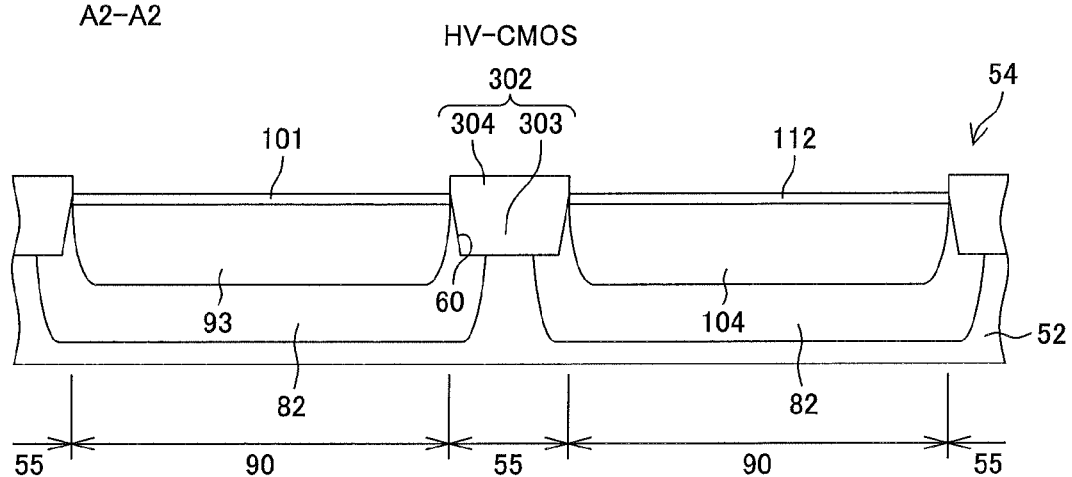
Figure 100B:
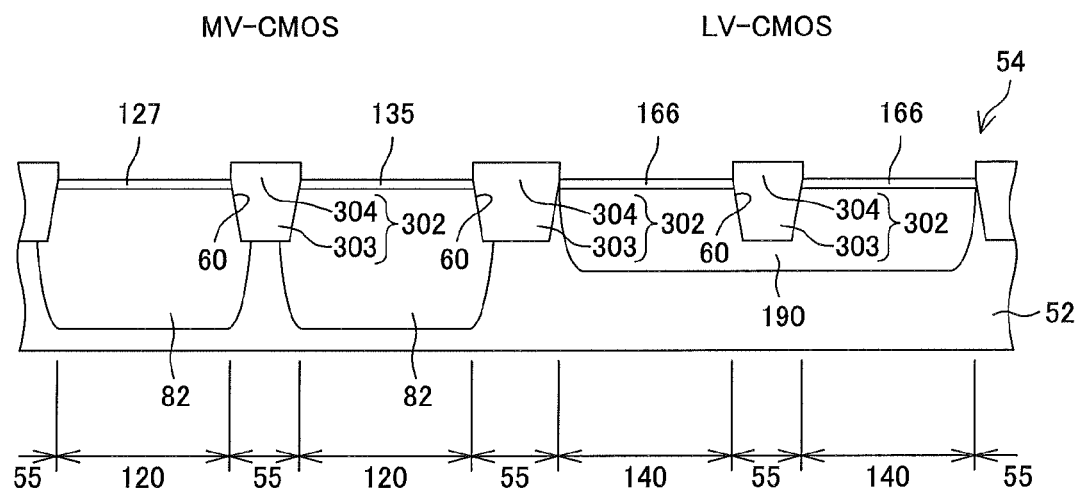
Figure 101A:
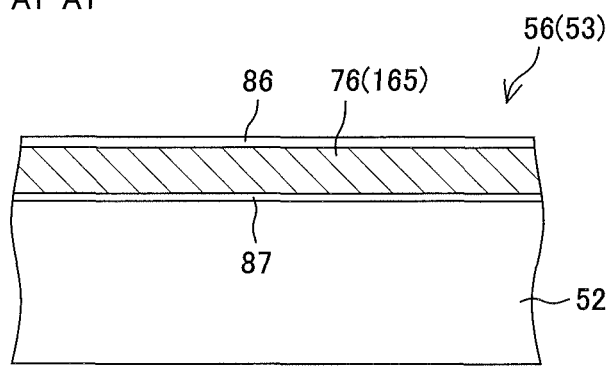
Figure 101B:
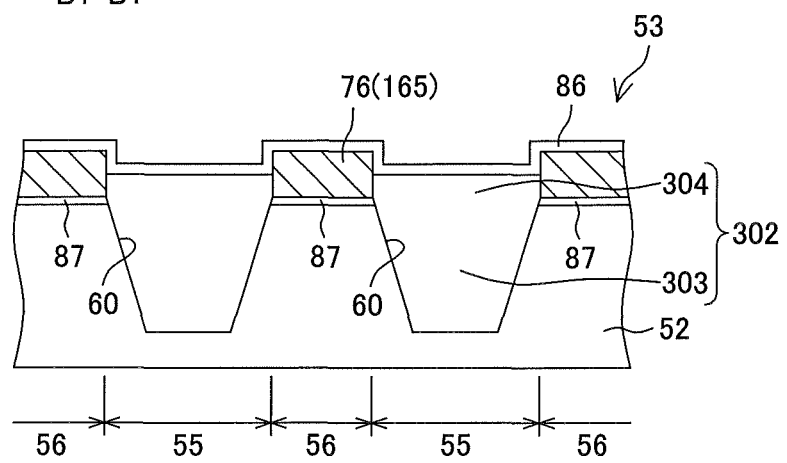
Figure 102A:
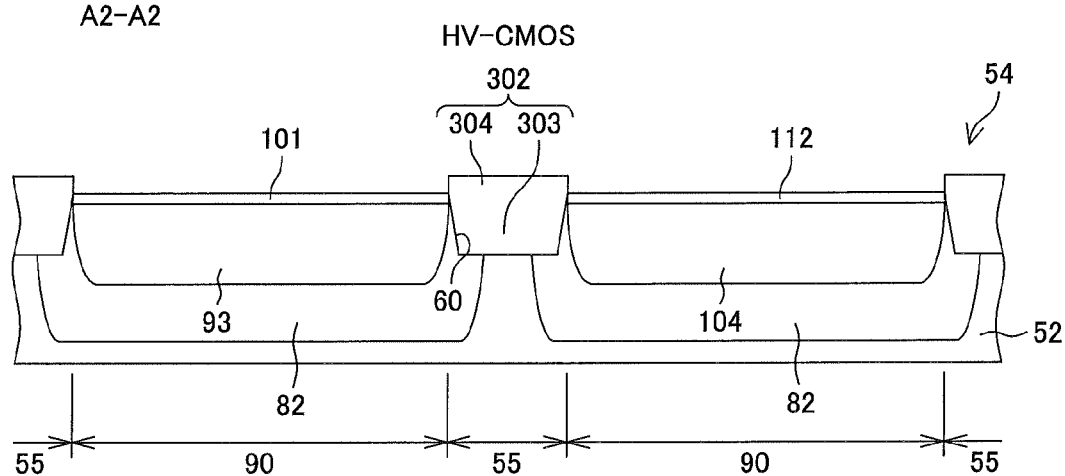
Figure 102B:
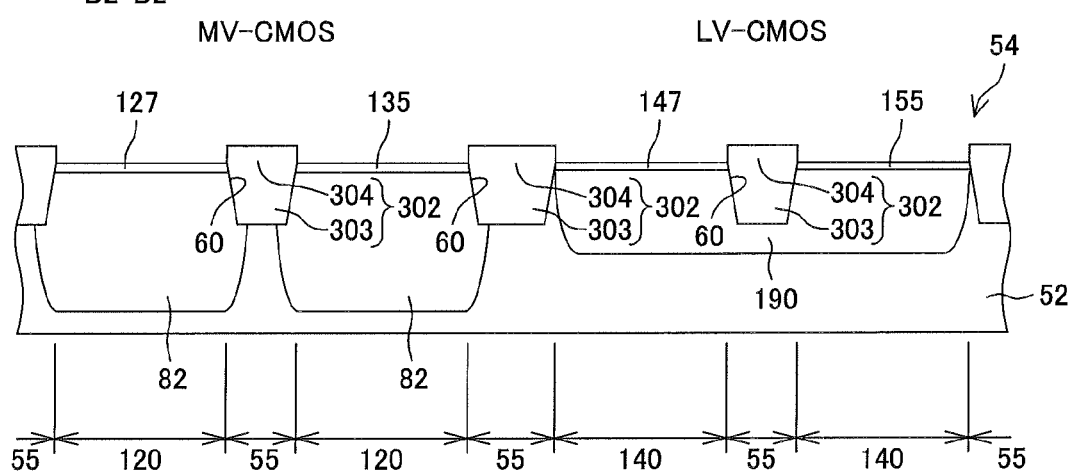
Figure 103A:
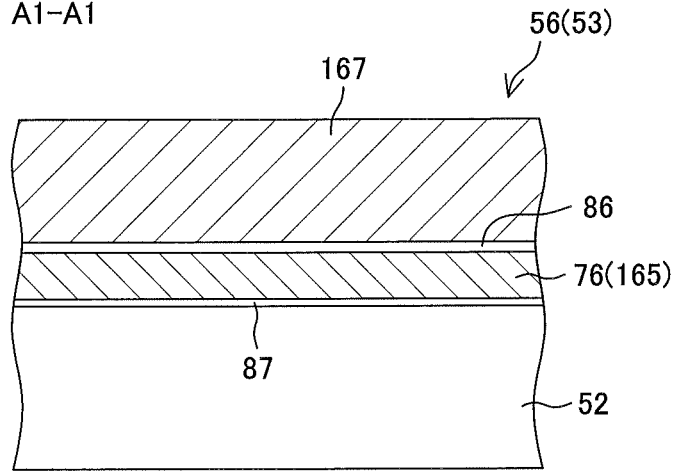
Figure 103B:
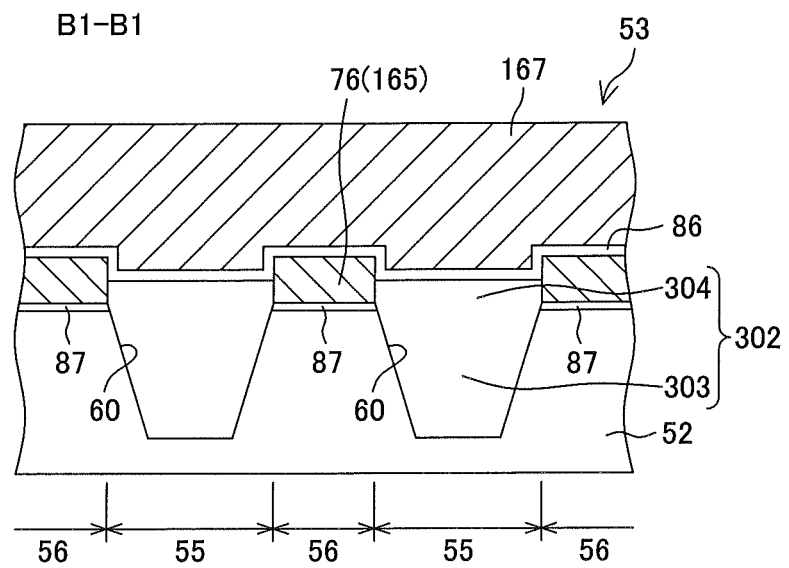
Figure 104A:
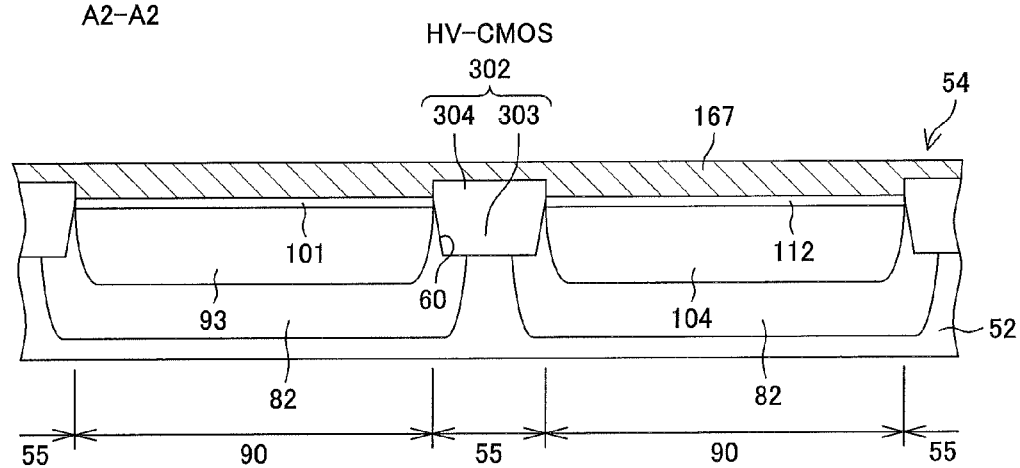
Figure 104B:
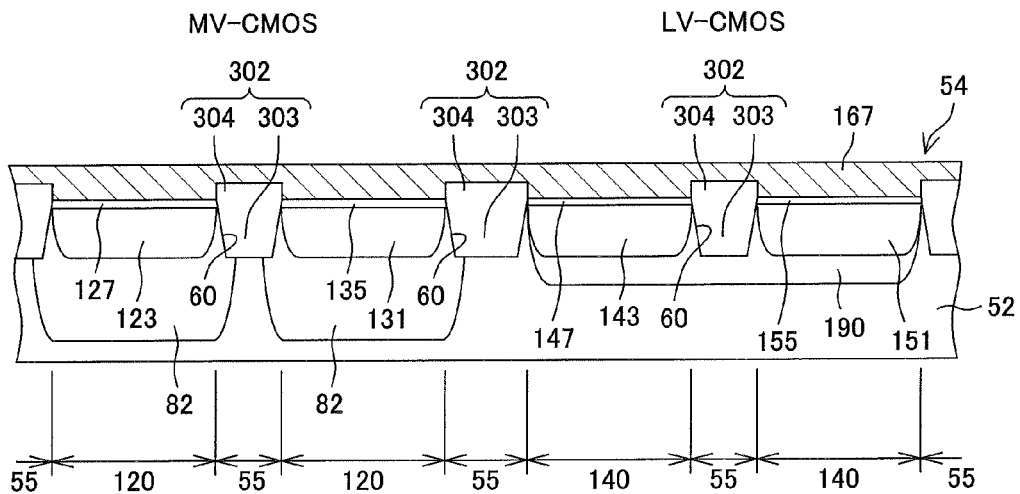
Figure 105A:
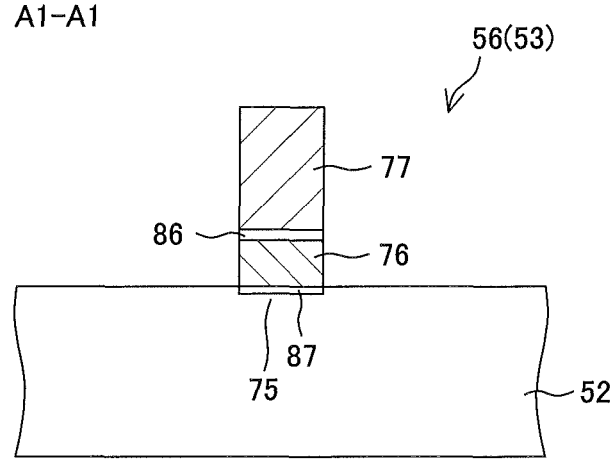
Figure 105B:
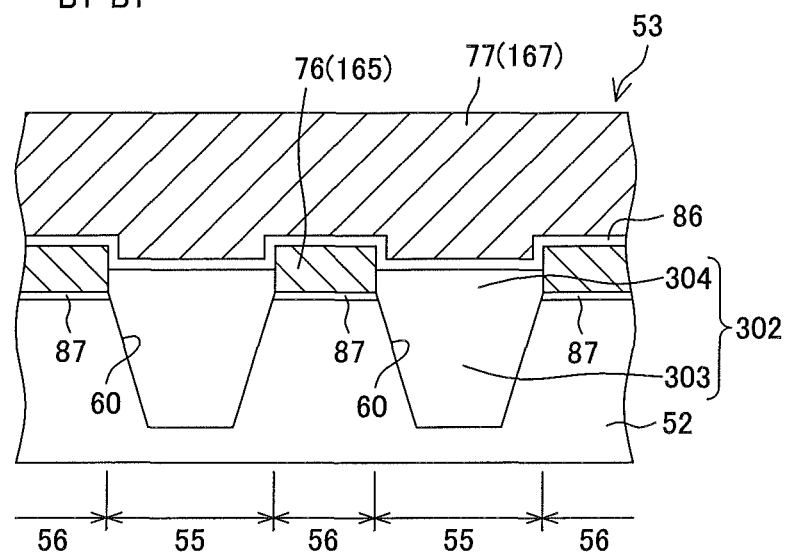
Figure 106A:
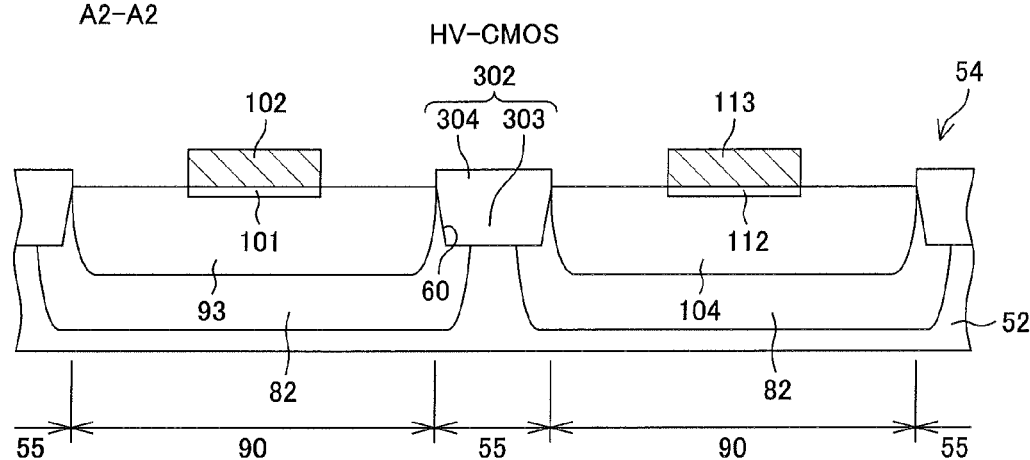
Figure 106B:
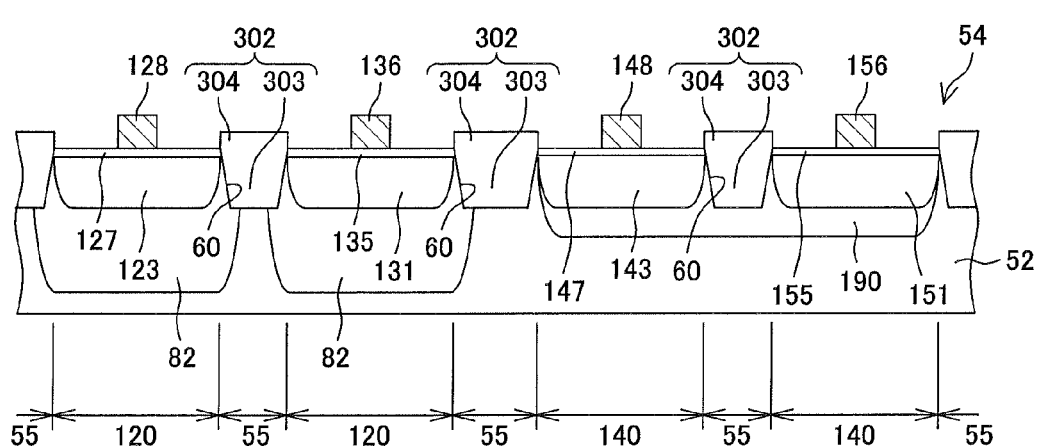
Figure 107A:
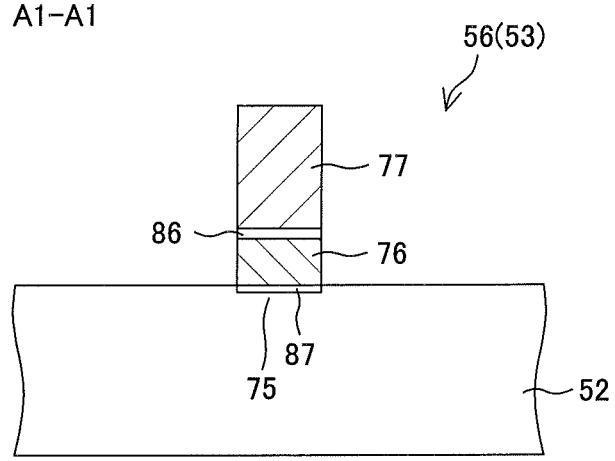
Figure 107B:
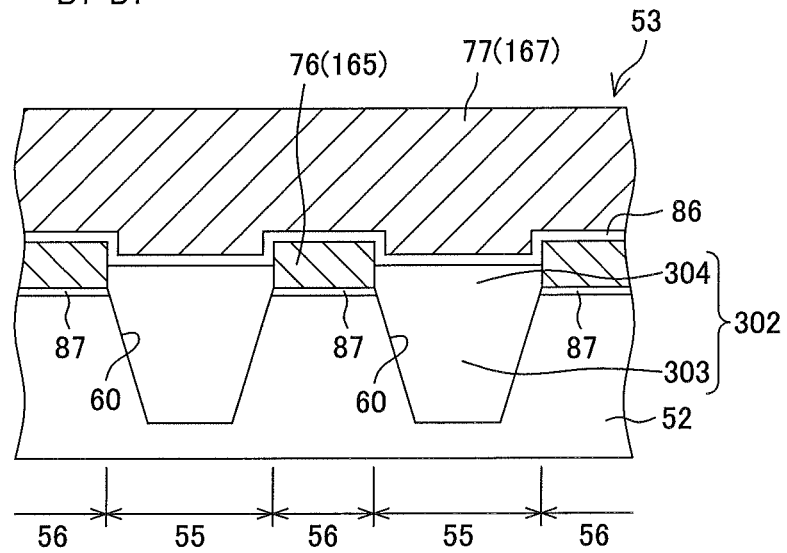
Figure 108A:
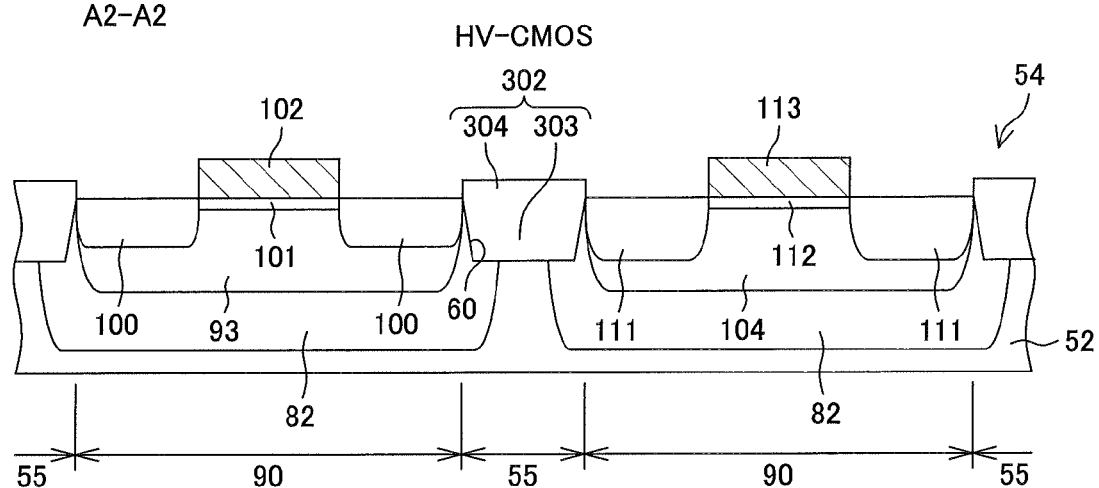
Figure 108B:
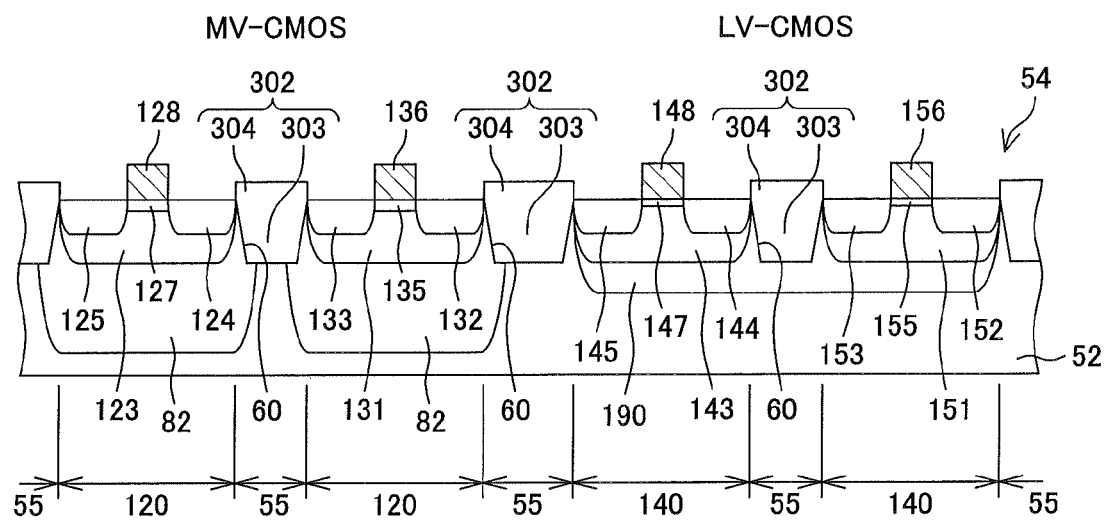
Figure 109A:
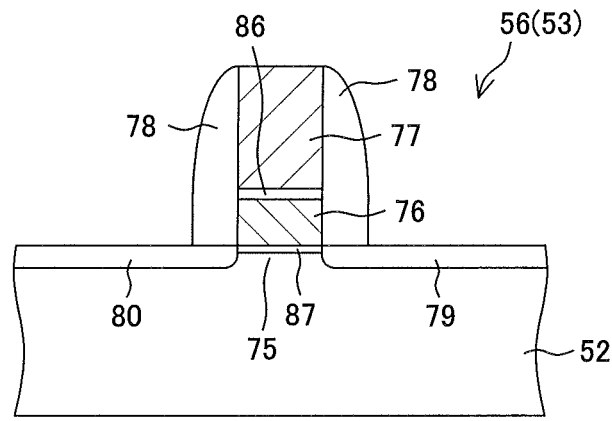
Figure 109B:
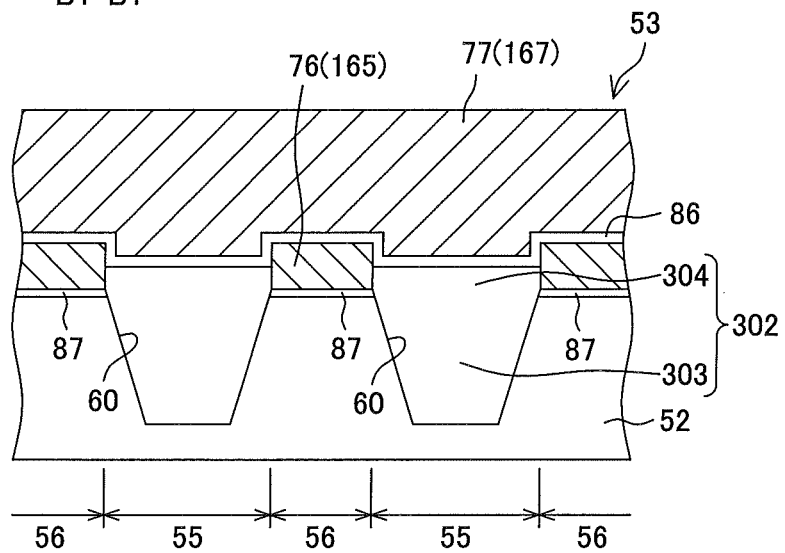
Figure 110A:
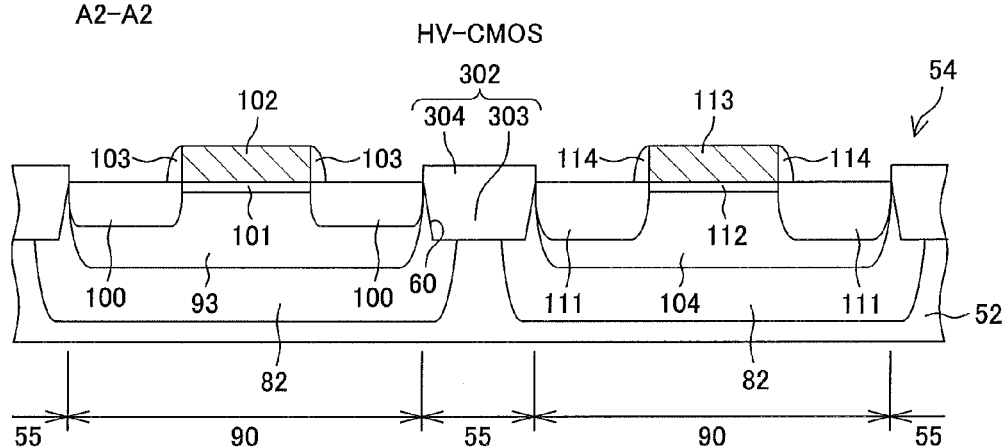
Figure 110B:
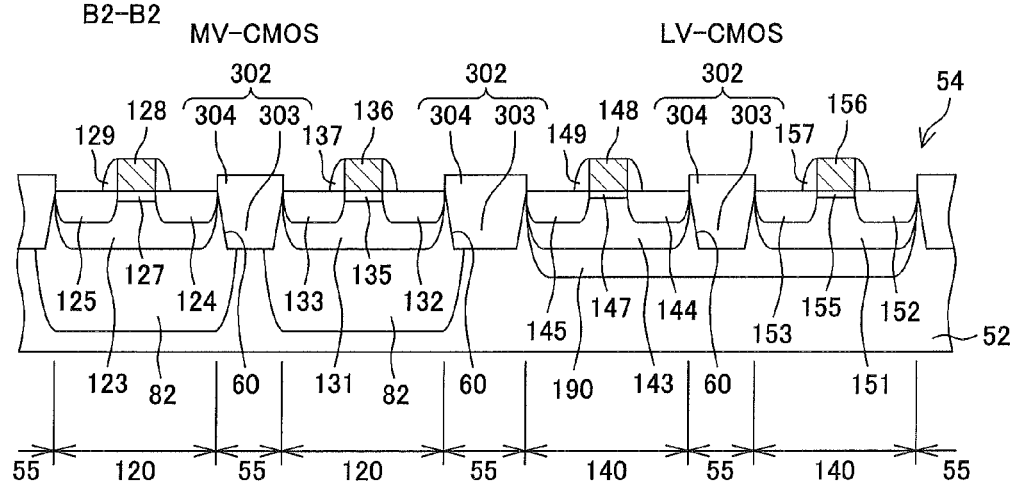
Figure 111A:
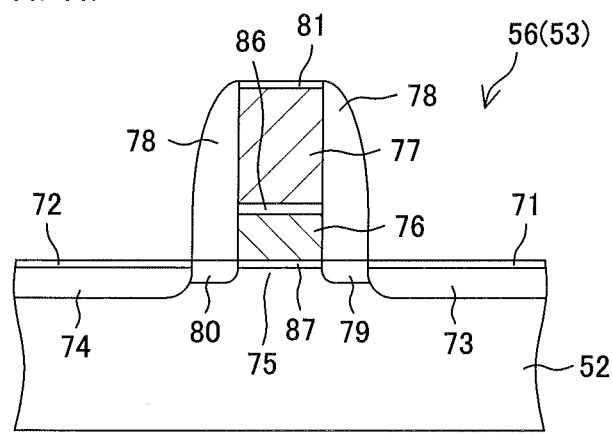
Figure 111B:
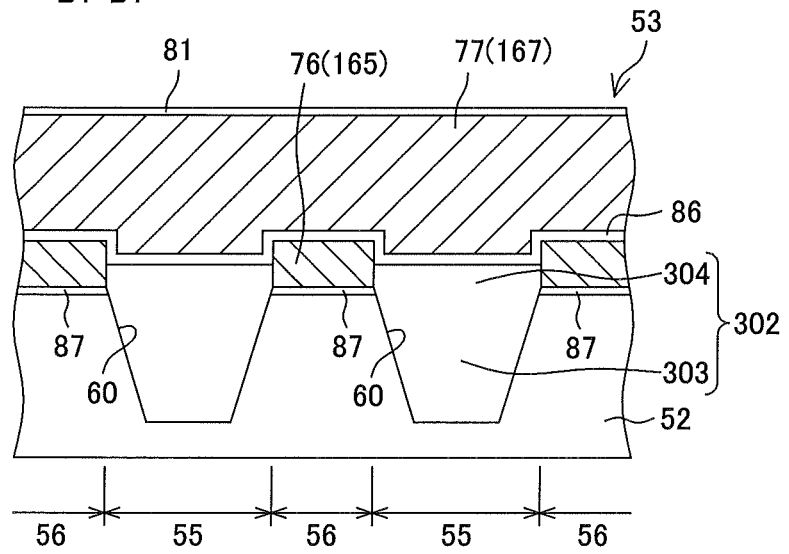
Figure 112A:
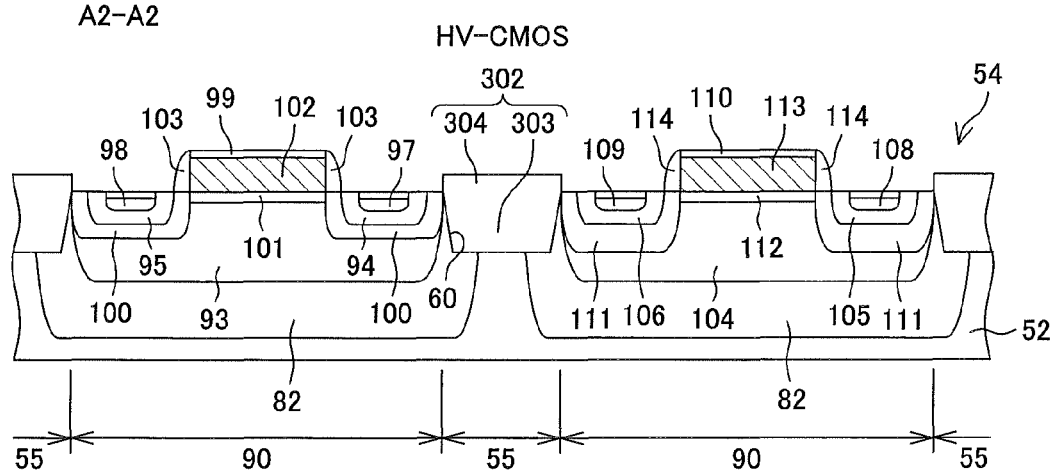
Figure 112B:
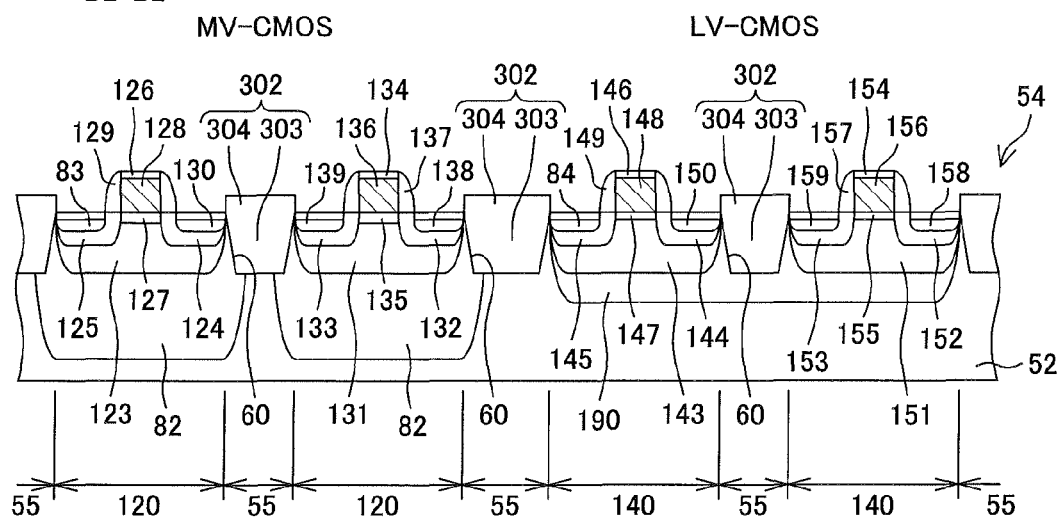

FIGS. 73A and 73B to FIGS. 74A and 74B are sectional views of a semiconductor device 301 according to a second preferred embodiment of the present invention. FIG. 73A corresponds to the section line A1-A1 in FIG. 26A, and FIG. 73B corresponds to the section line B1-B1 in FIG. 26A. FIG. 74A corresponds to the section line A2-A2 in FIG. 26B, and FIG. 74B corresponds to the section line B2-B2 in FIG. 26B. In each of FIGS. 73A and 73B and FIGS. 74A and 74B, elements corresponding to each other with those in FIGS. 27A and 27B and FIGS. 28A and 28B described above are denoted by the same reference signs.

In the semiconductor device 301, the depth of each trench 60 is, for example, 0.13 µm to 0.16 µm. Accordingly, the aspect ratio of each trench 60 (depth of the trench 60/width of the trench 60) is 1.30 to 1.77. In addition, the width of the trench 60 is, in the present second preferred embodiment, demarcated as a width at the opening end of the trench 60.

A buried insulating film 302 is buried into the trenches 60. The buried insulating film 302 is made of silicon oxide ($SiO_2$), and integrally includes a buried portion 303 stored within the trench 60 and a projecting portion 304 formed outside the trench 60 and projecting upward further than the surface of the semiconductor substrate 52.

The projecting portion 304 is, in a sectional view, formed in a quadrangular shape that projects vertically with respect to the surface of the semiconductor substrate 52, and has a top face (flat surface) parallel with respect to the surface of the semiconductor substrate 52 and side faces vertical with respect to the same. Also, the projection amount of the projecting portion 304 is, for example, 0.09 µm to 0.17 µm with reference to the surface of the semiconductor substrate 52. The aspect ratio (total height of the buried portion 303 and the projecting portion 304/width A of the trench 60) of the buried insulating film 302 including such projecting portions 304 is 2.3 to 3.67.

Thus, the active regions 56 demarcated by the trenches 60 are sandwiched by the adjacent projecting portions 304, and provided as recesses having a depth equivalent to a height difference between the top face of the projecting portion 304 and the surface of the semiconductor substrate 52. In each recess (active region 56), a floating gate 76 is formed. The floating gate 76 is buried into the active region 56 formed of the recess in a manner such that its side faces are closely fitted to the side faces of the projecting portions 304, and also projects upward further than the projecting portions 304. The projecting part of the floating gate 76 is finished such that, in order not to overlap the projecting portions 304 of the buried insulating film 302, the entire area of its side faces becomes flush with the side faces of the projecting portions 304.

Next, a manufacturing process of the semiconductor device 301 will be described with reference to FIGS. 75A and 75B to FIGS. 112A and 112B.

FIGS. 75A and 75B to FIGS. 112A and 112B are sectional views for explaining in the order of steps a part of a method for manufacturing the semiconductor device 301. In FIGS. 75A and 75B to FIGS. 112A and 112B, drawings with odd numbers such as FIGS. 75A and 75B, FIGS. 77A and 77B, and FIGS. 79A and 79B show steps of the memory cell region 53, and drawings with even numbers such as FIGS. 76A and 76B, FIGS. 78A and 78B, and FIGS. 80A and 80B show steps of the CMOS region 54.

For manufacturing the semiconductor device 301, as shown in FIGS. 75A and 75B and FIGS. 76A and 76B, a pad oxide film 164 is formed on the surface of the semiconductor substrate 52 by, for example, a thermal oxidization method, and then, by, for example, a CVD method, a hard mask 170 is formed on the pad oxide film 164. The thickness of the pad oxide film 164 is, for example, on the order of 10 nm. Also, the hard mask 170 is formed of a silicon nitride film having a thickness, for example, on the order of 175 nm. In this case, the thickness of the hard mask 170 is set such that the aspect ratio of a space of the trench 60 combined with an opening 305 to be described later becomes 2.3 to 3.67.

Next, as shown in FIGS. 77A and 77B and FIGS. 78A and 78B, the hard mask 170 and the pad oxide film 164 are selectively etched in order to selectively form openings 305 in regions where trenches 60 need to be formed. Then, an etching gas is supplied to the semiconductor substrate 52 via the openings 305. The etching gas proceeds from said openings 305 in a depth direction of the semiconductor substrate 52, so that trenches 60 having tapered shapes in a sectional view are simultaneously formed in the memory cell region 53 and the CMOS region 54.

Next, as shown in FIGS. 79A and 79B and FIGS. 80A and 80B, said trenches 60 are filled back by deposition of silicon oxide 306. The deposition of the silicon oxide 306 is performed by, for example, a P-CVD (Plasma-Enhanced Chemical Vapor Deposition) method or a HDP-CVD (High-Density Plasma Chemical Vapor Deposition) method. Preferably, the HDP-CVD method is used. The trenches 60 and the openings 305 in the hard mask 170 are filled back with the silicon oxide 306, and further, the hard mask 170 is completely covered with the silicon oxide 306.

As shown in FIGS. 81A and 81B and FIGS. 82A and 82B, an unnecessary part of said silicon oxide 306 (part out of the trenches 60 and the openings 305 in the hard mask 170) is removed by polishing with a CMP (Chemical Mechanical Polishing) method. The polishing is continued until the surface of the hard mask 170 and the surface (polished surface) of the buried oxide film become flush with each other. Accordingly, a buried insulating film 302 is buried so as to fill the trenches 60 and the openings 305 in the hard mask 170. In the buried insulating film 302, the parts sandwiched by the pad oxide film 164 and the hard mask 170 serve as projecting portions 304. In addition, in this step, thin-filming by a RIE (Reactive Ion Etching) method and deposition by the P-CVD method or HDP-CVD method may be alternately repeated to deposit silicon oxide, in order to fill silicon oxide into the trenches 60 evenly and uniformly.

Next, as shown in FIGS. 83A and 83B to FIGS. 88A and 88B, the same steps as those in FIGS. 43A and 43B and FIGS. 48A and 48B are performed.

Next, as shown in FIGS. 89A and 89B and FIGS. 90A and 90B, the semiconductor substrate 52 is thermally oxidized with the MV-CMOS region 120 and the LV-CMOS region 140 covered with the hard mask 172. Accordingly, a tunneling oxide film 87 is formed on the surface of the semiconductor substrate 52 in the memory cell region 53 and the HV-CMOS region 90 not covered with the hard mask 172. Next, over the semiconductor substrate 52, a polysilicon film 165 added with impurity ions (for example, phosphorus ($P^+$) ions) is deposited. The polysilicon film 165 is formed so as to fill the active regions 56 formed of recesses and cover the buried insulating film 302.

Next, as shown in FIGS. 91A and 91B to FIGS. 92A and 92B, an unnecessary part of the polysilicon film 165 (part covering the buried insulating film 302) is removed by polishing with a CMP method from a state in which the surface of the polysilicon film 165 is exposed, that is, a state in which the surface of the polysilicon film 165 is not covered with any film. The polishing is continued until the top face of the projecting portions 304 of the buried insulating film 302 and the surface (polished surface) of the polysilicon film 165 become flush with each other. Accordingly, floating gates 76 are buried into the active regions 56 formed of recesses surrounded by the projecting portions 304.

Next, as shown in FIGS. 93A and 93B to FIGS. 94A and 94B, as a result of the projecting portions 304 of the buried insulating film 302 being selectively removed at an even thickness from the surface, the projecting portions 304 are adjusted to be thinned. The removal amount of the projecting portions 304 is set such that, for example, the aspect ratio of the buried insulating film 302 that remains after the treatment becomes 2.3 to 3.67. As a result of the projecting portions 304 being thinned, between the adjacent floating gates 76, recesses having a depth equivalent to a height difference between a top face of the floating gate 76 and the top face of the projecting portion 304 are formed. Next, an ONO film 86 having a three-layer structure is formed by stacking a silicon oxide film, a silicon nitride film, and a silicon oxide film in order over the semiconductor substrate 52. Next, a protective film 176 is formed on the ONO film 86. The protective film 176 is made of, for example, silicon nitride, and formed thinner than the hard mask 172 that covers the MV-CMOS region 120 and the LV-CMOS region 140. For example, the film thickness of the protective film 176 is on the order of 100 Å.

Thereafter, as shown in FIGS. 95A and 95B to FIGS. 112A to 112B, as a result of the same steps as those in FIGS. 55A and 55B to FIGS. 72A to 72B being performed, the semiconductor device 301 including the memory cell region 53 and the CMOS region 54 shown in FIGS. 73A and 73B and FIGS. 74A and 74B is obtained.

According to the above method, as shown in FIGS. 75A and 75B and FIGS. 76A and 76B, a step of forming trenches 60 and a buried insulating film 302 is performed from a state in which no processing treatment such as ion doping has been applied to the semiconductor substrate 52. Therefore, the occurrence of minute defects in the semiconductor substrate 52 can be prevented before formation of an STI structure consisting of the trenches 60 and the buried insulating film 302. Thus, an excellent STI structure can be formed, so that the yield can be improved.

Also, as shown in FIGS. 77A and 77B and FIGS. 78A and 78B, when forming the trenches 60 for the buried insulating film 302, because no electrode material is interposed between the hard mask 170 and the semiconductor substrate 52, the aspect ratio of the trenches 60 including the openings 305 in said hard mask 170 can be made smaller than that when an electrode material is interposed. Further, as shown in FIGS. 73A and 73B, it is not necessary to overlap the floating gate 76 with the projecting portions 304 of the buried insulating film 302, which therefore, when designing the width of the trenches 60, eliminates setting the trench width wide in anticipation of the width of overlapping parts of the floating gates 76. Therefore, the trenches 60 can be micro-fabricated, and further, the buried insulating film 302 can also be increased in burying ability. As a result, as in the present second preferred embodiment, a buried insulating film 302 having an aspect ratio of 2.3 to 3.67 can be formed.

Also, as a result of not overlapping the floating gate 76 with the projecting portions 304 of the buried insulating film 302, no step is formed between the floating gate 76 and the buried insulating film 302. As a result, the occurrence of weak spots or voids can also be effectively prevented when burying the buried insulating film 302.

Also, as shown in FIGS. 91A and 91B and FIGS. 92A and 92B, because the floating gates 76 each consisting of a single layer are formed by polishing from a state in which the surface of the polysilicon film 165 is not covered with any film, it is not necessary to perform a polishing step for formation of the floating gates 76 a plurality of times. Therefore, transfer between polishing devices becomes no longer necessary, and also, a one-time setting of polishing conditions suffices in forming floating gates 76, so that the manufacturing process can be simplified. Further, because transfer between polishing devices becomes no longer necessary, adhesion of particles to the surface of the semiconductor substrate 52 (wafer) can also be reduced.

Also, as shown in FIGS. 89A and 89B and FIGS. 92A and 92B, because, after removal of the hard mask 170, the polysilicon film 165 buried into the active regions 56 formed of recesses where that hard mask 170 used to be serves as floating gates 76, the height of the floating gates 76 can be simply adjusted by only adjusting the thickness of the hard mask 170 in the step of FIGS. 75A and 75B and FIGS. 76A and 76B.

Also, because the step of depositing a polysilicon film 165 by a CVD method suffices with one step, in forming floating gates 76, it is not necessary, in forming floating gates 76, to load and unload the semiconductor substrate 52 in and from a CVD device multiple times. Therefore, unnecessary oxidation of the polysilicon film 165 does not need to be considered, and it becomes no longer necessary to make a special preparation such as inserting the semiconductor substrate 52 at low temperature into a CVD device. As a result, burden on the CVD device can be reduced.

Moreover, in the semiconductor device 301 manufactured by the method mentioned above, as shown in FIGS. 73A and 73B, because the floating gate 76 consists of a single layer striding across the n-type source region 73 and the n-type drain region 74, a small cell size can be realized.

Also, as shown in FIGS. 73A and 73B, because the floating gate 76 does not overlap the projecting portions 304 of the buried insulating film 302, the distance between the floating gates 76 adjacent across the buried insulating film 302 can be wide. Accordingly, parasitic capacitance between the adjacent floating gates 76 can be reduced, so that threshold variation due to the effect of coupling between the floating gates 76 can be reduced. That is, conversely, if a floating gate 76 overlaps the projecting portions 304, said floating gate 76 approximates adjacent floating gates 76, which thus makes the distance between the floating gates 76 inevitably close. Therefore, the above-mentioned parasitic capacitance tends to be increased.

The second preferred embodiment of the present invention has been described above, however, the present invention can also be carried out in other modes.

For example, in the above-described second preferred embodiment, an arrangement for which the respective semiconductor parts of the semiconductor device 301 are inverted in conductivity type may be adopted. For example, in the semiconductor device 301, the p-type parts may be n-type, and the n-type parts may be p-type.

The invention claimed is:

1. A semiconductor device comprising:
a semiconductor substrate;
stripe-shaped trenches for separating the semiconductor substrate into a plurality of active regions;
a buried film having a projecting portion that projects from the semiconductor substrate, buried into the trench;
a source region and drain region of a second conductivity type, which are a pair of regions formed at an interval from each other along a longitudinal direction of the trench in the active region, for providing a channel region of a first conductivity type for a region therebetween; and
a floating gate consisting of a single layer striding across the source region and the drain region, projecting beyond the projecting portion in a manner not overlapping the projecting portion, wherein
an aspect ratio of the buried film is 2.3 to 3.67.

2. The semiconductor device according to claim 1, comprising an n-type well region formed in a surface portion of the semiconductor substrate, wherein
the source region and the drain region are respectively a p-type source region and a p-type drain region formed in the n-type well region, and
the channel region is an n-type channel region made of a part of the n-type well region.

3. The semiconductor device according to claim 1, wherein a first width $W_1$ of the floating gate along a width direction of the trench and a second width $W_2$ of the floating gate along a longitudinal direction of the trench are both 100 nm or less.

4. The semiconductor device according to claim 1, wherein the floating gate is made of polysilicon.

5. The semiconductor device according to claim 1, wherein a projection amount of the projecting portion is 0.09 µm to 0.17 µm.

6. The semiconductor device according to claim 1, wherein the buried film is a buried insulating film.

7. The semiconductor device according to claim 1, further comprising an insulating film formed at an inner face of the trench, wherein
the buried film includes a first material layer buried up to a halfway portion in a depth direction of the trench and a second material layer different from the first material layer, buried into a part on the first material layer of the trench.

8. The semiconductor device according to claim 1, wherein a depth of the trench is 0.13 µm to 0.16 µm.

9. The semiconductor device according to claim 1, wherein an aspect ratio of the trench is 1.30 to 1.77.

10. The semiconductor device according to claim 1, wherein the trench is formed in a tapered shape to have a narrower width in its depth direction.

11. The semiconductor device according to claim 1, further comprising a semiconductor element formed in the active region.

12. The semiconductor device according to claim 11, wherein the semiconductor element includes a CMOS transistor.

* * * * *